US012316388B2

(12) United States Patent
Yoo et al.

(10) Patent No.: US 12,316,388 B2
(45) Date of Patent: May 27, 2025

(54) METHOD AND DEVICE FOR ENERGY TRANSFER AND HARVESTING

(71) Applicant: National University of Singapore, Singapore (SG)

(72) Inventors: Jerald Yoo, Singapore (SG); Jiamin Li, Singapore (SG); Yilong Dong, Singapore (SG); Jeong Hoan Park, Singapore (SG)

(73) Assignee: National University of Singapore, Singapore (SG)

( * ) Notice: Subject to any disclaimer, the term of this patent is extended or adjusted under 35 U.S.C. 154(b) by 351 days.

(21) Appl. No.: 17/798,176

(22) PCT Filed: Feb. 10, 2021

(86) PCT No.: PCT/SG2021/050069
§ 371 (c)(1),
(2) Date: Aug. 8, 2022

(87) PCT Pub. No.: WO2021/162636
PCT Pub. Date: Aug. 19, 2021

(65) Prior Publication Data
US 2023/0155692 A1   May 18, 2023

(30) Foreign Application Priority Data
Feb. 14, 2020   (SG) .............................. 10202001357T

(51) Int. Cl.
*H04B 13/00*   (2006.01)
*H02J 50/00*   (2016.01)
(Continued)

(52) U.S. Cl.
CPC .......... *H04B 13/005* (2013.01); *H02J 50/001* (2020.01); *H02J 50/12* (2016.02);
(Continued)

(58) Field of Classification Search
CPC ........ H04B 13/005; H02J 50/12; H02J 50/20; H02J 50/001; H02M 3/01; H02M 3/335
(Continued)

(56) References Cited

U.S. PATENT DOCUMENTS 10,090,707 B2 *  10/2018  Davlantes ................ H02J 50/23
11,190,053 B2 *  11/2021  Lee .......................... H02P 27/08
(Continued)

FOREIGN PATENT DOCUMENTS

CN   110311558 A   10/2019

OTHER PUBLICATIONS

Written Opinion for Singapore Patent No. 1202250847U, Feb. 26, 2024, 11 Pages.
(Continued)

*Primary Examiner* — Mong-Thuy T Tran
(74) *Attorney, Agent, or Firm* — Botos Churchill IP Law LLP

(57) ABSTRACT

A power receiver (301*a*, 301*b*, 301*c*, 301*d*, 301*e*, 301*f*) is disclosed herein. In a specific embodiment the power receiver has a first electrode (300) arranged to be electrically coupled to a body (105) of a living being, the first electrode (300) operable to receive an electrical signal via the body; and a rectifier (307) for rectifying the electrical signal into a rectified electrical signal. The rectifier (307) includes a plurality of rectifier switches and operable in a bulk biasing mode in which first selected rectifier switches of the plurality of rectifier switches are forward bulk biased. A power transmitter (201), an energy transfer apparatus (100) and a method of transmitting electrical power are also disclosed.

18 Claims, 39 Drawing Sheets

(51) Int. Cl.
  H02J 50/12     (2016.01)
  H02J 50/20     (2016.01)
  H02M 3/00      (2006.01)
  H02M 3/335     (2006.01)
(52) U.S. Cl.
  CPC .............. *H02J 50/20* (2016.02); *H02M 3/01* (2021.05); *H02M 3/335* (2013.01)
(58) Field of Classification Search
  USPC ....................................................... 455/41.1
  See application file for complete search history.

(56) References Cited

U.S. PATENT DOCUMENTS

| | | |
|---|---|---|
| 2011/0043049 A1 | 2/2011 | Karalis et al. |
| 2012/0163619 A1 | 6/2012 | Kinoshita et al. |
| 2014/0071722 A1 | 3/2014 | Gao et al. |
| 2016/0099582 A1* | 4/2016 | Ramorini .................. H02J 7/00 320/162 |
| 2016/0268834 A1* | 9/2016 | Satyamoorthy ......... H02J 50/10 |
| 2017/0026282 A1 | 1/2017 | Huang et al. |
| 2017/0117973 A1* | 4/2017 | Linnartz .................. H04B 5/24 |
| 2018/0140851 A1* | 5/2018 | Maile ...................... H02J 50/12 |
| 2018/0241483 A1* | 8/2018 | Park ........................ H04B 5/266 |
| 2018/0294676 A1* | 10/2018 | Davlantes ................ H02J 50/12 |
| 2020/0387182 A1* | 12/2020 | De Vos ..................... G05F 1/46 |
| 2020/0412171 A1* | 12/2020 | Hanabusa ........... H02J 7/00712 |
| 2021/0067063 A1* | 3/2021 | Huh ....................... H02J 7/0048 |
| 2021/0175727 A1* | 6/2021 | Schobben ............... H02J 50/12 |
| 2021/0376662 A1* | 12/2021 | Arteaga .............. H02M 1/4208 |

OTHER PUBLICATIONS

International Search Report and Written Opinion for application No. PCT/SG2021/050069 dated Apr. 29, 2021.

Chang, Y , et al., "A scheme to improve PCE of differential-drive CMOS rectifier for low RF input power", Analog Integrated Circuits and Signal Processing, Jul. 30, 2016, vol. 90, pp. 113-124 [Retrieved on Apr. 28, 2021] <DOI: 10.1007 /S 104 70-016-0825-Y> Whole document, especially Section 3; Figures 2 and 5.

Li, J , et al., "Body-Area Powering with Human Body-Coupled Power Transmission and Energy Harvesting ICs.", IEEE Transactions on Biomedical Circuits and Systems, Nov. 20, 2020, vol. 14, No. 6, pp. 1263-1273 [Retrieved on Apr. 28, 2021] <DOI: 10.1109/TBCAS.2020.3039191 Whole document.

Abiri , et al., "Inductively Powered Wireless Pacing via a Miniature Pacemaker and Remote Stimulation Control System", Scientific Reports, vol. 7, No. 6180, pp. 1-10, (2017).

Alioto , "IoT: Bird's Eye View, Megatrends and Perspectives", Enabling the Internet of Things: From Integrated Circuits to Integrated Systems, Springer International Publishing, pp. 1-45 (2017).

Amin , et al., "MISIMO: A Multi-Input Single-Inductor Multi-Output Energy Harvesting Platform in 28-nm FDSOI for Powering Net-Zero-Energy Systems", IEEE Journal of Solid-State Circuits, vol. 53, No. 12, pp. 3407-3419 (2018).

Bae , et al., "The Signal Transmission Mechanism on the Surface of Human Body for Body Channel Communication", IEEE Transactions on Microwave Theory Techniques, vol. 60, No. 3, pp. 582-593 (2012).

Bandodkar , et al., "Wearable Chemical Sensors: Present Challenges and Future Prospects", ACS Sensors, doi:10.1021/acssensors.6b00250, pp. 464-482, (2016).

Bandyopadhyay , et al., "A 1.1 nW Energy-Harvesting System with 544 pW Quiescent Power for Next-Generation Implants", IEEE Journal of Solid-State Circuits, vol. 49, No. 12, pp. 2812-2824 (2014).

Bandyopadhyay , et al., "Platform Architecture for Solar, Thermal, and Vibration Energy Combining With MPPT and Single Inductor", IEEE Journal Solid-State Circuits, vol. 47, No. 9, pp. 2199-2215 (2012).

Cao , et al., "A Bipolar-Input Thermoelectric Energy-Harvesting Interface With Boost/Flyback Hybrid Converter and On-Chip Cold Starter", IEEE Journal of Solid-State Circuits, vol. 54, No. 12, pp. 3362-3374 (2019).

Chandrakasan , et al., "Next Generation Micro-power Systems", IEEE Symposium on VLSI Circuits, Digest of Technical Papers, pp. 2-5, (2008).

Charthad , et al., "A mm-Sized Implantable Medical Device (IMD) With Ultrasonic Power Transfer and a Hybrid Bi-Directional Data Link", IEEE Journal of Solid-State Circuits, vol. 50, pp. 1741-1753 (2015).

Chen , et al., "A 50 nW-to-10 mW Output Power Tri-Mode Digital Buck Converter With Self-Tracking Zero Current Detection for Photovoltaic Energy Harvesting", IEEE Journal of Solid-State Circuits, vol. 51, No. 2, pp. 523-532 (2016).

Cho , et al., "A 37.5 µW Body Channel Communication Wake-up Receiver with Injection-locking Ring Oscillator for Wireless Body Area Network", IEEE Transactions on Circuits and Systems, I Regular Papers, vol. 60, pp. 1200-1208 (2013).

Cho , "An Area-Efficient Rectifier with Threshold Voltage Cancellation for Intra-Body Power Transfer", IEEE International Symposium on Circuits and Systems (ISCAS), pp. 1-5 (2019).

Cho , et al., "The Human Body Characteristics as a Signal Transmission Medium for Intrabody Communication", IEEE Transactions on Microwave Theory and Technology, vol. 55, No. 5, pp. 1080-1086 (2007).

Choi , et al., "A 23pW, 780ppm/°C. Resistor-less Current Reference Using Subthreshold MOSFETs", ESSCIRC 2014—40th European Solid State Circuits Conference (ESSCIRC), pp. 119-122 (2014).

Cotton , et al., "A Review of Radio Channel Models for Body Centric Communications", Radio Science, pp. 371-388 (2014).

Cottrill , et al., "Ultra-high Thermal Effusivity Materials for Resonant Ambient Thermal Energy Harvesting", Nature Communications, vol. 9, No. 1, pp. 1-11 (2018).

Daniels , et al., "Exploratory Study Examining the At-home Feasibility of a Wearable Tool for Social-affective earning in Children with Autism", npj Digital Medicine, doi:10.1038/s41746-018-0035-3, pp. 1-10, (2018).

Desai , et al., "A Scalable 2.9mW 1Mb/s eTextiles Body Area Network Transceiver with Remotely Powered Sensors and Bi-Directional Data Communication", ISSCC Digital Technical Papers, pp. 206-207 (2013).

Desai , et al., "A Scalable, 2.9 mW, 1 Mb/s e-Textiles Body Area Network Transceiver With Remotely-Powered Nodes and Bi-Directional Data Communication", IEEE Journal of Solid-State Circuits, vol. 49, No. 9, pp. 1995-2004 (2014).

Dinis , et al., "Extending the Limits of Wireless Power Transfer to Miniaturized Implantable Electronic Devices", Micromachines, vol. 8, pp. 1-15 (2017).

Dong , et al., "A Highly Stretchable and Washable All-yarn-based Self-charging Knitting Power Textile Composed of Fiber Triboelectric Nanogenerators and Supercapacitors", ACS Nano, pp. 9490-9499 (2017).

El-Damak , et al., "A 10 nW-1 µW Power Management IC With Integrated Battery Management and Self-Startup for Energy Harvesting Applications", IEEE Journal of Solid-State Circuits, vol. 51, No. 4, pp. 943-954 (2016).

Fort , et al., "Ultra-Wideband Channel Model for Communication Around the Human Body", IEEE Journal on Selected Areas in Communication, vol. 24, No. 4, pp. 927-933 (2006).

Gaikwad , et al., "Highly Flexible, Printed Alkaline Batteries Based on Mesh-Embedded Electrodes", Advanced Materials. doi:10.1002/adma.201100894, pp. 1-5 (2011).

Gao , et al., "Fully Integrated Wearable Sensor Arrays for Multiplexed in Situ Perspiration Analysis", Nature, doi:10.1038/nature16521, 18 Pages (2016).

Gong , et al., "A Wearable and Highly Sensitive Pressure Sensor With Ultrathin Gold Nanowires", Nature Communications, vol. 5, 8 Pages (2014).

Hall , et al., "Antennas and Propagation for Body Centric Communications", First European Conference on Antennas and Propagation, pp. 1-7 (2006).

(56) References Cited

OTHER PUBLICATIONS

Hall, "Antennas and Propagation for On-Body Communication Systems", IEEE Antennas and Propagation Magazine, vol. 49, No. 3, pp. 41-58 (2007).
Hashemi, et al., "A High-Efficiency Low-Voltage CMOS Rectifier for Harvesting Energy in Implantable Devices", IEEE Transactions on Biomedical Circuits and Systems, vol. 6, No. 4, pp. 326-335, (2012).
Huang, et al., "Epidermal Radio Frequency Electronics for Wireless Power Transfer", Microsystems Nanoengineering, vol. 2, pp. 16052-1-16052-9 (2016).
Katic, et al., "A Dual-Output Thermoelectric Energy Harvesting Interface with 86.6% Peak Efficiency at 30 µW and Total Control Power of 160 nW", IEEE Journal of Solid-State Circuits, vol. 51, pp. 1928-1937 (2016).
Kifle, et al., "Human Body and Head Characteristics as a Communication Medium for Body Area Network", Proceedings of the Annual International Conference of the IEEE Engineering in Medicine and Biology Society, EMBS, vol. 2015, pp. 1845-1848 (2015).
Kim, et al., "Flexible, Highly Efficient All-polymer Solar Cells", Nature Communications, vol. 6, pp. 1-7 (2015).
Kotani, et al., "High-Efficiency Differential-Drive CMOS Rectifier for UHF RFIDs", IEEE J. Solid-State Circuits, vol. 14, No. 11, pp. 3011-3018 (2009).
Kwon, et al., "A Single-Inductor 0.35 µm CMOS Energy-Investing Piezoelectric Harvester", IEEE Journal of Solid- State Circuits, vol. 49, No. 10, pp. 2277-2291 (2014).
Lee, et al., "Toward All-day Wearable Health Monitoring: An Ultralow-power, Reflective Organic Pulse Oximetry Sensing Patch", Science Advances, doi:10.1126/sciadv.aas9530, pp. 1-8, (2018).
Leonov, et al., "Thermoelectric Converters of Human Warmth for Self-Powered Wireless Sensor Nodes", IEEE Sensors Journal, doi:10.1109/JSEN.2007.894917, pp. 650-657, (2007).
Li, et al., "34.5 Human-body-coupled Power-delivery and Ambient-energy-harvesting ICs for a Full-body-area Power Sustainability", IEEE International Solid-State Circuits Conference Digital Technical Papers, vol. 63, pp. 514-516 (2020).
Li, et al., "Wearable Energy-smart Ribbons for Synchronous Energy Harvest and Storage", Nature Communications, vol. 7, pp. 1-10, (2016).
Lin, et al., "A 595pW 14pJ/Cycle Microcontroller with Dual-Mode Standard Cells and Self-Startup for Battery-Indifferent Distributed Sensing", IEEE International Solid-State Circuits Conference (ISSCC) Dig. Tech. Papers, vol. 61, pp. 44-46 (2018).
Lin, et al., "Integrated Power Management for Battery-Indifferent Systems With Ultra-Wide Adaptation Down to nW", IEEE Journal of Solid-State Circuits, vol. 55, No. 4, pp. 967-976 (2020).
Maity, et al., "Characterization and Classification of Human Body Channel as a function of Excitation and Termination Modalities", 40th Annual International Conference of the IEEE Engineering in Medicine and Biology Society (EMBC), 2018, pp. 3754-3757 (2018).
Meng, et al., "Multi-Beam Shared-Inductor Reconfigurable Voltage/SECEMode Piezoelectric Energy Harvesting of Multi-Axial Human Motion", ISSCC Digital Technical Papers, pp. 426-428 (2019).
Nakamoto, et al., "A Passive UHF RF Identification CMOS Tag IC Using Ferroelectric RAM in 0.35-µm Technology", IEEE Journal of Solid-State Circuits, vol. 42, No. 1, pp. 101-110, (2007).
Negra, et al., "Wireless Body Area Networks: Applications and technologies", Procedia Computer Science 83, pp. 1274-1281 (2016).
Niu, et al., "A Universal Self-charging System Driven by Random Biomechanical Energy for Sustainable Operation of Mobile Electronics", Nature Communications, vol. 6, pp. 1-8 (2015).
Park, et al., "A 4.5-to-16µW Integrated Triboelectric Energy-Harvesting System Based on High-Voltage Dual-Input Buck Converter with MPPT and 70V Maximum Input Voltage", ISSCC Digital Technical Papers, pp. 146-148 (2018).
Park, "A High-Voltage Dual-Input Buck Converter Achieving 52.9% Maximum End-to-End Efficiency for Triboelectric Energy-Harvesting Applications", IEEE Journal of Solid-State Circuits, vol. 55, No. 5, pp. 1324-1336 (2020).
Park, et al., "All-Solid-State Cable-Type Flexible Zinc-Air Battery", Advanced Materials, doi: 10.1002/adma.201404639, pp. 1396-1401 (2015).
Patel, et al., "A Review of Wearable Sensors and Systems with Application in Rehabilitation", Journal of NeuroEngineering and Rehabilitation, vol. 9, pp. 1-17 (2012).
Peng, et al., "Efficient Fiber Shaped Zinc Bromide Batteries and Dye Sensitized Solar Cells for Flexible Power Sources", Journal of Materials Chemistry C, pp. 2157-2165 (2015).
Pletcher, et al., "A 2 GHz 52µW Wake-Up Receiver With 72 dBm Sensitivity Using an Uncertain-IF Architectur", IEEE International Solid-State Circuits Conference Digital Technical Papers, vol. 51, pp. 524-633, (2008).
Pletcher, et al., "A 52 µW Wake-Up Receiver with -72dBm Sensitivity Using Uncertain-IF Architecture", IEEE Journal of Solid-State Circuits, vol. 44, pp. 269-280 (2009).
Ramadass, et al., "A Battery-Less Thermoelectric Energy Harvesting Interface Circuit With 35 mV Startup Voltage", IEEE Journal of Solid-State Circuits, vol. 46, No. 1, pp. 333-341 (2011).
Roundy, et al., "Energy Scavenging for Wireless Sensor Networks with Special Focus on Vibrations", DOI 10.1007/978-1-4614-0485-6, 212 Pages (2003).
Saadeh, et al., "A 1.1-mW Ground Effect-Resilient Body-Coupled Communication Transceiver With Pseudo OFDM for Head and Body Area Network", IEEE Journal of Solid-State Circuits, vol. 52, No. 10, pp. 2690-2702 (2017).
Saadeh, et al., "A Pseudo OFDM With Miniaturized FSK Demodulation Body-Coupled Communication Transceiver for Binaural Hearing Aids in 65 nm CMOS", IEEE Journal of Solid-State Circuits, vol. 52, No. 3, pp. 757-768 (2017).
Sadagopan, et al., "A 960pW Co-Integrated-Antenna Wireless Energy Harvester for WiFi Backchannel Wireless Powering", Digest of Technical Papers - IEEE International Solid-State Circuits Conference, vol. 61, pp. 136-138 (2018).
Sadagopan, et al., "A cm-Scale 2.4 GHz Wireless Energy Harvester with NanoWatt Boost Converter and Antenna-Rectifier Resonance for WiFi Powering of Sensor Nodes", IEEE Journal of Solid-State Circuits, vol. 53, No. 12, pp. 3396-3406 (2018).
Sano, et al., "Triboelectric Energy Harvesting with Surface-charge-fixed Polymer Based on Ionic Liquid", Science and Technology of Advanced Materials, doi:10.1080/14686996.2018.1448200, pp. 317-323 (2018).
Schormans, et al., "Practical Inductive Link Design for Biomedical Wireless Power Transfer: A Tutorial", IEEE Transactions on Biomedical Circuits and Systems, vol. 12, No. 5, pp. 1112-1130 (2018).
Shenck, et al., "Energy Scavenging with Shoe-mounted Piezoelectrics", IEEE Micro, vol. 21, No. 3, pp. 30-42 (2001).
Son, et al., "Multifunctional Wearable Devices for Diagnosis and Therapy of Movement Disorders", Nature Nanotechnology, doi:10.1038/nnano.2014.38, pp. 397-404, (2014).
Staebler, et al., "Human Exposure to Electromagnetic Fields: From Extremely Low Frequency (ELF) to Radiofrequency", Wiley, 415 Pages (2017).
Starner, "Human-powered Wearable Computing", IBM Systems Journal, vol. 35, No. 3&4, pp. 618-629 (1996).
Stoopman, "Co-Design of a CMOS Rectifier and Small Loop Antenna for Highly Sensitive RF Energy Harvesters", IEEE J. Solid-State Circuits, vol. 49, No. 3, pp. 622-634 (2014).
Sun, et al., "Dynamic Channel Modeling and OFDM System Analysis for Capacitive Coupling Body Channel Communication", IEEE Transactions on Biomedical Circuits and Systems, vol. 13, No. 4, pp. 735-745 (2019).
Tian, et al., "Wireless Body Sensor Networks Based on Metamaterial Textiles", Nature Electronics, doi:10.1038/s41928-019-0257-7, 12 Pages (2019).
Wang, et al., "A Meter-Range UWB Transceiver Chipset for Aroundthe-Head Audio Streaming", Digest of Technical Papers—IEEE International Solid-State Circuits Conference, vol. 55, pp. 450-451 (2012).

(56) References Cited

OTHER PUBLICATIONS

Wang, et al., "Achieving Ultrahigh Triboelectric Charge Density for Efficient Energy Harvesting", Nature Communications, vol. 8, No. 1, pp. 1-8, (2017).

Wang, et al., "CASPER: Capacitive Serendipitous Power Transfer for Through-Body Charging of Multiple Wearable Devices", Proceedings—International Symposium on Wearable Computers, ISWC, 8 Pages (2018).

Wang, et al., "Sustainably Powering Wearable Electronics Solely by Biomechanical Energy", Nature Communications, vol. 7, 8 Pages (2016).

Xia, et al., "0.56 V, -20 dBm RF-Powered, Multi-Node Wireless Body Area Network System-on-a-Chip With Harvesting-Efficiency Tracking Loop", IEEE Journal of Solid-State Circuits, vol. 49, No. 6, pp. 1345-1355 (2014).

Yamamoto, et al., "Printed Multifunctional Flexible Device with an Integrated Motion Sensor for Health Care Monitoring", Science Advances, doi:10.1126/sciadv.1601473, pp. 1-8, (2016).

Yoo, et al., "A 1.12 pJ/b Inductive Transceiver With a Fault-Tolerant Network Switch for Multi-Layer Wearable Body Area Network Applications", IEEE Journal of Solid-State Circuits, vol. 44, No. 11, pp. 2999-3010 (2009).

Yoo, et al., "A 5.2 mW Self-Configured Wearable Body Sensor Network Controller and a 12 µW Wirelessly Powered Sensor for a Continuous Health Monitoring System", IEEE Journal of Solid-State Circuits, vol. 45, No. 1, pp. 178-188 (2010).

Yoo, et al., "Wearable Healthcare System", Bio-Medical CMOS ICs, Integrated Circuits and Systems, Springer, pp. 339-370 (2011).

Zeng, et al., "Fiber-Based Wearable Electronics: A Review of Materials, Fabrication, Devices, and Applications", Advanced Materials, doi:10.1002/adma.201400633, pp. 1-27, (2014).

Zhao, et al., "A Shoe-Embedded Piezoelectric Energy Harvester for Wearable Sensors", Sensors, doi: 10.3390/a140712497, pp. 12498-12510 (2014).

Zhao, et al., "An Auto Loss Compensation System for Capacitive-Coupled Body Channel Communication", IEEE Transactions Biomedical Circuits and Systems, vol. 13, No. 4, pp. 756-765 (2019).

Zhao, et al., "The Role and Challenges of Body Channel Communication in Wearable Flexible Electronics", IEEE Transactions on Biomedical Circuits and Systems, vol. 14, No. 2, pp. 283-296 (2020).

Zimmerman, "Personal Area Networks: Near-field Intrabody Communication", IBM Systems Journal, vol. 35, No. 3&4, pp. 609-617 (1996).

\* cited by examiner

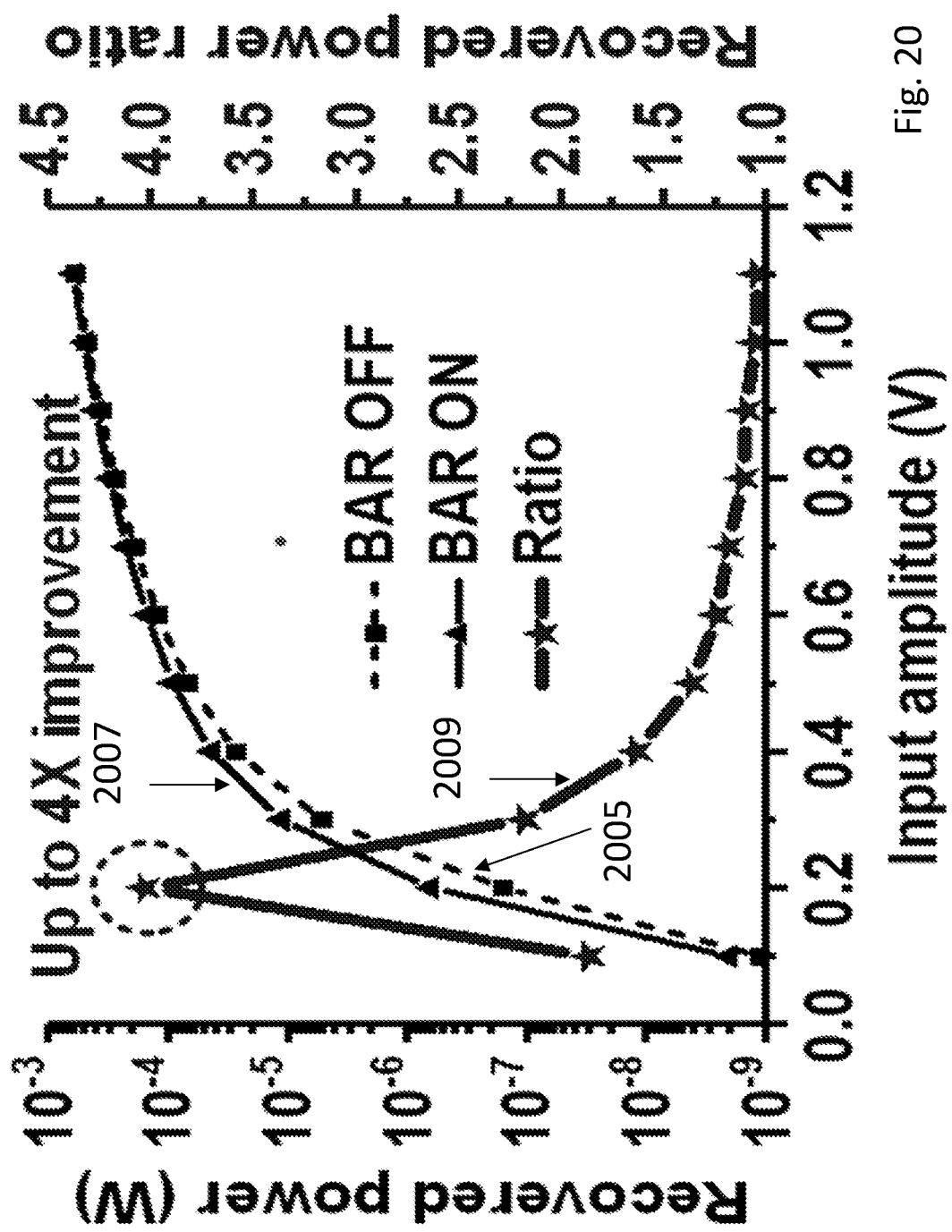

METHOD AND DEVICE FOR ENERGY TRANSFER AND HARVESTING

CROSS REFERENCE TO RELATED APPLICATIONS

The present application is a national phase entry under 35 U.S.C. § 371 of International Application No. PCT/SG2021/050069, filed Feb. 10, 2021, published in English, which claims priority from Singapore Patent Application No. SG 10202001357T filed Feb. 14, 2020, all of which are incorporated herein by reference.

FIELD AND BACKGROUND

This disclosure invention relates to a method and device for energy transfer and/or harvesting, more particularly but not exclusively, for powering wearable or implantable electronics using energy transmission or harvesting via the human body.

Despite advances in ultra-low-power circuit techniques and battery energy density, sustaining mm-sized chips of sub-mW power consumption purely using a battery would still require periodic replacement/recharging, which not only causes interruptions and inconveniences but also affects functionality especially for wearable electronic devices such as earbuds, smart band-aids, and electrocardiogramaensors to name but a few.

Near-field power transmission approaches using an inductive link impose stringent requirements on alignment and are typically designed for short distances. RF-based power transmission covers a longer distance. However, when used in the body area, it experiences ~20 dB path loss degradation with the antenna pattern distorted, and a further 20-40 dB reduction in the path gain under non-line-of sight (non-LoS) transmission, where the human body blocks the propagation path.

A more sustainable alternative is to replace or at least complement battery by continually extracting energy from the ambient environment, or through human-environment interactions. Commonly used power harvesting sources for wearable devices include photovoltaics, thermo-, piezo-, and triboelectricity, all of which require either solar panels (for photovoltaics) or nanogenerators for power extraction, introducing 1) inherent area cost at each node and 2) limitation of placement due to the way in which they operate.

Additionally, as harvestable power decreases almost proportionally with harvester downsizing, a tension between power and size becomes inevitable. Moreover, these potential power sources are not equally distributed around the human body, leaving some sensor nodes unsustainable. One example concerns piezo- and triboelectricity harvesting. While $10^{-100}$ µW could generally be obtained in locations where constant movements take place such as joints or heels, it is expected that a sharp decrease would occur for devices placed on chest or head, a conventional placement in a body area network. Apart from the harvester location dependency, the amount of power extractable is also prone to clothing and environmental changes.

Electromagnetic (EM) waves, on the other hand, are omnipresent in modern life. From natural and artificial lights to the cellular network, to power cables and electronic gadgets, EM fields of various frequency bands have always been all around. RF band EM power harvesting has attracted growing attention, and the scavenging of 2.4 GHz WiFi radio transmitted in the air as low as −36 dBm has been demonstrated as viable. However, unlike the case of RF power harvesting/delivery in the air, RF power transfer to body area electronic nodes suffers from severe performance degradation and is thus unsuitable for wearable applications. First of all, RF-based harvesting/transfer is vulnerable to the body-shadowing effect, where the human body absorbs the majority of RF energy. Thus, RF harvesting around the body requires a line-of-sight (LOS) condition between the source and the receiver, which is challenging to guarantee under a body area network (BAN) application scenario.

Moreover, an antenna placed in vicinity of the body undergoes significant changes in radiation patterns as compared to when in the air, mainly due to the distinct dielectric properties of the human skin surface. Antenna gain also decreases by around 20 dB, even under the loss scenario. For RF-based ambient harvesting, in particular, that is a significant degradation considering the incident power of generally less than −20 dBm available to the receiving antenna.

Apart from the RF waves present primarily due to wireless communication, ambient fields lying towards the lower end of the EM spectrum are just as ubiquitous and abundant. Sources for these fields include AM radio signals, underground telecommunication cables, and most dominantly, electricity networks together with appliances or utilities linked in for power supply. However, as antenna size is inversely proportional to wave frequency, harvesting at super-low-frequencies such as 50/60 Hz would necessitate an antenna size of 3000 km, as compared with around 6.25 cm for RF signals.

It is desirable to provide a method and device for transmitting and/or harvesting energy which addresses at least one of the drawbacks of the prior art and/or to provide the public with a useful choice.

SUMMARY

In a first aspect, there is provided a power receiver comprising: a first electrode arranged to be electrically coupled to a body of a living being, the first electrode operable to receive an electrical signal via the body; and a rectifier for converting the received electrical signal into a rectified electrical signal, the rectifier having a plurality of rectifier switches and operable in a bulk biasing mode in which selected rectifier switches of the plurality of rectifier switches are forward bulk biased.

As described in the preferred embodiment, forward bulk biasing certain switches of the rectifier depending on voltage may improve the performance of the rectifier at low input voltage and therefore increase the sensitivity of the receiver and enable power transfer over long distances and power harvesting.

It should be appreciated that the use of the term 'electrode' is meant to include any electrical contact including electrical connectors of integrated circuits, or suitable electrical contacts which may be implantable within a living being body particular if the power receiver is an implantable device.

Advantageously, the rectifier may be operable selectively between the bulk biasing mode and a non-bulk biasing mode in which the selected rectifier switches are not forward bulk biased, in dependence on an amplitude of the rectified electrical signal.

In a specific embodiment, second selected rectifier switches of the plurality of rectifier switches may be reverse bulk biased in the bulk biasing mode, and not reversed bulk biased in the non-bulk biased mode which may help to prevent current leakage. The selected rectifier switches and the second selected rectifier switches may alternately forward and reversed bulk biased in the bulk biasing mode, in dependence on a phase of the electrical signal. The rectifier may be operable in the bulk biasing mode at amplitudes of the rectified electrical signal less than or equal to 0.4V and in the non-bulk biased mode otherwise.

The power receiver may have an input load impedance and further comprise an L-C circuit, the input load impedance being dependent on a resonance response of the L-C circuit. The L-C circuit may comprise a parallel L-C circuit. This may help to improve the power received at the receiver.

The electrical signal may have a power level and the power receiver may further comprise a DC-DC converter for converting the rectified electrical signal to an output electrical signal, the DC-DC converter having a number of selectable discontinuous mode (DCM) times and operable between a power transmission operation mode in which the electrical signal is transmitted by a power transmitter; and a power harvesting operation mode in which the electrical signal is harvested ambient energy, in dependence on the power level of the electrical signal. The power receiver may also comprise a controller arranged to select a discontinuous mode (DCM) time from the number of selectable discontinuous mode (DCM) times for the DC-DC converter in response to the operation mode of the DC-DC converter. Switching between power receiving modes and power harvesting modes by altering the discontinuous mode (DCM) time may facilitate switching between modes and enable optimal power recovery in both modes. The controller may be arranged to select between a plurality of power transmission discontinuous mode (DCM) times in response to the power transmission operation mode, and between a plurality of power harvesting discontinuous mode (DCM) times in response to the power harvesting operation mode, in dependence of a voltage of the rectified electrical signal, thereby facilitating optimal power transmission according to the voltage of the signal.

A switching frequency of the DC-DC converter in the power transmission operation mode may be in the range 10 kHz to 500 kHz and a switching frequency of the DC-DC converter in the power harvesting operation mode may be in the range 500 Hz to 6 kHz.

The controller may be further arranged to adjust an inductor charging time of the DC-DC converter within a predetermined range until an input power of the DC-DC converter reaches a maximum value for the predetermined range. The controller may be arranged to determine a direction of adjustment of the inductor charging time based on a corresponding inductor discharging time of the DC-DC converter. The inductor charging time of the DC-DC converter may be between 100 ns and 500 ns. Adjustment of the inductor charging time in this way may enable straightforward fine tuning of the switching frequency of the converter to optimize power recovery.

The power receiver may be formed as an integrated circuit (IC) chip.

The power receiver may further comprise a floating ground node operable as a parasitic capacitive return path via an external ground for the electrical signal, and the first electrode may be operable to receive the electrical signal via the body through capacitive coupling. The first electrode may instead comprise a receiving coil, and the first electrode may be operable to receive the electrical signal via the body through magnetic resonance coupling with a transmitting coil. The power receiver may instead further comprise a second electrode arranged to be electrically coupled to the body of the living being, and wherein the electrical signal is galvanic current. In a second aspect, there is provided a power receiver comprising: a first electrode arranged to be electrically coupled to a body of a living being, the first electrode operable to receive an electrical signal via the body, the electrical signal having a power level; a rectifier for rectifying the electrical signal into a rectified electrical signal; a DC-DC converter for converting the rectified electrical signal to an output electrical signal, the DC-DC converter having a number of selectable discontinuous mode (DCM) times and operable between a power transmission operation mode in which the electrical signal is transmitted by a power transmitter; and a power harvesting operation mode in which the electrical signal is harvested ambient energy, in dependence on the power level of the electrical signal; and a controller arranged to select a discontinuous mode (DCM) time from the number of selectable discontinuous mode (DCM) times for the DC-DC converter in response to the operation mode of the DC-DC converter.

As described in the preferred embodiment, switching between power receiving modes and power harvesting modes by altering the discontinuous mode (DCM) time may facilitate switching between modes and enable optimal power recovery in both modes.

In a third aspect, there is provided a power transmitter comprising: a signal generator having a variable output impedance; the signal generator operable to generate an electrical signal; a first electrode arranged to be electrically coupled to a living being body for transmission of the electrical signal via the living being body; an amplitude detector configured to measure an amplitude of the electrical signal; and a controller operable to adjust an impedance of the variable output impedance based on the amplitude of the electrical signal to enable the amplitude of the electrical signal to at least reach a threshold amplitude for transmission by the first electrode.

As described in the preferred embodiment, adjusting the output impedance based on signal amplitude may enable the transmitter to perform impedance matching of the load due to both the human body and the environment and also detect changes in the load and respond accordingly, which may lead to improved power transmission over long distances. With transmitters according to this embodiment, impedance monitoring, including at the TX-interface, may be performed without introducing design complexity and a reduction in the reflection coefficient may be achieved.

The controller may be operable to determine that the electrical signal has at least reached the threshold amplitude when a magnitude of a difference between the amplitude of the electrical signal and a half open circuit amplitude of the transmitter is less than a predetermined value.

The variable output impedance may comprise a resistive component and a capacitive component, and the controller may be operable to adjust the impedance of the variable output impedance based on a multichotomic search of the amplitude of the electrical signal within a two-dimensional space described by the capacitive component and the resistive component of the variable output impedance to enable the amplitude of the electrical signal to at least reach the threshold amplitude for transmission by the first electrode. The multichotomic search of the amplitude of the electrical signal within two-dimensional space described by the capacitive component and the resistive component of the variable environment output impedance may comprise dividing the two-dimensional space into a plurality of areas and determining the amplitude of the electrical signal at a single point in each of the plurality of areas; and selecting the area for which the amplitude of the electrical signal at the single point is the highest closest to the half the open circuit output amplitude of the transmitter to be searched in a following stage of the multichotomic search.

The signal generator may comprise a first capacitor bank having a first variable configuration, and the capacitive element of the variable output impedance may be dependent on the first configuration of the first capacitor bank; and may further comprise a second capacitor bank having a second variable configuration, in which the resistive component of the variable output impedance may be dependent on the second configuration of the second capacitor bank, wherein the controller being operable to change at least one of the first configuration and the second configuration to adjust the impedance value of the variable output impedance.

The transmitter may be formed as an integrated circuit (IC) chip.

The power transmitter may further comprise a floating ground node operable as a parasitic capacitive return path via an external ground for the electrical signal, such that the first electrode is operable to transmit the electrical signal via the body through capacitive coupling. The first electrode may instead comprise a transmitting coil, the transmitting coil being operable to transmit the electrical signal via the body through magnetic resonance coupling with a receiving coil. The power receiver may instead further comprise a second electrode arranged to be electrically coupled to the body of the living being, wherein the electrical signal is galvanic current.

In a fourth aspect, an energy transfer apparatus may be provided. The energy transfer apparatus may comprise a power transmitter comprising: a signal generator operable to generate an electrical signal, and an electrode arranged to be electrically coupled to a living being body for transmission of the electrical signal via the living being body; and a power receiver comprising: a first electrode arranged to be electrically coupled to a body of a living being, the first electrode operable to receive an electrical signal via the body; a rectifier for converting the received electrical signal into a rectified electrical signal, the rectifier having a plurality of rectifier switches and operable selectively between a bulk biasing mode in which selected rectifier switches of the plurality of rectifier switches are forward bulk biased, and a non-bulk biased mode in which the selected rectifier switches are not forward bulk biased, in dependence on an amplitude of the rectified electrical signal. The signal generator may have an output load impedance, the power transmitter further comprising an L-C circuit, the output load impedance being dependent on a resonance response of the L-C circuit. The power transmitter may instead have a variable output impedance and further comprise: an amplitude detector configured to measure an amplitude of the electrical signal; and a controller operable to adjust an impedance of the variable output impedance based on the amplitude of the electrical signal to enable the amplitude of the electrical signal to at least reach a threshold amplitude for transmission by the electrode.

In a fifth aspect, there is provided an energy transfer apparatus which comprises: a signal generator having a variable output impedance; the signal generator operable to generate an electrical signal; a first electrode arranged to be electrically coupled to a living being body for transmission of the electrical signal via the living being body; an amplitude detector configured to measure an amplitude of the electrical signal; and a controller operable to adjust an impedance of the variable output impedance based on the amplitude of the electrical signal to enable the amplitude of the electrical signal to at least reach a threshold amplitude for transmission by the first electrode. The energy transfer apparatus of this aspect further comprises a power receiver comprising: an electrode arranged to be electrically coupled to a body of a living being, the electrode operable to receive an electrical signal via the body, and a rectifier for rectifying the received electrical signal into a rectified electrical signal. The power receiver further may further comprise an L-C circuit, the input load impedance being dependent on a resonance response of the L-C circuit.

In a sixth aspect, there is provided a method of receiving electrical power via an electrode coupled to a body of a living being, the method comprising: receiving an electrical signal from the body via the electrode; rectifying the received electrical signal into a rectified electrical signal using a rectifier, the rectifier having a bulk biasing mode in which selected rectifier switches of a plurality of rectifier switches are forward bulk biased.

Advantageously, the rectifier may include a non-bulk biased mode in which the selected rectifier switches are not forward bulk biased, and the method may include selectively operating the rectifier between the bulk biasing mode and the non-bulk biasing mode, in dependence on an amplitude of the rectified electrical signal.

The method may further comprise varying an input load impedance for receiving the electrical signal in accordance with a resonance response of an L-C circuit. Alternatively, or additionally, the method may further comprise measuring a power level of the electrical signal; converting the rectified electrical signal to an output electrical signal using a DC-DC converter, the DC-DC converter having a number of selectable discontinuous mode (DCM) times and operable between a power transmission operation mode in which the electrical signal is transmitted by a power transmitter; and a power harvesting operation mode in which the electrical signal is harvested ambient energy, in dependence on the power level of the electrical signal; and selecting a discontinuous mode (DCM) time from the number of selectable discontinuous mode (DCM) times for the DC-DC converter in response to the operation mode of the DC-DC converter.

The method may further comprise adjusting an inductor charging time of the DC-DC converter within a predetermined range to until an input voltage of the DC-DC converter reaches a maximum value for the predetermined range. The method may further comprise determining an inductor discharging time of the DC-DC converter; determining a direction of adjustment of the inductor charging time, based on the inductor discharging time; and adjusting the inductor charging time of the DC-DC converter in the direction of adjustment.

In a seventh aspect, a method of receiving electrical power via an electrode coupled to a body of a living being is provided in which the method comprises: receiving an electrical signal from the body via the electrode; measuring a power level of the electrical signal; rectifying the electrical signal to obtain a rectified electrical signal; converting the rectified electrical signal to an output electrical signal using a DC-DC converter, the DC-DC converter having a number of selectable discontinuous mode (DCM) times and operable between a power transmission operation mode in which the electrical signal is transmitted by a power transmitter; and a power harvesting operation mode in which the electrical signal is harvested ambient energy, in dependence on the power level of the electrical signal; and selecting a discontinuous mode (DCM) time from the number of selectable discontinuous mode (DCM) times for the DC-DC converter in response to the operation mode of the DC-DC converter.

In an eighth aspect, there is provided a method of transmitting electrical power via an electrode coupled to a body of a living being, in which the method comprises: generating, by a signal generator having a variable output impedance, an electrical signal; measuring an amplitude of the electrical signal; adjusting an impedance value of the variable output impedance based on the amplitude of the electrical signal to enable the amplitude of the electrical signal to at least reach a threshold amplitude; and transmitting the electrical signal via the electrode to the living being body. The variable output impedance may have a resistive and a capacitive component, and the method may further comprise: performing a multichotomic search of the amplitude of the electrical signal within a two-dimensional space described by the capacitive component and the inductive resistive component of the variable output impedance; and adjusting the impedance value of the variable output impedance based on the multichotomic search. Performing the multichotomic search of the amplitude of the electrical signal may further comprise dividing the two-dimensional space into a plurality of areas and determining the amplitude of the electrical signal at a single point in each of the plurality of areas; and selecting the area for which the amplitude of the electrical signal at the single point is the highest to be searched in a following stage of the multichotomic search.

In a ninth aspect, a method of transferring power between a power transmitter and a power receiver is provided. The power transmitter includes a signal generator having an output impedance circuit, and a first transmitter electrode electrically coupled to a living being body; the power receiver including a rectifier and a first receiver electrode electrically coupled to the living being, the method comprising: generating an electrical signal by the signal generator, the signal generator having an output impedance, wherein; an impedance of the output impedance is adjusted based on one of resonance response of an L-C circuit, and an amplitude of the generated electrical signal; transmitting the electrical signal via the first transmitter electrode to the living being body; receiving the transmitted electrical signal, by the first receiver electrode, via the living being body; and rectifying the received electrical signal to produce a rectified electrical signal.

The output impedance circuit may further include a floating transmitter node; and the power receiver may further include a floating receiver node; the first transmitter electrode arranged to cooperate with the first receiver electrode to form a transmission path via the living being body for the electrical signal, and the floating transmitter node being arranged to cooperate with the floating receiver node to form a parasitic capacitive return path via an external ground for the electrical signal.

Alternatively, the first transmitter electrode may include a transmitting coil and the first receiver electrode may include a receiving coil, wherein the power transmitter is operable to transmit the electrical signal to the power receiver via the living being body through magnetic resonance coupling between the transmitting and the receiving coil.

Further alternatively, the power transmitter may further include a second transmitter electrode coupled to the living being body, and the power receiver further may include a second receiver electrode, wherein the electrical signal being transmitted by the first transmitter electrode is galvanic current.

The method may further comprise adjusting an input load impedance of the power receiver in dependence on a predetermined resonance response. The rectifier may have a bulk biasing mode in which first selected rectifier switches of a plurality of rectifier switches are forward bulk biased, and a non-bulk biased mode in which the first selected rectifier switches are not forward bulk biased, and rectifying the electrical signal may comprise: selectively operating the rectifier between the bulk biasing mode and the non-bulk biasing mode, in dependence on an amplitude of the rectified electrical signal.

The method may further comprise converting the rectified electrical signal to an output electrical signal using a DC-DC converter, the DC-DC converter having a number of selectable discontinuous mode (DCM) times; and selecting a discontinuous mode (DCM) time from the number of selectable discontinuous mode (DCM) times for the DC-DC converter in dependence of a voltage of the rectified electrical signal. Yet further, the method may comprise measuring an amplitude of the electrical signal; and adjusting the output impedance of the signal generator based on the amplitude of the electrical signal to enable the amplitude of the electrical signal to at least reach a threshold amplitude.

It should be apparent that features relating to one aspect may also be applicable to the other aspects.

BRIEF DESCRIPTION OF THE DRAWINGS

Exemplary embodiments will now be described with reference to the accompanying drawings, in which:

FIG. 4 shows a block diagram of the power transmitter of the apparatus of FIG. 2a;

FIG. 13b shows a schematic representation of the expected PHI1, PHI2 signals and resulting current $I_L$ across the inductor of the switch matrix of the Dual Mode Buck-Boost Converter (DM-BCC) of FIG. 13a;

FIG. 14 shows a schematic of the T1 and T2 delay modules of the Dual Mode Buck-Boost Converter (DM-BCC) of FIG. 13a;

FIG. 17d shows a method of adjustment of T1 performed by the MPPT module of the Dual Mode Buck-Boost Converter (DM-BCC) of FIG. 13a;

FIG. 20 shows an effect of the Bulk Adaptation Rectifier of FIG. 10 on recovered power;

DETAILED DESCRIPTION

Figure 1:
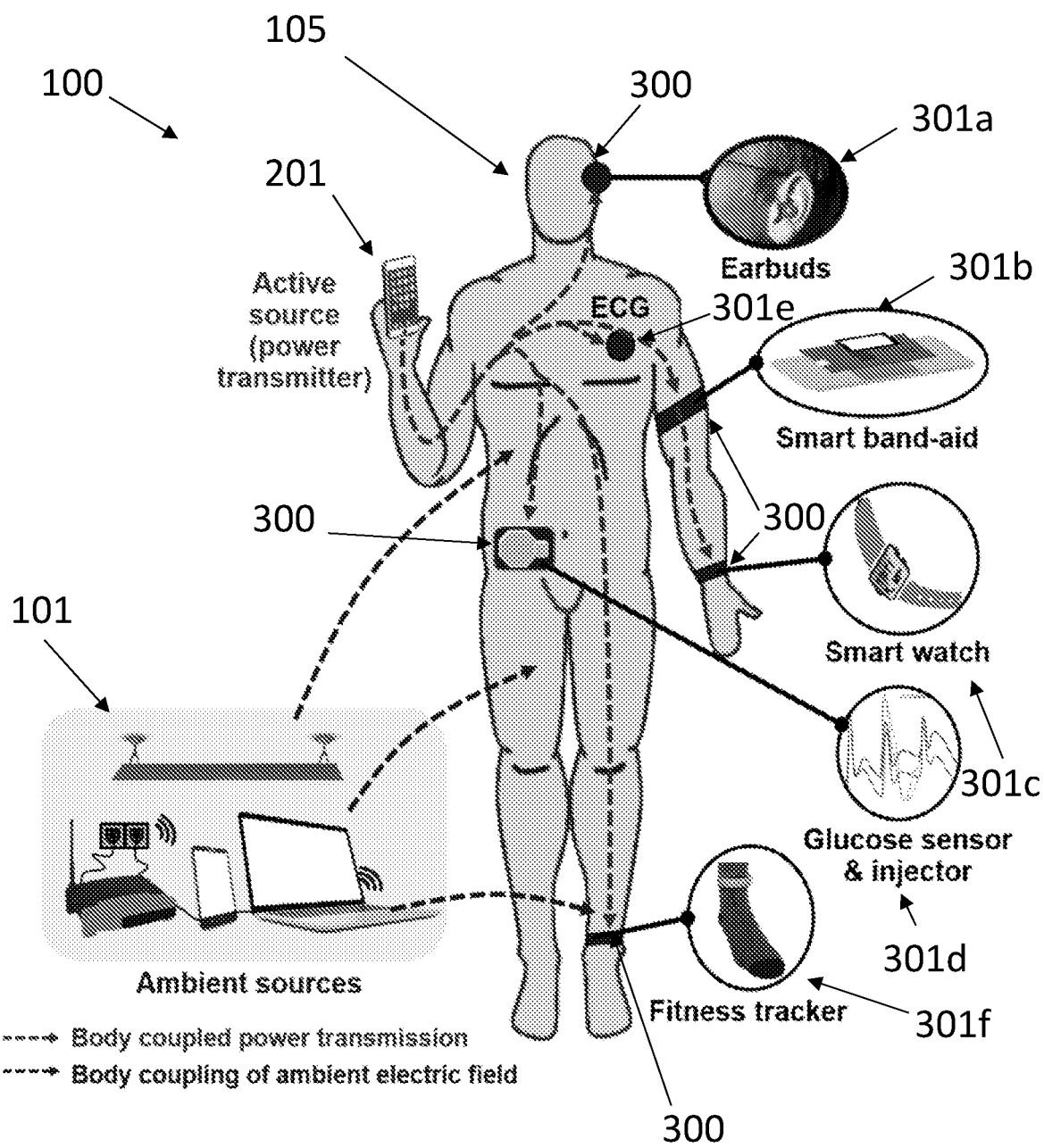
FIG. 1 shows an energy transfer apparatus according to a preferred embodiment coupled to a person.

FIG. 1 illustrates an energy transfer apparatus 100 coupled to a user's body 105 according to a preferred embodiment. The energy transfer apparatus 100 comprises a power transmitter 201 in the form of a smartphone coupled to the user's body 105 and six power receivers 301a, 301b, 301c, 301d, 301e, 301f in the form of wearable or implantable electronic devices also coupled to different parts of the user's body 105, via electrodes 300. Specifically, the power transmitter 201 is coupled to a wrist of the right hand of the user's body 105, and a first power receiver 301a in the form of earbuds is attached to the head, a second power receiver 301b in the form of a smart band-aid is attached the upper left arm, a third power receiver 301c in the form of a smart watch is attached to a wrist of the left hand, and a fourth power receiver 301d in the form of a glucose sensor and injector is attached to the abdomen, a fifth power receiver 301e in the form of an ECG is attached to the chest, and a sixth power receiver 301f in the form of a fitness tracker is attached to the left ankle. As illustrated, the six power receivers 301a, 301b, 301c, 301d, 301e, 301f are operable to receive electrical power via an electrical signal transmitted by the power transmitter 201 via capacitive coupling in a power transfer receiving mode of the power receivers 301a, 301b, 301c, 301d, 301e, 301f and to harvest ambient EM waves from ambient electrical sources 101 via electrical signals within the user's body 105 in a power harvesting mode of the power receivers 301a, 301b, 301c, 301d, 301e, 301f; low-frequency ambient EM waves being observed to couple onto the human body, with the 50/60 Hz wave dominating.

Thus, FIG. 1 illustrates a body-coupled power transmission approach with a real-life application scenario, and a body-coupled ambient energy harvesting approach with potential real-life sources.

Figure 2A:
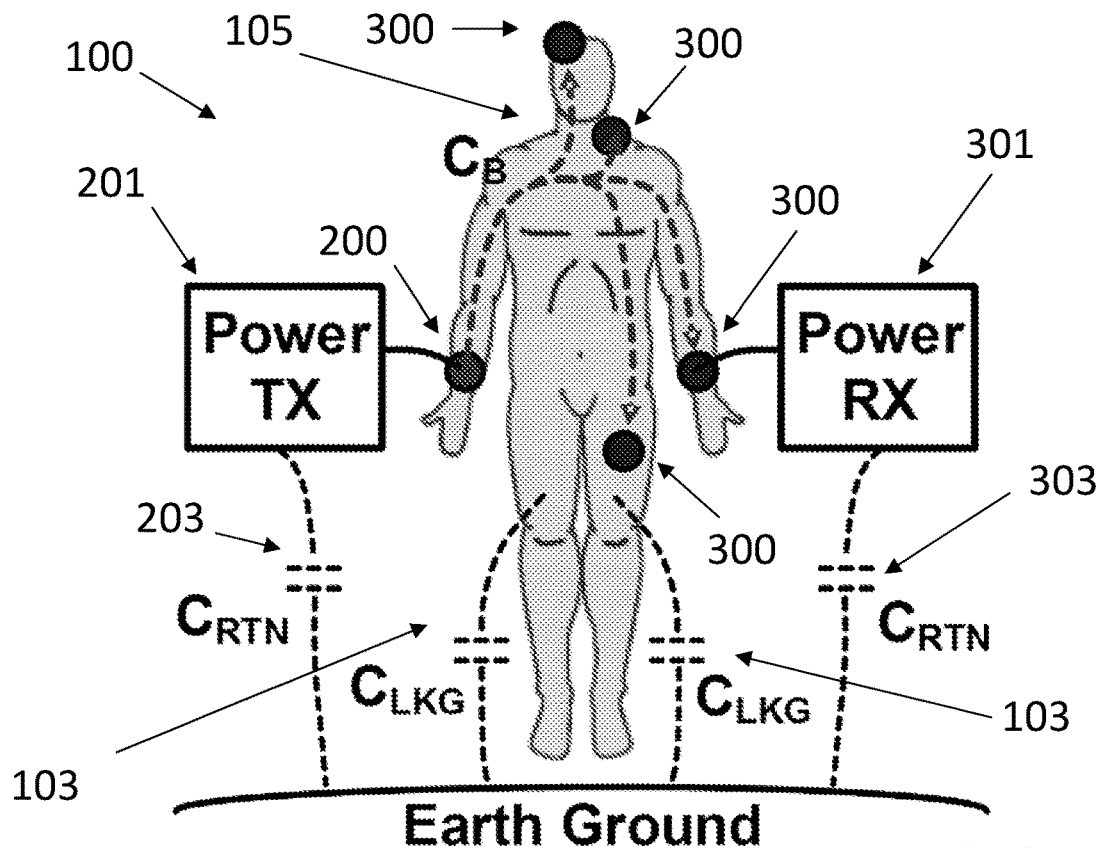
FIG. 2a shows a schematic representation of the energy transfer apparatus of FIG. 1 in a power receiving mode.

FIG. 2a illustrates a simplified representation of the apparatus 100 of FIG. 1 in the power transfer receiving mode of the apparatus 100, albeit with only one power receiver 301 and four receiver electrodes 300 shown for clarity. The power transmitter 201 is coupled to the user's body 105 via a transmitter signal electrode 200, and the power receiver 301 is coupled to the user's body 105, via one of the four receiver signal electrodes 300. The transmitter 201 and receiver 301 are arranged such that no explicit loop between them exists; the capacitive coupling return path is completed by the parasitic capacitance CRIN 203, 303 formed via the ground plane-Earth ground coupling, i.e. the transmitter 201 and receiver 301 both comprise floating ground nodes which are together operable to form the return path for the power transmission via the parasitic capacitances CRIN 203, 303 with an external ground. Meanwhile, the parasitic capacitance between the power transmitter ground and the user's body $C_{LKG}$ 103 and the power receiver ground and the user's body $C_{LKG}$ 103 results in leakage. Therefore, the apparatus 100 is arranged so that any direct contact between the transmitter 201 and receiver 301 ground planes with the body 105 surface is avoided.

Figure 2B:
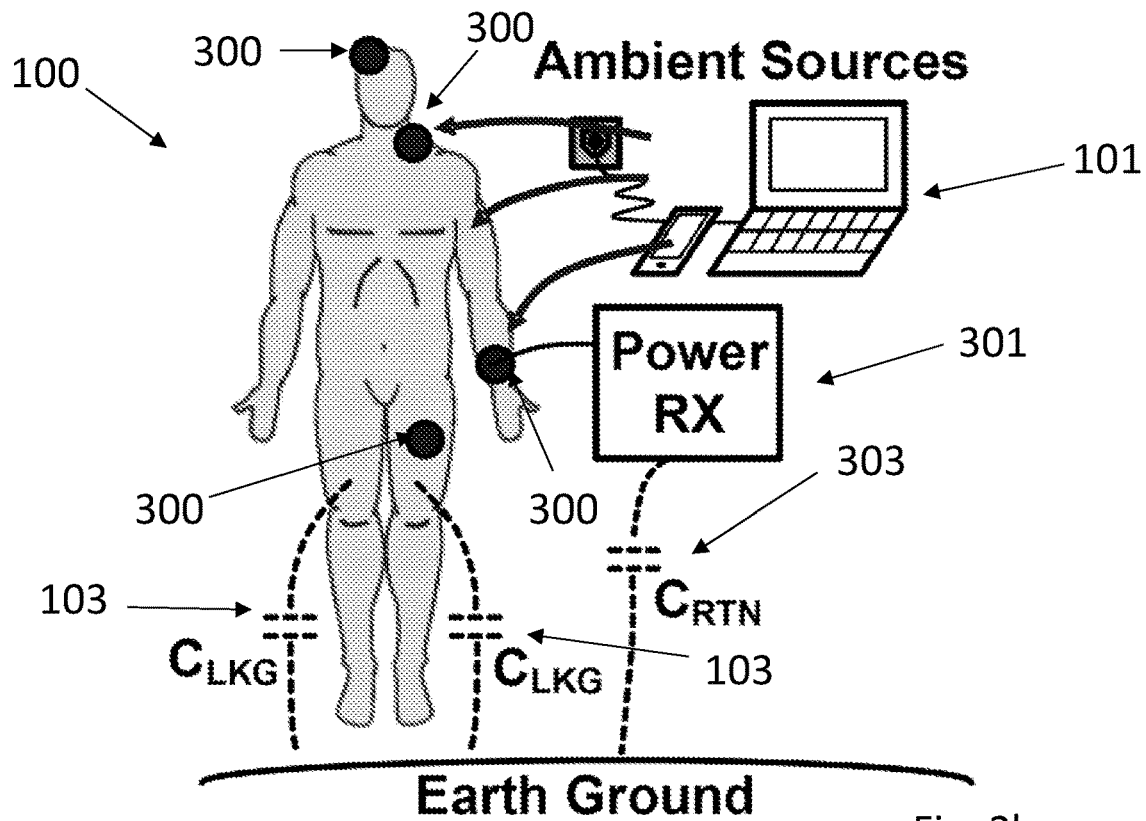
FIG. 2b shows the apparatus of FIGS. 1 and 2a in a power harvesting mode.

FIG. 2b illustrates a simplified representation of the apparatus 100 of FIG. 1 in the power harvesting mode of the apparatus 100, again with only one power receiver 301 and four receiver electrodes 300 shown for clarity. The power receiver 301 is coupled to the user's body 105, via one of the four receiver electrodes 300. The transmitter 201 plays no role in this mode.

Figure 3:
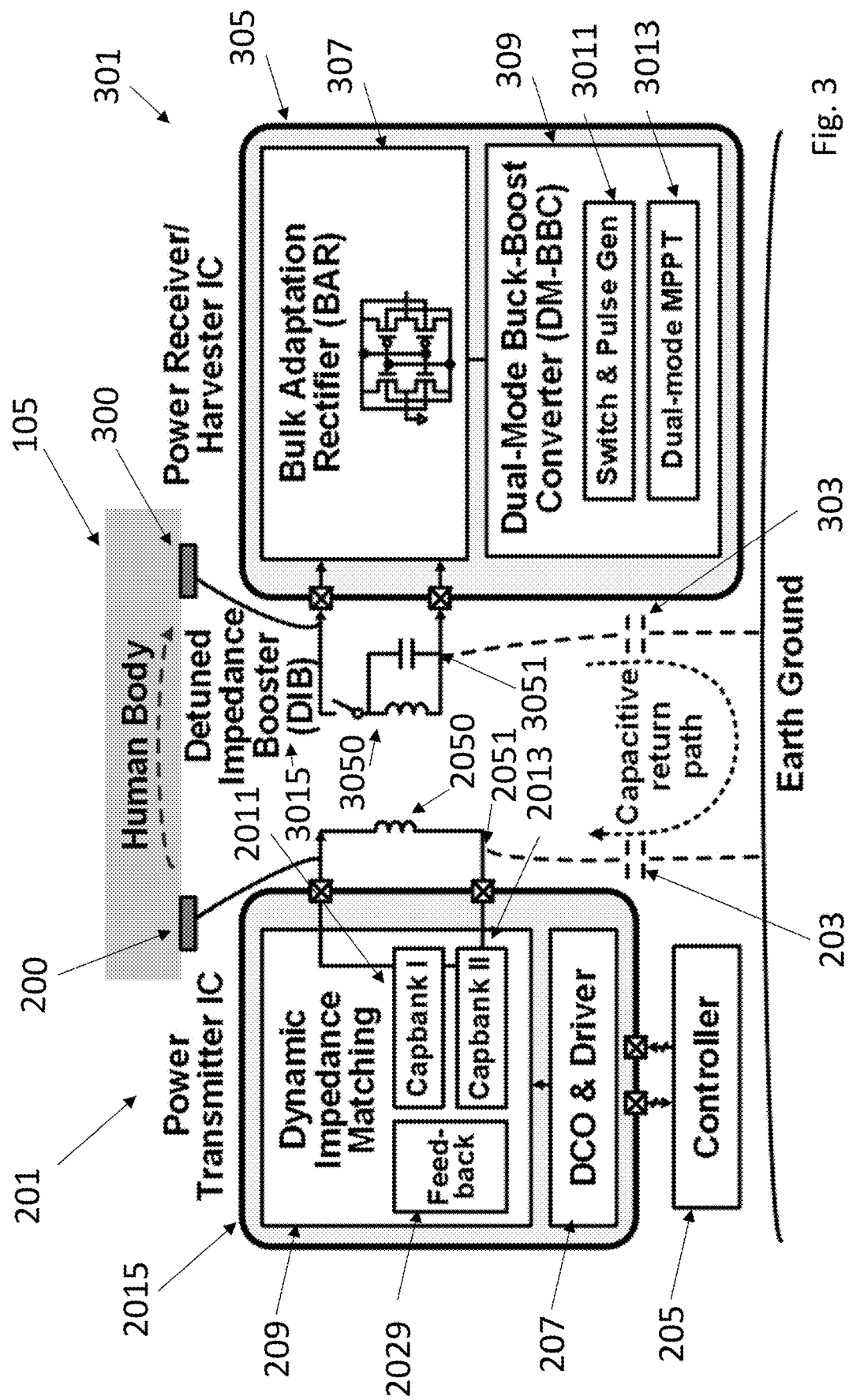
FIG. 3 shows a schematic overview of the transmitter and one of the receivers of the apparatus of FIG. 2a and FIG. 2b.

FIG. 3 illustrates the architecture of the energy transfer apparatus 100 of FIGS. 1 and 2 with a single power receiver 301 illustrated as an example.

The power transmitter 201 has a power transmitter integrated circuit (IC) 2015 in communication with an off-chip controller 205. A signal generator in the form of a digitally controlled oscillator (DCO) and driver 207 are integrated onto the IC 2015. The output impedance of the signal generator 207 is variable by means of a dynamic impedance matching circuit 209 also integrated into the IC 2015 having an electrical signal amplitude detector in the form of feedback module 2029 and two capacitor banks 2011, 2013 in electrical connection with an off-chip inductor 2050 to which the electrode 200 is connected, which together determine the power transmitter output interface impedance, as will be explained below. The dynamic impedance matching circuit 209 includes a floating ground node 2051 of the transmitter forming an electrical signal return path to the transmitter 201 via parasitic capacitance 203 with the external ground. The forward transmission path formed by electrode 200 and the return transmission path 203 are therefore connected either side of the inductor 2050.

In this embodiment, the power receiver 301 comprises a power receiver integrated circuit (IC) 305 having a rectifier in the form of a bulk adaptation rectifier 307 and a DC-DC converter in the form of a dual-mode buck-boost converter 309 comprising a switch and pulse generator 3011 and a dual-mode Maximum Power Point Tracking module 3013. A signal electrode 300 is connected to the power receiver IC 305 via an input impedance circuit in the form of an off-chip detuned impedance booster circuit 3015 comprising a parallel L-C circuit. The impedance booster circuit 3015 includes a floating ground node 3051 of the receiver forming an electrical signal return path from the receiver 301 via parasitic capacitance 303 with the external ground. The forward transmission path formed by electrode 300 and the return transmission path 303 are therefore connected either side of the L-C circuit.

In the transmitting mode of the apparatus, an electrical signal is generated by the signal generator in the form of the DCO and Driver 207 and dynamic impedance matching at the environment interface is performed at the TX 201 by the output impedance circuit in the form of dynamic impedance matching circuit 209. At the RX 301 front-end, the detuned impedance booster (DIB) 3015 and the bulk adaptation rectifier (BAR) 307 are implemented, to perform power recovery enhancement of the signal received via capacitive coupling via electrodes 200, 300. In the case of body-coupled energy harvesting (FIG. 2b), the DIB 3015 is disconnected, with the BAR 307 still in operation. In both power harvesting (FIG. 2b) and power transfer receiving mode (FIG. 2a) modes, the dual-mode buck-boost converter (DM-BBC) 309 performs maximum power point tracking and load regulation at 1.1 V, the nominal supply voltage for standard MOSFETS in 40 nm.

Figure 4:
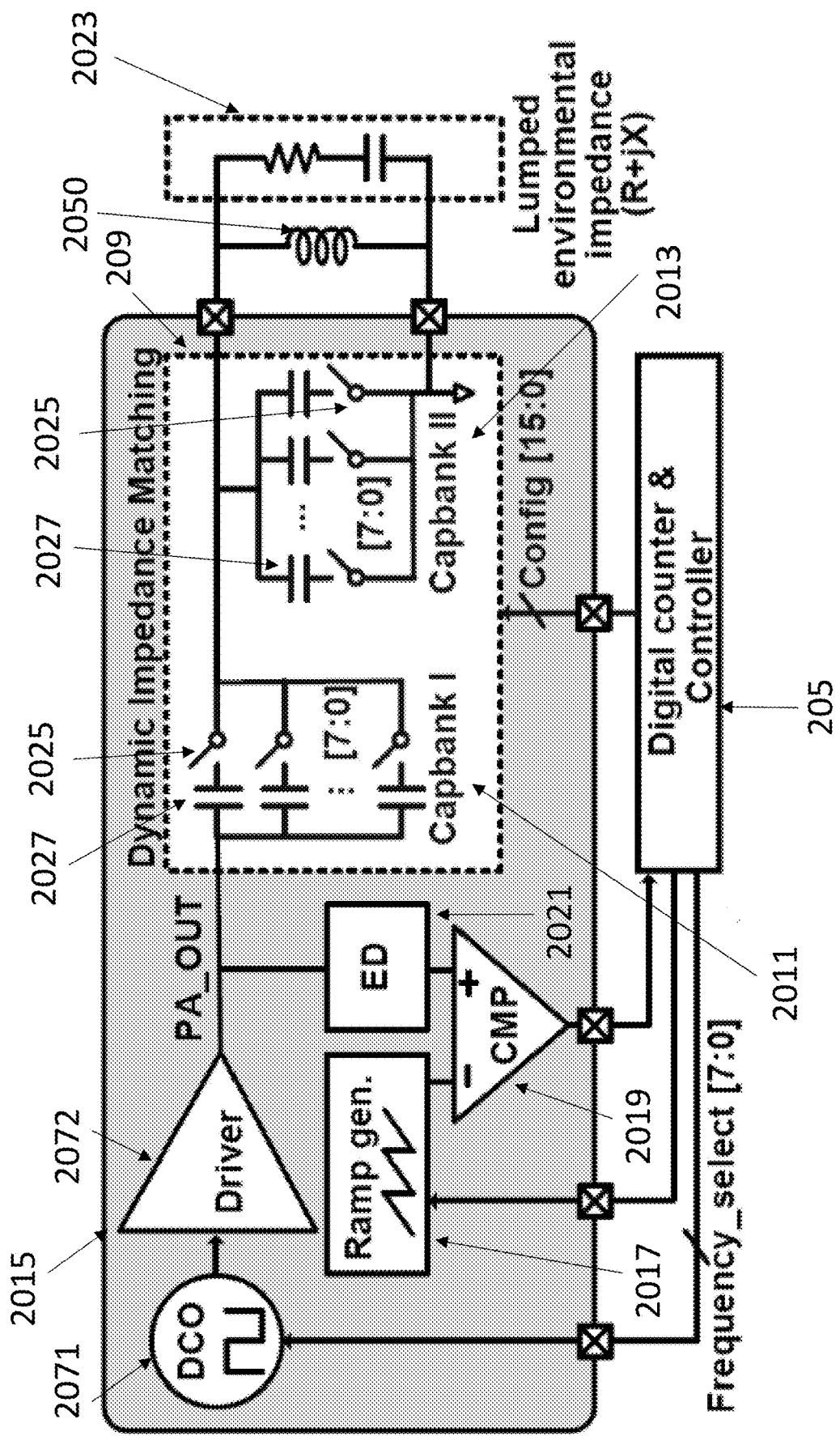

The detailed block diagram of the power transmitter 201 is shown in FIG. 4 with the resistive and capacitive components of environmental impedance resulting from connection with the body 105 represented schematically by resistor capacitor circuit 2023 and includes contributions from both the skin-electrode parasitic capacitance at the signal node 200, including a reflection coefficient, and the parasitic capacitance at the return path floating node 2051, both nodes being connected across the inductor 2050, as shown in FIG. 3. The digitally controlled oscillator (DCO) 2071 is arranged to generate a 40 MHz square wave, which outputs to a driver 2072 with an output impedance of 50Ω. A dynamic impedance matching circuit 209 is arranged in between the driver 2072 output and the electrode 200 interface. The dynamic impedance matching circuit 209 has two capacitor banks 2011,2013 and an off-chip inductor 2050. Each capacitor bank 2011,2013 has eight capacitors 2027 arranged in parallel, each capacitor 2027 with a corresponding switch 2025 which enables the individual capacitors 2027 to be switched on or off to obtain different configurations of each capacitor bank 2011, 2013. The eight configurations of each capacitor bank 2011,2013 are controlled by the controller 205 arranged to output a control signal to the dynamic impedance matching circuit 209.

The first capacitor bank 2011 is arranged in series with the off-chip inductor 2050 and second capacitor bank 2013. The second capacitor bank 2013 is arranged in parallel with the off-chip inductor 2050. This arrangement enables the first capacitor bank 2011 to offer an adjustable capacitive element of the dynamic impedance matching circuit 209 and the second capacitor bank 2013 and the off-chip inductor 2050 to offer an adjustable inductive element for L-C impedance matching.

The transmitter further includes a ramp generator 2017, and envelope detector 2021, with outputs compared by comparator 2019 for input into the controller 205 which includes a digital clock. Together, the ramp generator 2017, and envelope detector 2021 and comparator 2019 make up the feedback module 2029 shown in FIG. 3.

In operation, dynamic matching of the environmental impedance (as represented by resistor-capacitor circuit 2023 in FIG. 4) is performed, which automatically configures the capacitor banks 2011, 2013. In conditions of matched impedance (where the driver 2072 output impedance equals the equivalent load impedance represented by 2023), half of the open-circuit voltage of the driver 2072 falls across the load. Therefore, an amplitude detector, in the form of an envelope detector (ED) 2021 (see N. M. Pletcher, S. Gambini and J. M. Rabaey, "A 2 GHz 52 µW Wake-Up Receiver with −72 dBm Sensitivity Using Uncertain-IF Architecture," IEEE International Solid-State Circuits Conference (ISSCC) Dig. Tech. Papers, vol. 51, pp. 524-633, February 2008 for a detailed explanation) is used to track the output amplitude of the driver 2072 (which will be affected by the configuration of the capacitor banks 2011, 2013). The output amplitude of the driver 2017 is then compared using comparator 2019 with a ramp waveform generated by the ramp generator 2017 for voltage-time conversion using a digital counter in the controller 205.

Such time information represented by the number of counting cycles provides feedback to the digital controller 205 and guides the capacitor bank 2011, 2013 reconfiguration direction, until the driver 2072 output amplitude eventually approaches the half-open circuit amplitude.

Figure 5:
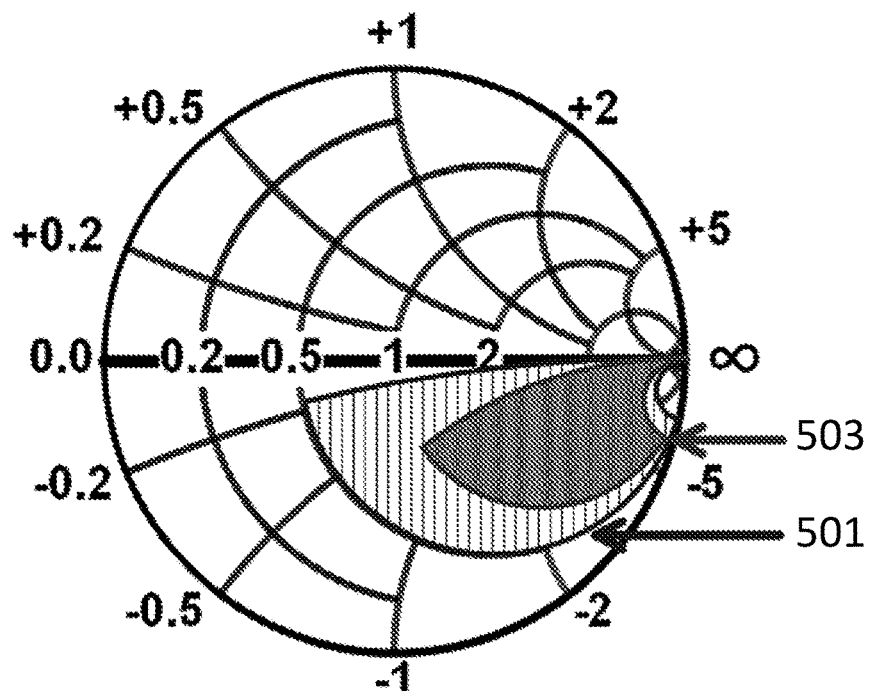
FIG. 5 shows an impedance range covered by the dynamic impedance matching of the power transmitter of FIG. 4.

As explained above, the two capacitor banks 2011, 2013 have an 8-bit configurability with the least significant bit (LSB) controlling 50 fF resulting in 65,536 ($2^8 \times 2^8$) possible capacitor bank 2011, 2013 configurations being obtainable. The off-chip inductor 2050 is 2.2 µH. Area 501 of FIG. 5 illustrates the coverage obtainable by the dynamic matching network 209, with the corresponding expected environmental impedance range shown by area 503.

Figure 6:
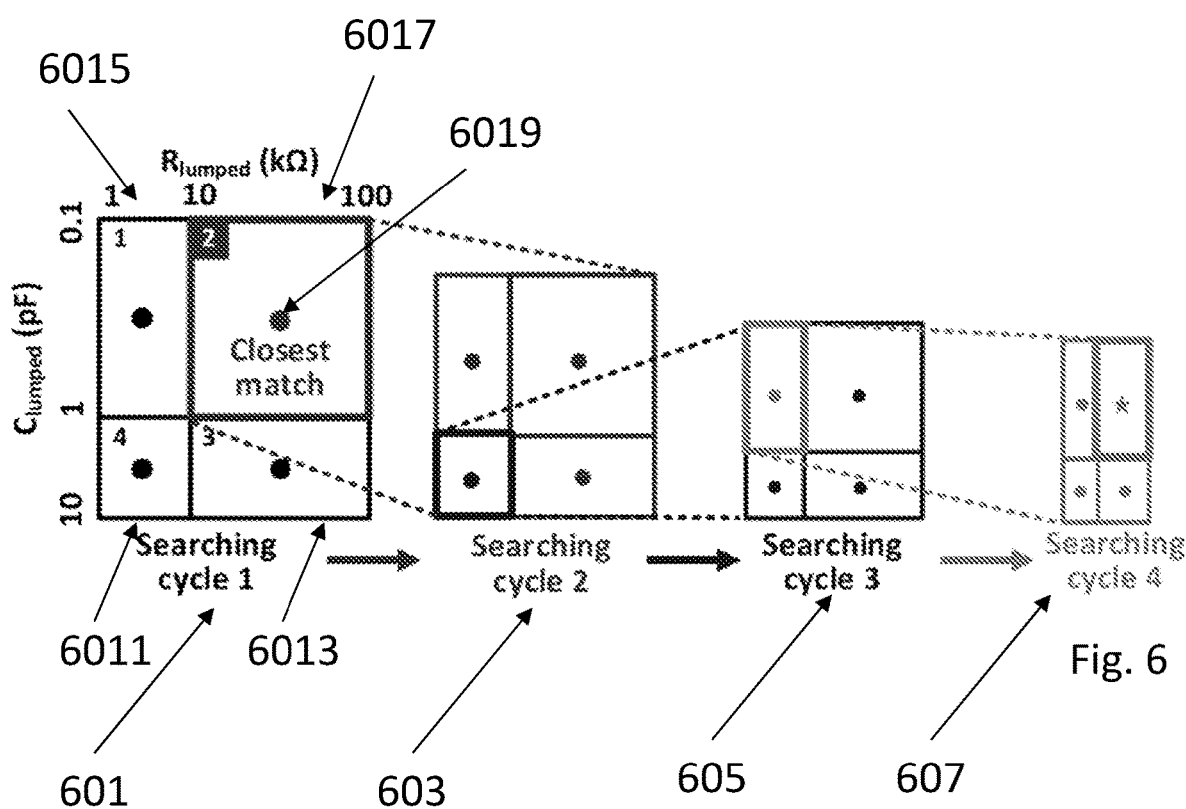
FIG. 6 shows a method of impedance matching performed by the power transmitter of FIG. 4.

A multichotomic search, in the form of a 2-dimensional tetrachotomy-based searching method is employed to determine the final convergence, as illustrated in FIG. 6. The potential environment-equivalent resistance and capacitance ranges are represented by a 2-dimensional searching plane, with the vertical axis being the capacitive element and the horizontal axis being resistive. Each point on the plane thus represents one possible environmental impedance. During the first searching cycle 601, the plane is divided into 4 quadrants 6011, 6013, 6015 and 6017, with the capacitor banks 2011, 2013 configured to match each centre point 6019 sequentially. Upon deciding the closest match (by comparing the driver 2072 output amplitude against the half-open circuit amplitude and determining which centre point 6019 corresponds to the amplitude closest to this value), its corresponding quadrant is selected for further sub-divisions in further searching cycles 603,605,607. This process is repeated until the driver 2072 output amplitude reaches at least a threshold amplitude, in this preferred embodiment namely ±0.15 V of the half-open circuit amplitude, i.e. the magnitude of the difference between the amplitude of the electrical signal and the half open circuit amplitude is less than 0.15V. The maximum number of searching cycles (i.e., plane/quadrant sub-division) is limited to 4, corresponding to 16 times output amplitude evaluation and thus a worst settling time of 16 ms (where the interval in between two evaluations is 1 ms). Assuming slower environmental impedance change (>100 ms, as the human body 105 movement is generally below 10 Hz), this may help to prevent instability concerning the algorithm.

A new search is triggered if the feedback circuit 2029 detects that the driver 2072 output amplitude has drifted from the half-open circuit amplitude of 1.25V. A search is triggered whenever the current output amplitude is more than 0.15V away from the half-open circuit amplitude of 1.25V.

Figure 7:
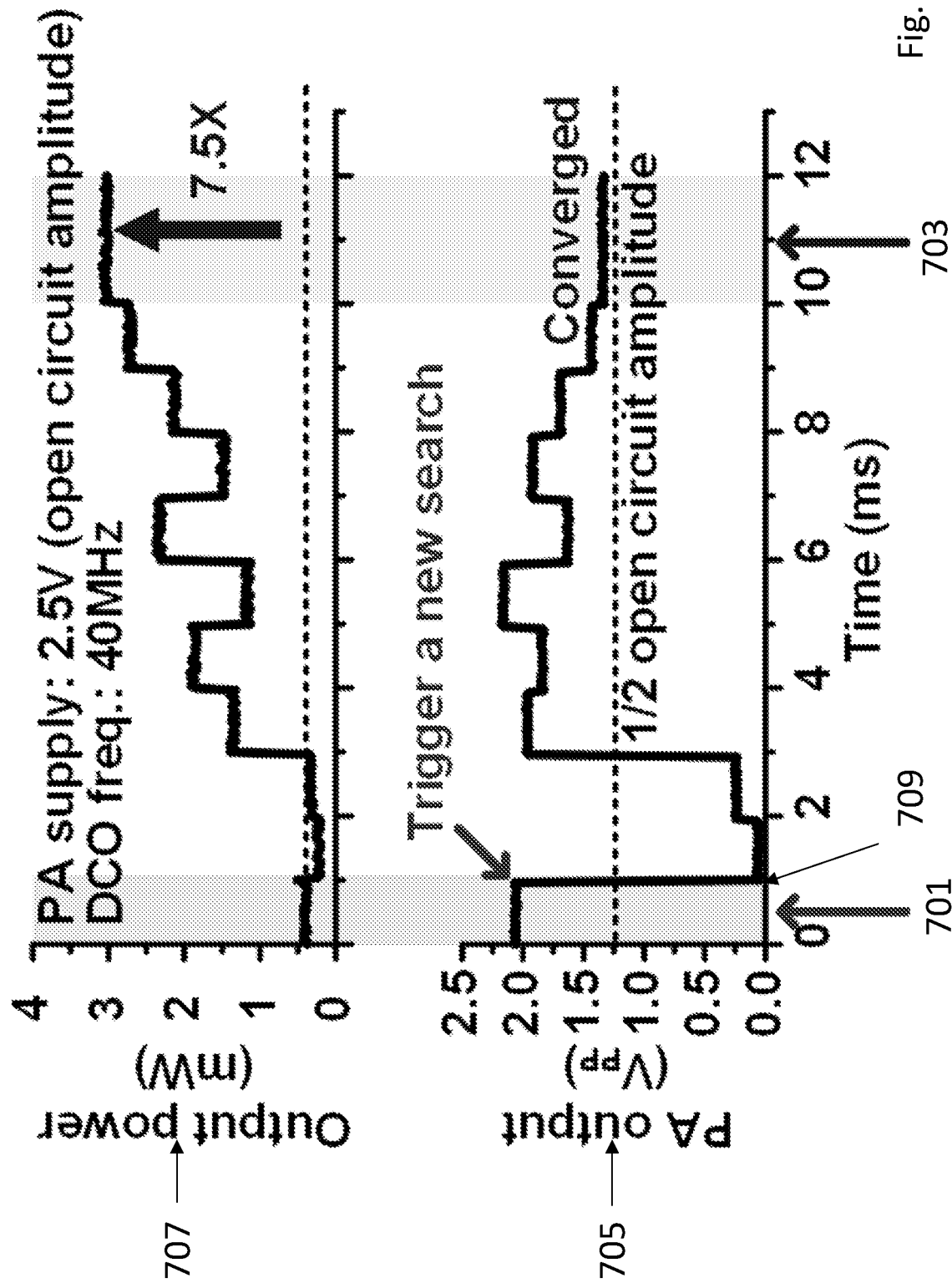
FIG. 7 shows a change in output power of the power transmitter of FIG. 4 as impedance matching according to the method of FIG. 6 is performed.

FIG. 7 shows the measured transient behaviour of the TX 201 output power 707 and the driver 2072 output amplitude 705 during an example searching procedure. In this experiment, a capacitor bank 2011, 2013 configuration initially matched under one environmental setting was subject to interface impedance changes, and its driver 2072 output amplitude 705 drifted away from its half-open circuit amplitude (1.25 V) at 701, thus triggering the searching for a new matched capacitor bank 2011, 2013 configuration at 709. As the search is performed the configurations of the capacitor banks 2011, 2013 are altered, as visible in the changing driver 2072 output power 705 and corresponding changes in the TX 201 output power 707. The amplitude 705 converges to the half-open circuit amplitude of 1.25V at 703 after which no further changes to the capacitor bank 2011, 2013 configurations are made. A resulting 7.5 times improvement in the output power 707 is observed upon convergence relative to the power value at the start of the search 709.

Figure 8:
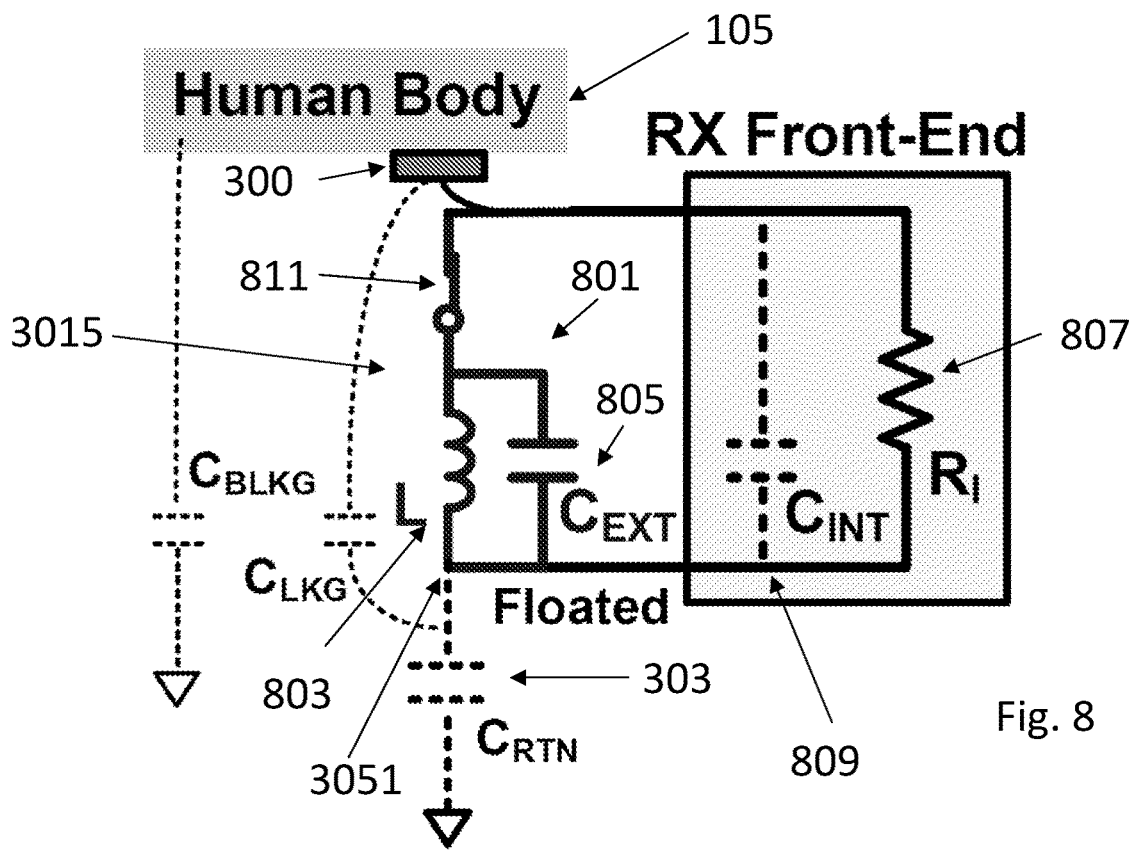
FIG. 8 shows a detuned impedance booster of the receiver of FIG. 3.

Turning now to the power receivers 301, FIG. 8 illustrates the front end of the receiver 301, including the input impedance circuit in the form of the detuned impedance booster (DIB) 3015. The impedance booster comprises a parallel L-C circuit 801 comprising inductor 803 and external capacitor 805. The L-C circuit 801 is arranged so as to be in parallel with the equivalent rectifier input capacitance (represented by 809). The resistance of the circuit is defined by load resistance RI (807). In this arrangement, the inductor 803 resonates with the overall capacitance of both the external capacitor 805 and the equivalent rectifier input capacitor 809 and the input load impedance of the power receiver 301 is boosted at the resonance frequency of the L-C circuit 801. The input load impedance of the power receiver 301 includes contributions from both the skin-electrode parasitic capacitance at the signal node 300, including a reflection coefficient, and at the parasitic capacitance at the return path floating node 3051, both nodes being connected across the inductor 3050. The properties of the inductor 803 and external capacitor 805 determine the bandwidth of the resonance response of the L-C circuit 801 which is intentionally detuned, as will be explained below. A switch 811 is provided to enable the impedance booster 3015 to be switched off in the power harvesting mode.

Figure 9:
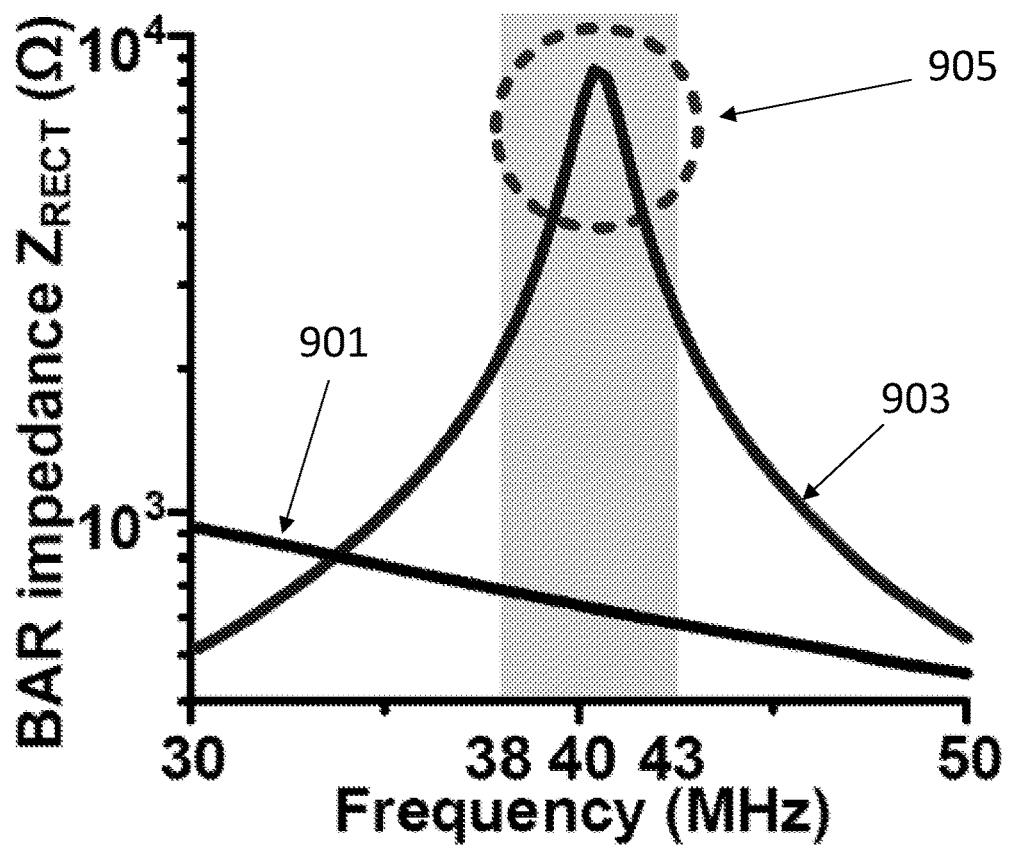
FIG. 9 shows an example impedance boosting performed by the detuned impedance booster of FIG. 8.

According to the preferred embodiment, the inductance of the inductor 803 is 1.2 pH and the capacitance of the capacitor 805 is 6.8 pF, so that the boosted RX 301 input impedance is measured around 8 kΩ, as shown in FIG. 9, which shows the receiver 301 input impedance with 903 and without 901 the detuned impedance booster 3015. The boosted RX 301 input impedance 903 is around the same level as the impedance of $C_{RTN}$ 303 at the resonance/transmission frequency of 40 MHz.

The L-C circuit 801 is detuned for impedance matching across a wider range. Detuning is performed to achieve around 6-10× impedance boosting 903 across a 2.8 MHz bandwidth 905, which has been found to provide the best performance for a transmission frequency of 40 MHz.

Figure 10:
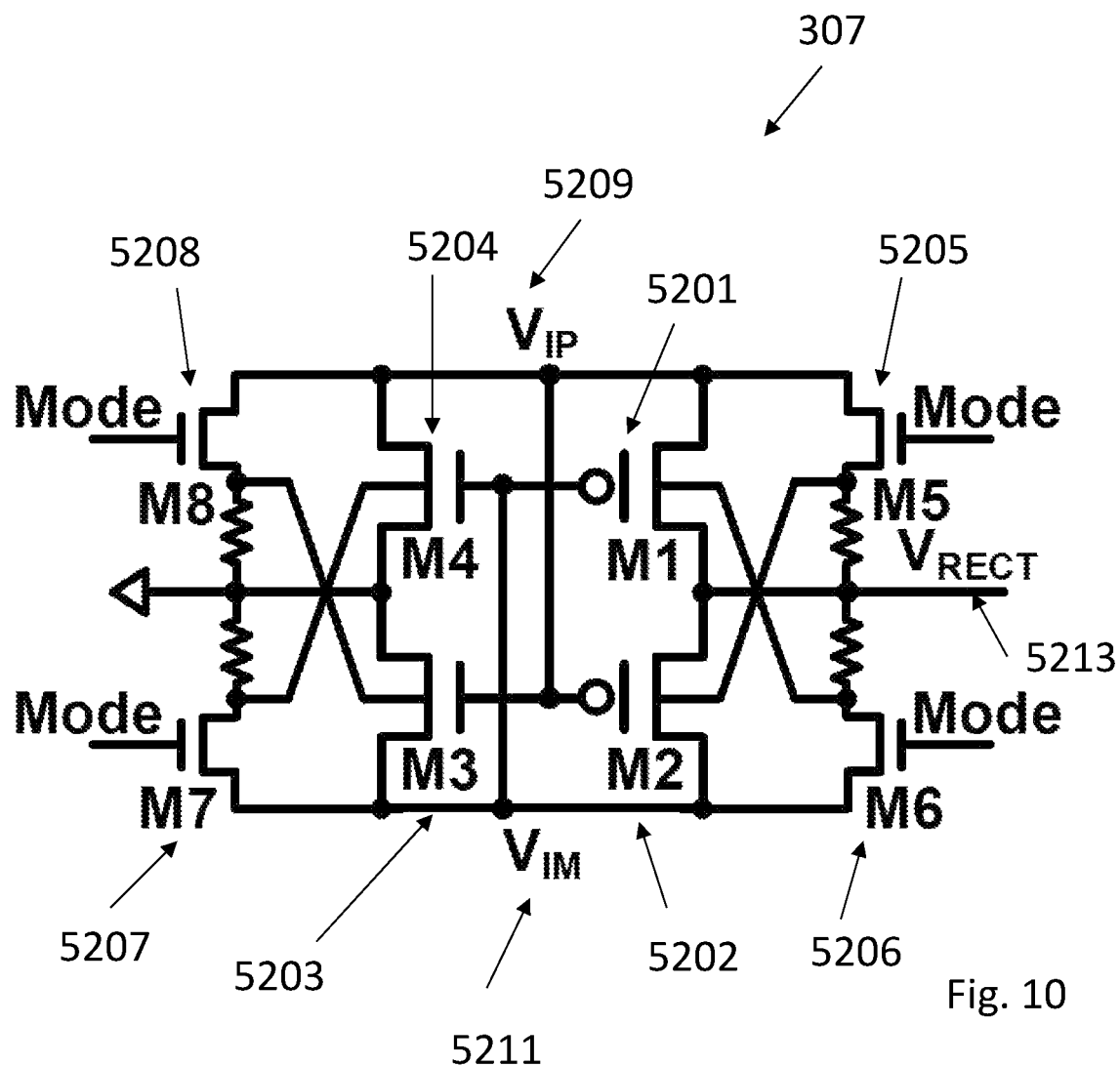
FIG. 10 shows a bulk adaptation rectifier of the receiver of FIG. 3.

FIG. 10 illustrates the bulk adaptation rectifier ("BAR") 307. The BAR 307 has eight switches 5201-5208 which are arranged into two groups 5201-5204 and 5205-5208. 5201-5204 are arranged as a full-wave gate differential-drive cross-coupled rectifier with applied voltage $V_{IP}$ 5209-$V_{IM}$ 5211 and output signal $V_{RECT}$ 5213. Specifically, 5201 and 5202 are p-well transistors gated by $V_{IM}$ 5211 and $V_{IP}$ 5209 respectively with bulk connected towards ground and 5203 and 5204 are deep n-well transistors gated by $V_{IP}$ 5209 and $V_{IM}$ 5211, respectively with bulk connected towards $V_{RECT}$ 5213. Switches 5205-5208 are n-well transistors arranged to connect the bulk of switches 5201 to 5204 to the applied voltage $V_{IP}$ 5209-$V_{IM}$ 5211. Specifically switches 5208, 5205 are arranged to connect the bulk of switches 5203, 5202 respectively to $V_{IP}$ 5209; and switches 5206,5207 and arranged to connect the bulk of switches 5204,5201 respectively towards $V_{IM}$ 5211 The BAR 307 therefore has two modes of operation: switches 5205-5208 switched off ("non-bulk biased mode", or equivalently "normal mode") and switches 5205-5208 switched on ("bulk biasing mode").

Figure 11:
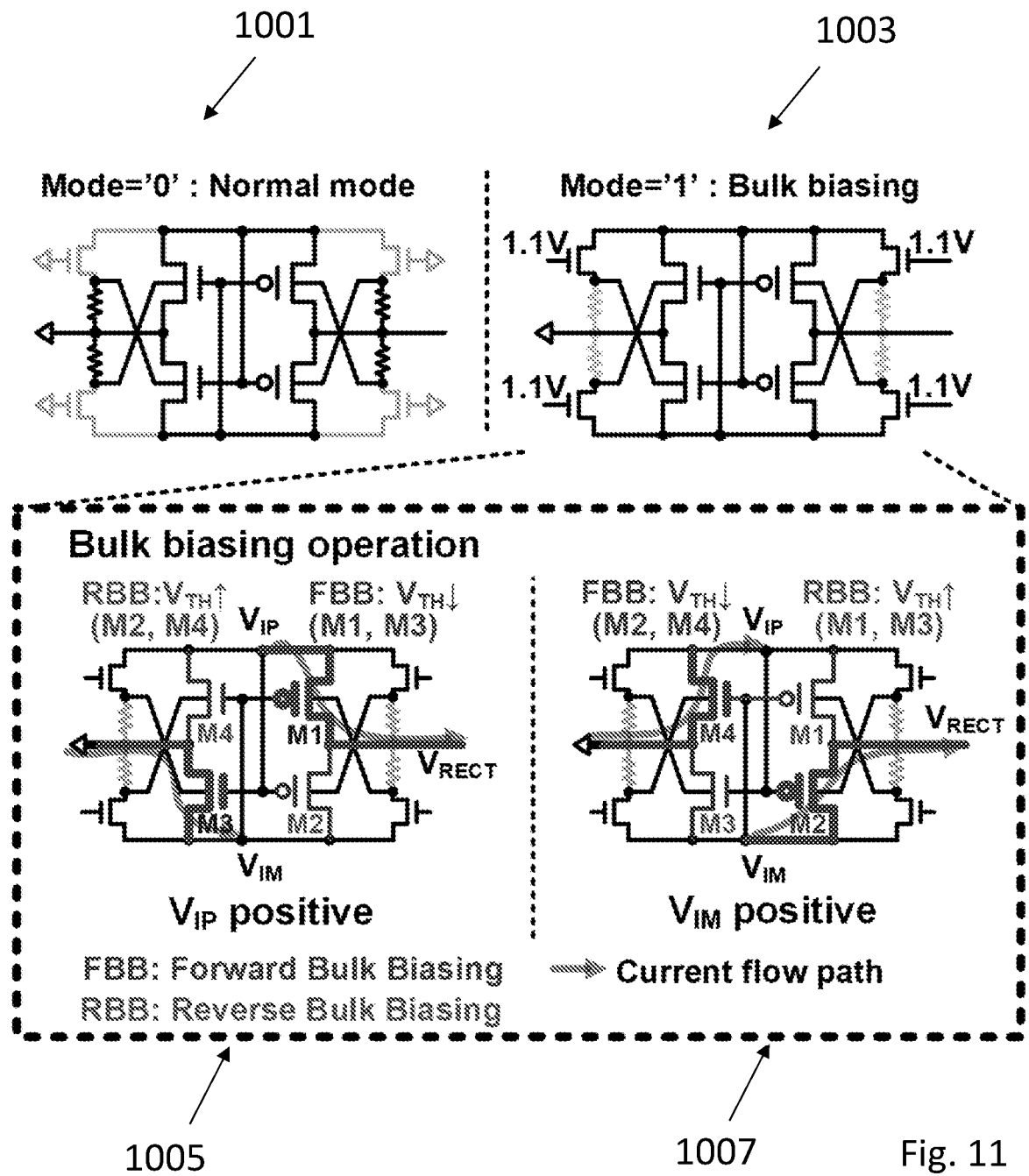
FIG. 11 illustrates two modes of operation of the bulk adaptation rectifier of FIG. 10.

FIG. 11 illustrates the operation of the BAR 307 in the two modes (certain reference numerals from FIG. 10 are omitted in FIG. 11 for conciseness). When the input amplitude drops below a threshold value, for example 0.4 V, the rectifier 307 is switched to a bulk biasing mode in which switches 5205-5208 are turned on as shown by configuration 1003, which connects the bulk of switches 5201-5204 towards $V_{IP}$ 5209 and $V_{IM}$ 5211, allowing their bulk voltages to alter dynamically based on the AC input. In configuration 1005, during the half-sine cycle where $V_{IP}$ 5209 is higher than $V_{IM}$ 5211, switches 5201, 5203 are in the forward conduction path and are forward bulk biased. Their threshold voltage is thus reduced, allowing more forward conduction current to $V_{RECT}$ 5213. On the other hand, switches 5202, 5204 are in the leakage path and are reverse bulk biased, with an increased threshold to suppress the leakage current flow out of $V_{RECT}$ 5213. The same applies to the other sine cycle in configuration 1007, where $V_{IM}$ 5211 >$V_{IP}$ 5209. In this mode, the source/drain-bulk DC leakage current due to the bulk potential adjustment is increased, but still 4-6 orders of magnitude lower than the conduction current. The more prominent AC leakage due to bulk capacitance (not caused by the bulk adaption proposed) will be directed towards $V_{RECT}$ 5213 before it degrades the power recovery.

At higher input amplitude (for example >0.6V), the dynamic $V_{GS}$ is much greater than $V_{TH}$. Meanwhile, the body diodes start to approach their turn-on voltage and cause increased leakage, making the bulk biasing 1003 no longer necessary nor efficient and the rectifier 307 is switched back to a non-bulk biased mode 1001 in which switches 5205-5208 are turned off which reconfigures the bulk of 5201 to 5204 towards $V_{RECT}$ 5213 and ground. This aligns the body diode towards the $V_{RECT}$ 5213, which effectively avoids leakage via the body diode. Whether the rectifier 307 is in bulk biasing mode 1003 or non-bulk biased mode 1001 is determined by the comparison between $V_{RECT}$ 5213 and a reference voltage, which is 0.4V according to the preferred embodiment, using a duty-cycled dynamic comparator (not shown), i.e. it depends on the amplitude of the electrical signal.

Figure 12:
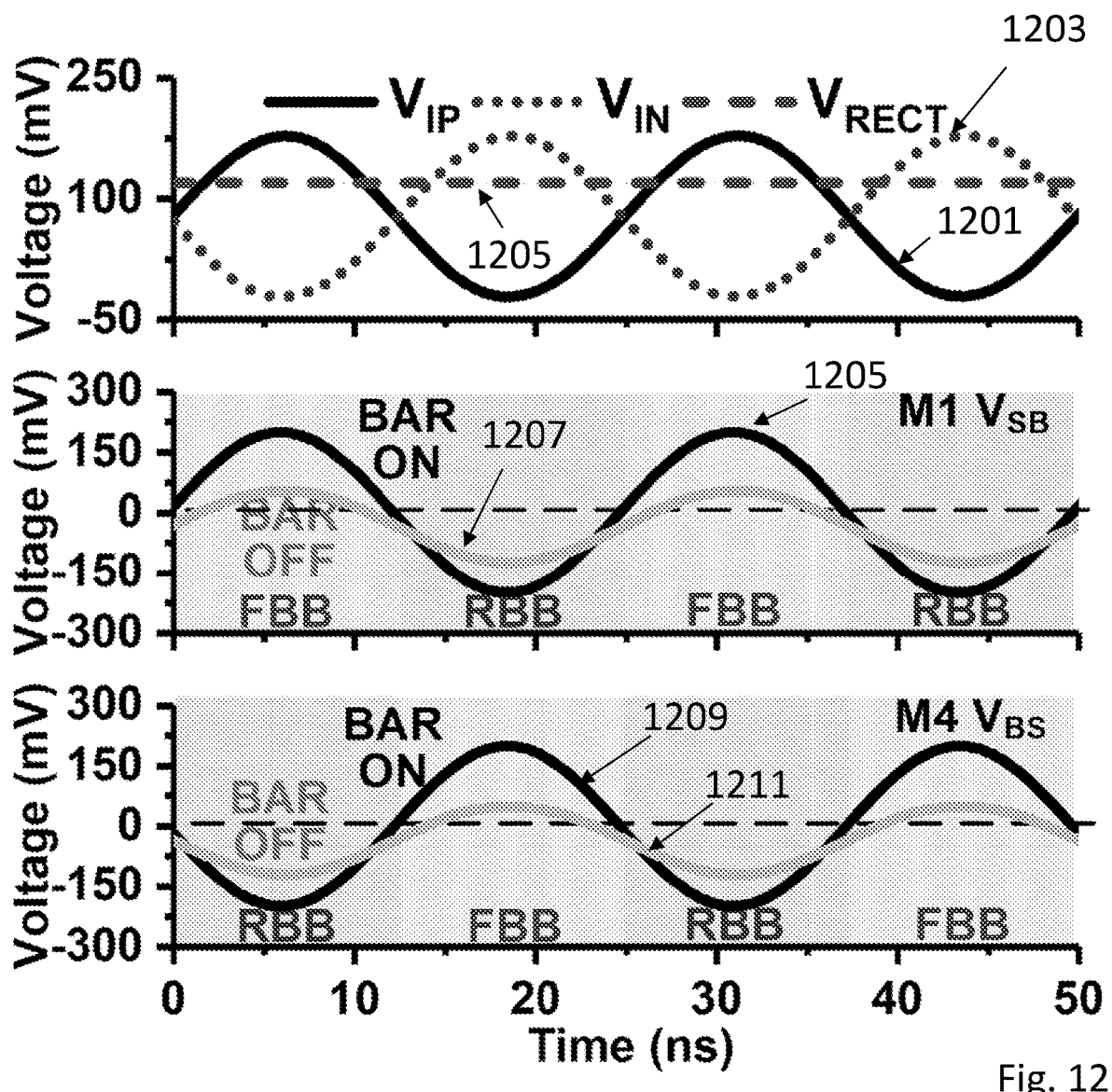
FIG. 12 illustrates source-bulk and bulk-source behaviors of the bulk adaptation rectifier of FIG. 11.

FIG. 12 illustrates the operation of the BAR 307 and shows the simulated $V_{SB}/V_{BS}$ (for PMOS and NMOS, respectively) behaviour using the BAR 307. $V_{IP}$ 1201 and $V_{IM}$ 1203 are shown in the top graph with an input amplitude of 200 mV along with rectified signal 1205. At this voltage, the BAR 307 operates in the bulk biasing mode 1003. The $V_{SB}/V_{BS}$ is improved for transistors 5201, 5202, 5203, 5204 along the forward conduction path, and decreased for those transistors 5201, 5202, 5203, 5204 along the reverse leakage path as shown for the BAR 307 on results 1205 and 1209 for $V_{SB}$ and $V_{BS}$, respectively compared with the corresponding BAR 307 off results 1207 and 1211.

Figure 13A:
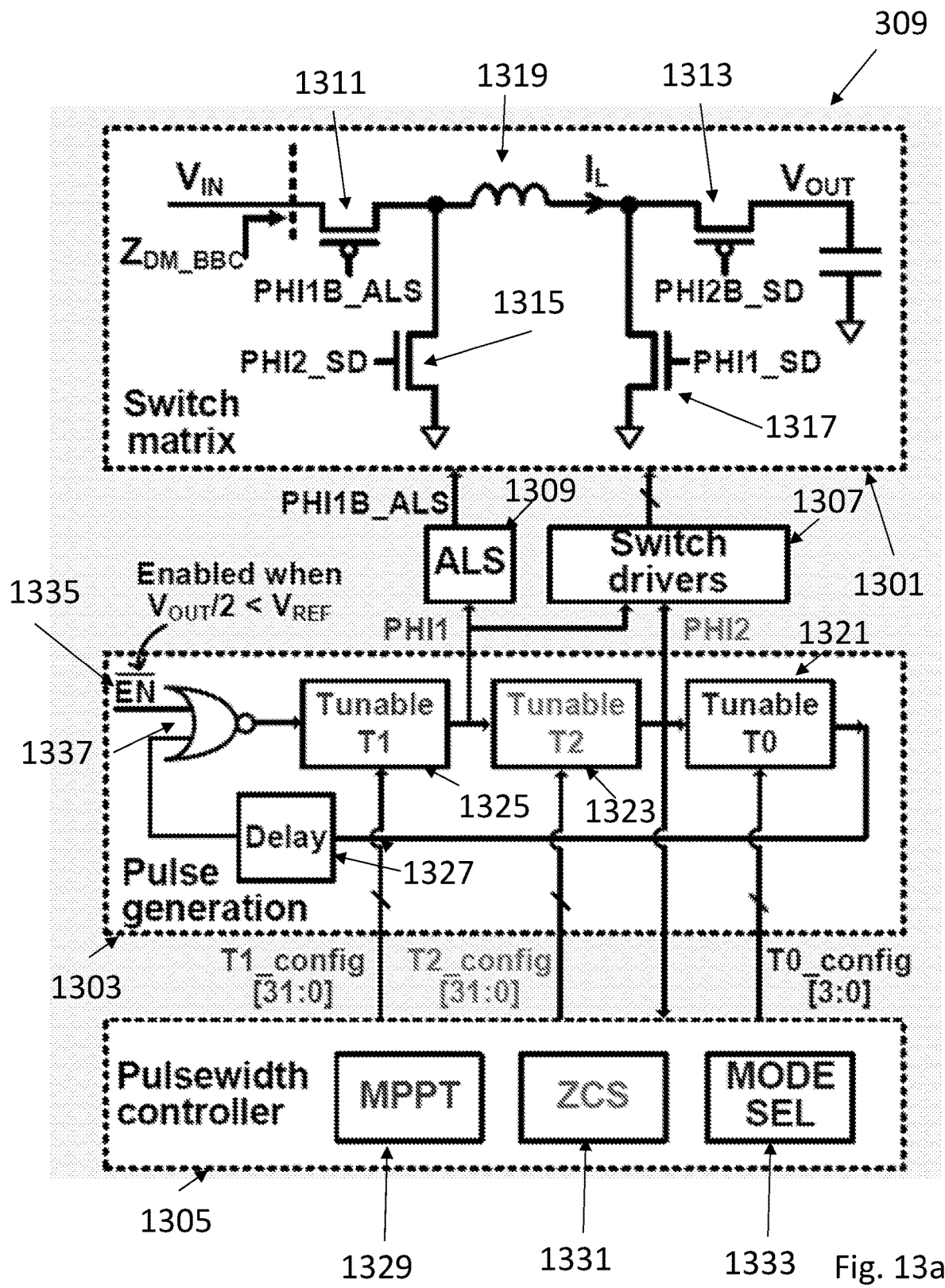
FIG. 13a shows a simplified architecture of the Dual Mode Buck-Boost Converter (DM-BCC) of the receiver of FIG. 3.

FIG. 13a illustrates a simplified architecture of the Dual Mode Buck-Boost Converter (DM-BCC) 309 operating in the discontinuous conduction mode (DCM). The Converter 309 comprises a switch matrix 1301, a pulse generation module 1303 and a controller in the form of a pulse width controller 1305, as well as control switch drivers 1307 and an adaptive level shifter (ALS) 1309.

The switch matrix 1301 has two p-well transistors 1311, 1313 with an inductor 1319 connected in series between them and two n-well transistors 1315,1317 connecting either side of the inductor 1319 to ground. The gate voltage of transistor 1311 is controlled by control signals generated by the ALS 1309 with the gate voltage of transistors 1313-1317 controlled by control signals generated by the switch drivers 1307.

In operation, the switch matrix 1301 converts input voltage $V_{IN}$ output by the rectifier 307 and converts it to $V_{OUT}$ for supplying a device or storage. $V_{OUT}$ is regulated to a constant 1.1V, which is the nominal supply voltage for standard MOSFETS in 40 nm.

The pulse generation module 1303 comprises Tuneable T1 (1325), T2 (1323) and T0 (1321) delay modules, each of which has a plurality of configurations, a fixed delay module 1327 and a NOR gate 1337 with the total delay from all modules 1325, 1323, 1321 and 1327 and an enabling signal $\overline{EN}$ 1335 as inputs, with $\overline{EN}$ 1335 held to 0 when half the output voltage $V_{OUT}$ is below a reference voltage, as will be explained later.

Figure 13B:
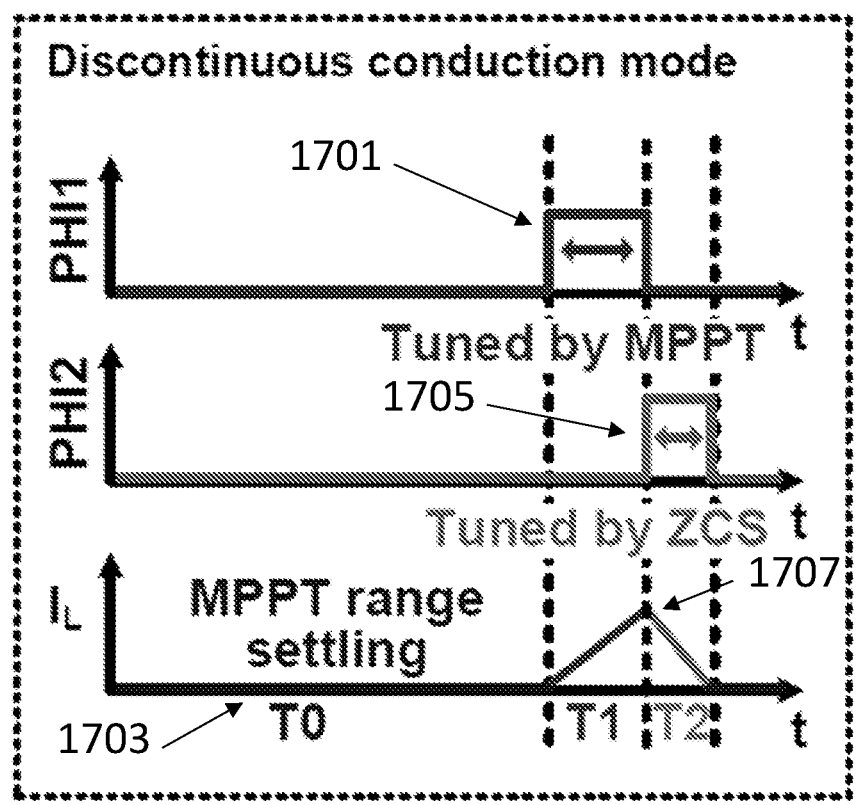

In operation, the pulse generation module 1303 is arranged to output a signal PHI1 to both the ALS 1309 and switch drivers 1307 and the pulse width controller 1305 to output signal PHI2 to the switch drivers 1307 for control of the switch matrix 1301 and resulting in charging and discharging of the inductor 1319 according to switch 1311, 1313, 1315, 1317 configuration. FIG. 13b shows a schematic representation of the expected PHI1, PHI2 signals and resulting current $I_L$ across the inductor 1319. PHI1 includes a pulse 1701 of duration T1 following a MPPT range settling period, or equivalently discontinuous mode (DCM) time 1703 of the converter 309, T0. PHI2 includes a pulse 1705 of duration T2 which occurs after T1. T1 and T2 correspond to the inductor 1319 charging and discharging time, respectively, as can be seen from the peak 1707 in the current $I_L$.

The configurations of the tuneable delay modules 1321 to 1325 are controlled by modules 1325, 1329, 1331 in the pulse width controller 1305, specifically Maximum Power Point Tracking (MPPT) module 1329, which controls the configuration of the tuneable T1 delay module 1325; the Zero Current Switching (ZCS) module 1331 which controls the configuration of the tuneable T2 delay module 1323, and the mode selector (MODE SEL) 1333 which controls the configuration of the tuneable T0 delay module 1321, and thereby the operating mode of the receiver 201, as will become apparent from the below.

Figure 14:
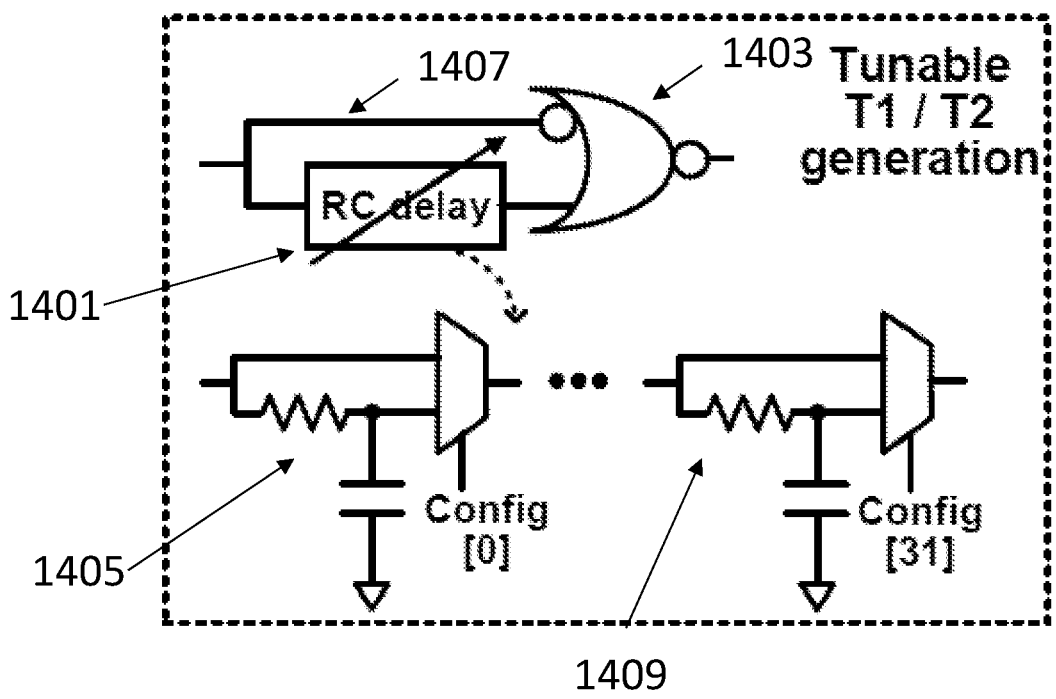

FIG. 14 schematically illustrates the T1 and T2 delay modules 1325 and 1323, respectively of the pulse generation module 1303. The modules 1325, 1323 each comprise a tuneable RC delay line 1401 in parallel with a direct connection 1407 providing inputs to NOR gate 1403 with the input from direct connection 1407 inverted. Tuning of the RC delay line 1401 enables 32 configurations ([0] to [31]) of T1/T2 to be obtained, with exemplary configuration [0] 1405 and configuration 1409 shown in FIG. 14.

Figure 15:
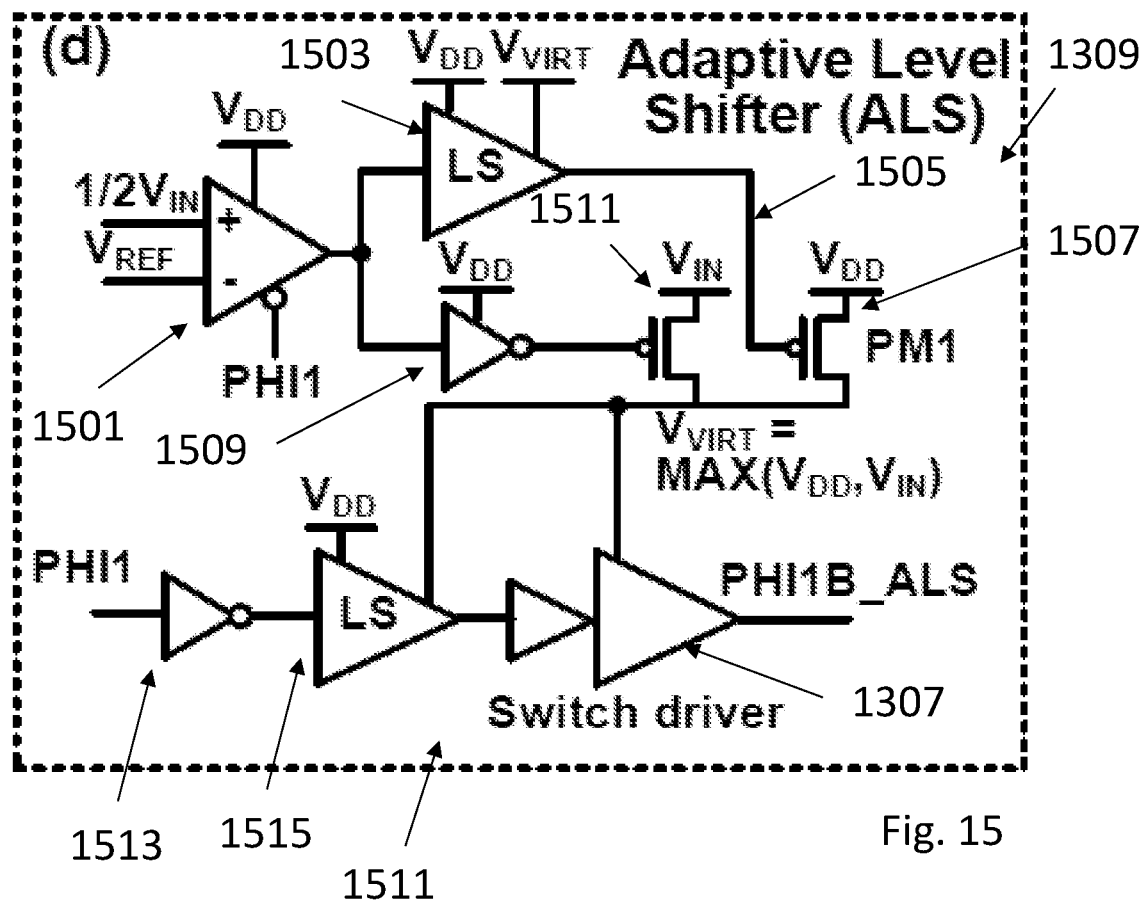
FIG. 15 schematically illustrates the Adaptive level shifter (ALS) 1309 of the Dual Mode Buck-Boost Converter (DM-BCC) of FIG. 13b.

FIG. 15 schematically illustrates the Adaptive level shifter (ALS) 1309 in combination with one of the plurality of switch drivers 1307.

The ALS 1309 comprises a dynamic comparator 1501 which compares half $V_{IN}$, the input voltage of the converter 309, against a reference voltage $V_{REF}$ with $V_{DD}$ as its supply and PHI1 as the clock. The dynamic comparator 1501 outputs to a level shifter 1503 and a NOT gate 1509 which are arranged in parallel. The level shifter 1503 has $V_{DD}$ and $V_{VIRT}$ as the low and high supplies, and the output 1505 of the level shifter 1503 is applied as a gate voltage to p-well transistor 1507 with supply voltage $V_{DD}$. The NOT gate 1509 has $V_{DD}$ as the supply and its output signal is applied as gate voltage to p-well transistor 1511, with supply voltage $V_{IN}$.

The generation of the gate control signal PHI1B_ALS has a NOT gate 1513 taking the PHI1 signal as input, a level shifter 1515 and the switch driver 1307 giving output PHI1B_ALS which is the gating signal of switch 1311 of the switch matrix 1301. Both level shifter 1515 and switch driver 1307 take the maximum $V_{VIRT}$ of $V_{DD}$ and $V_{IN}$ as the supply, $V_{VIRT}$ being determined by ALS 1309. Level shifter 1515 also takes $V_{DD}$ as a lower supply.

In operation, the dynamic comparator 1501 triggered by the PHI1 falling edge compares half $V_{IN}$ against a reference voltage 1.1 V. $V_{VIRT}$ takes on the higher potential between $V_{IN}$ and $V_{DD}$, and is used as the supply PHI1 generation. The level-shifter 1503 turns off the header 1507 when $V_{VIRT}$ is higher than the threshold voltage. Several start-up techniques are known in the art (see, for example, L. Lin, S. Jain and M. Alioto, "A 595 pW 14pJ/Cycle microcontroller with dual-mode standard cells and self-startup for battery-indifferent distributed sensing," IEEE International Solid-State Circuits Conference (ISSCC) Dig. Tech. Papers, vol. 61, pp. 44-46, February 2018).

Figure 16:
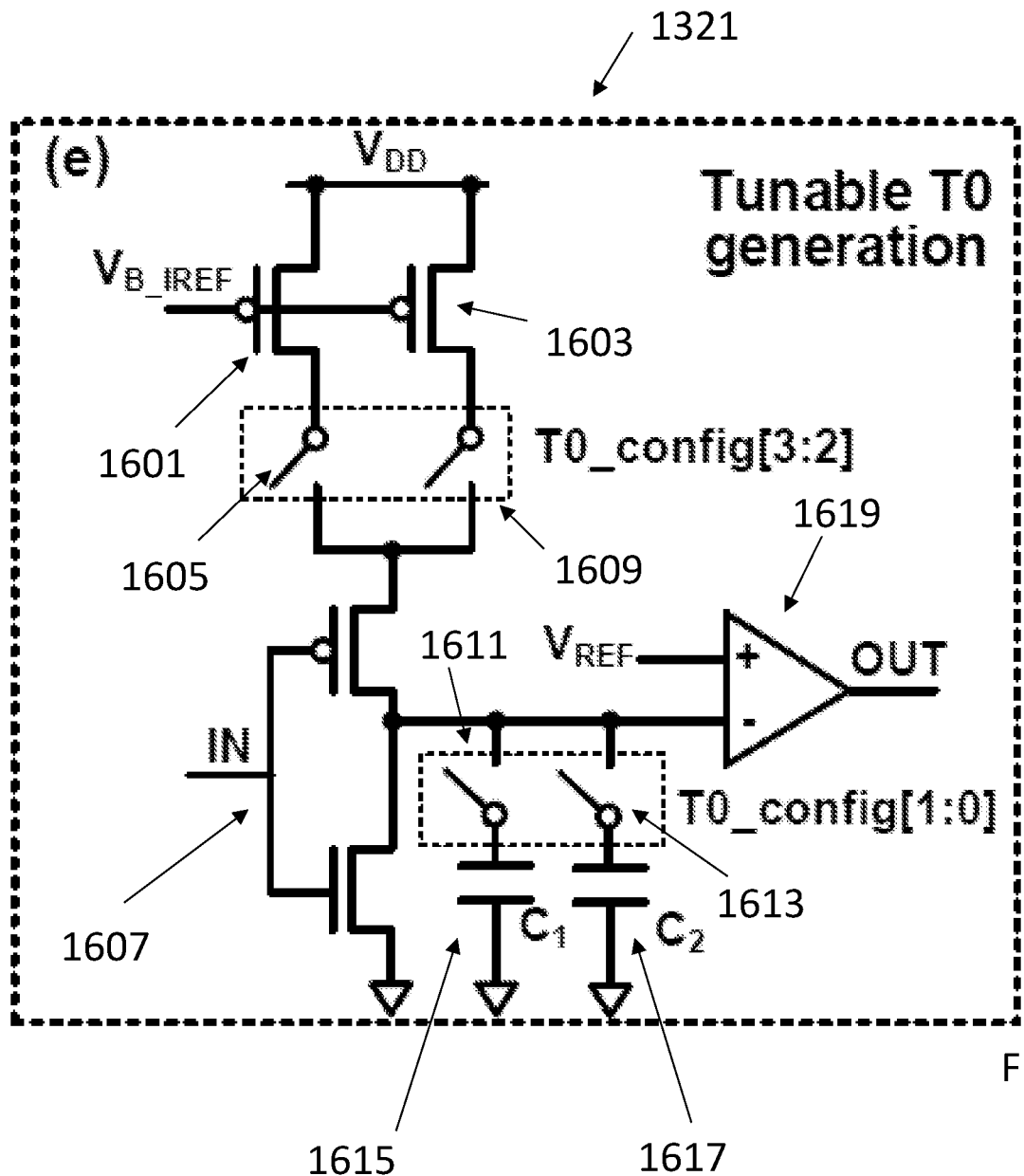
FIG. 16 schematically illustrates the T0 delay module of the Dual Mode Buck-Boost Converter (DM-BCC) of FIG. 13b.

FIG. 16 schematically illustrates the tuneable T0 delay module 1321. The module 1321 comprises a CMOS inverter 1607 (having n-well transistor and p-well transistors connected in series) connected to $V_{DD}$ via a circuit comprising a pair of p-well transistors 1601 and 1603 connected in parallel via respective switches 1605 and 1609 and both gated by $V_{B\_IREF}$, which is 0.6V in the preferred embodiment. The output of the CMOS inverter 1607 is connected to static comparator 1619 which compares it with reference voltage $V_{REF}$.

The output of the CMOS inverter is also connected to parallel capacitors 1615, 1617 via switches 1611 and 1613, respectively.

In operation, the four switches 1605, 1609, 1611 and 1613 enable four configurations of the T0 delay module 1321 (configurations 1 to 4) and thereby four selectable values of T0 1703. Selection of T0 1703 is made according to the operation mode of the converter 309 (i.e. power harvesting or power transmission) and input power in each mode, the converter 309 input power $P_{IN}$ being lower for harvested energy than for transmitted energy and therefore requiring larger T0 1703 for efficient conversion. In other words, the mode (i.e. power harvesting or transmission) determines T0 first (the initial four configurations are narrowed to two configurations). Then depending on the input power in each mode, a final T0 is chosen.

This T0 1703 is utilized for the converter 309 impedance to settle down fast to the mean Maximum Power Point (MPP), after which the impedance monitor loop (using T2 as the feedback) adjusts T1 dynamically to fine-tune the MPP, with the step size of 12 ns and 32 steps in total in this preferred embodiment.

The effect of T0 1703 and T1 on the converter 309 impedance is expressed by:

$$Z_{DM\_BC} = 2L \cdot T_{SW}/T1 \approx 2L \cdot T0/T1 \quad (1)$$

where L is the inductance and $T_{SW}$ is the switching period. T0 1703 dominates the $T_{SW}$ by being larger than T1 and T2 by ~7-4000× in this preferred embodiment, and thus the approximation above. The relationship between $P_{IN}$ and T2 for the buck-boost converter 309 is given by $$P_{IN} = V_{IN} \cdot \overline{I_{IN}} = \left(\frac{V_{OUT} \cdot T2}{T1}\right) \cdot \left(\frac{V_{IN} \cdot T1}{2L \cdot T_{SW}}\right) \approx \frac{T2 \cdot V_{IN} \cdot V_{OUT}}{2L \cdot T0} \quad (2)$$

Therefore, T2 is positively proportional to $P_{IN}$. Employing the assumption that $V_{IN}$ varies slower than 20 ms (10 $T_{SW\_MAX}$), with $V_{OUT}$ and L fixed, and T0 1703 maintained the same for each configuration, T2 then serves as the indicator of the $P_{IN}$ level to guide the T1 adjustment direction for MPP fine-tuning.

The converter 309 operates asynchronously to suppress quiescent current. The pulse generation involving T0 1703, T1, and T2 self oscillates, as long as $V_{OUT}$ drops below the threshold voltage, for example 1.1 V (with $\overline{EN}$ 1335 held to 0, which is decided by a dynamic comparator triggered by the PHI1 falling edge) which indicates the need of power delivery to the load. The maximum conversion frequency $f_{SW}$ is 1/(T0+T1+T2), where T0 1703 dominates. The conversion frequency is adaptively reduced under lighter loading conditions, with the pulse generation halted upon $V_{OUT}$ charged over the threshold voltage 1.1 V. T1 and T2 are generated by tuneable RC delay lines 1401. While the duration of T1 is determined by the MPPT module 1329, the T2 duration is decided by the zero current switching (ZCS) module 1331 (see L. Lin, S. Jain and M. Alioto, "Integrated Power Management for Battery-Indifferent Systems With Ultra-Wide Adaptation Down to nW," IEEE Journal of Solid-State Circuits, vol. 55, no. 4, pp. 967-976, April 2020 and D. El-Damak and A. P. Chandrakasan, "A 10 nW-1 μW Power Management IC With Integrated Battery Management and Self-Startup for Energy Harvesting Applications," IEEE Journal of Solid-State Circuits, vol. 51, no. 4, pp. 943-954, April 2016 for a description of ZCS). T0 1703 is generated by the tuneable charging of capacitors 1615 and 1617 by a leakage-based current reference. The Adaptive Level Shifter (ALS) 1309 is employed so that PM1 can be fully turned off when $V_{IN}$ is greater than the threshold voltage 1.1 V.

The dual-mode buck booster converter 309 therefore operates in the following way. First, T0 1703 is selected according to an operating mode of the converter 309 (corresponding to the mode of operation of the receiver 301) and corresponding input voltage and power; i.e. the most suitable configuration of the T0 module 1321 given the energy source (i.e. ambient or transmitted energy) and voltage is controlled by mode selector 1333. Two of the T0 1703 configurations are employed in a power harvesting operation mode of the converter 309 and two of the T0 1703 configurations are employed in a power transmission operation mode of the converter 309, i.e. there are two predetermined values of T0 1703 for each mode, with each of the two predetermined values corresponding to optimal converter 309 efficiency in different input voltage ranges.

The mode selector 1333 checks the accumulated voltage on a storage capacitor at the converter 309 input, determining periodically if there is transmitted power (indicated by the input voltage). If transmitted power is available, it remains in the transmission mode, otherwise it scavenges power by switching to the harvesting mode. The mode selector 1333 further compares the input voltage of the converter 309 with a pre-defined voltage reference in order to determine which value of T0 1703 to employ for the given mode.

Figures 17A, 17B:
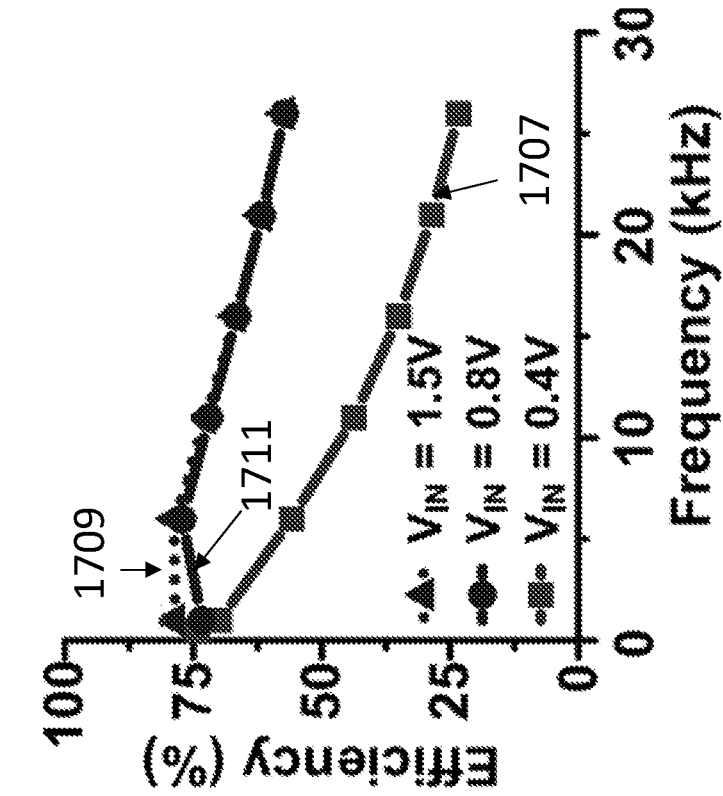
FIGS. 17a and 17b show the effect of the configurations of the T0 delay module of FIG. 16 on conversion efficiency in the power transfer and harvesting modes, respectively.

FIGS. 17a and 17b illustrate the efficiency of the converter 309 according to the preferred embodiment as a function of switching frequency $f_{SW}$, with FIG. 17a showing power transmission and FIG. 17b showing power harvesting. In FIG. 17a, 1701 indicates 1V input voltage, 1703 indicates 0.7V, 1705 indicates 0.5V and 1707 indicates 0.3V. In FIG. 17b, 1709 indicates 1.5V, 1711 indicates 0.8V and 1713 indicates 0.4V. FIGS. 17a and 17b show that the optimal switching frequency $f_{SW}$ increases under higher input voltage, and vice versa. This is because at the rectifier 307 load (converter 309 input impedance $Z_{DM\_BBC}$), the optimal impedance decreases at higher input voltage (due to higher $I_{on}$ and lower rectifier 307 impedance). This then leads to higher current into the converter 309 and thus higher conduction loss.

Based on the measurements shown in FIGS. 17a and 17b, the T0 1703 value corresponding to the switching $f_{SW}$ (assuming $f_{SW}=1/T0$) closest to the optimal switching frequency for the particular operation mode of the converter 309 (transmission or harvesting) and input voltage to be received is selected. In practice, this means that T0 1703 configurations 1 and 2 are therefore selected in the power transmission operation mode, with configuration 1 being employed at input voltages greater than 0.55V and configuration 2 being employed at voltages less than or equal to 0.55V. Configuration 1 corresponds to switches 1605, 1609 and 1611 being set to closed and 1613 to open, while configuration 2 corresponds to all four switches 1605, 1609, 1611, 1613 closed. These two configurations give rise to switching frequencies of 280 kHz (configuration 1) and 15 kHz (configuration 2), respectively, calculated assuming $f_{SW}\sim1/T0$.

In contrast, T0 configurations 3 and 4 are selected in the energy harvesting operation mode, with configuration 3 being employed at input voltages greater than 0.55V and configuration 4 being employed at voltages less than or equal to 0.55V. Configuration 3 corresponds to switches 1605 & 1611 being set to closed with the other switches open, while configuration 4 switches 1605, 1611 & 1613 closed. These two configurations give rise to switching frequencies of 6 kHz (configuration 3) and 500 Hz (configuration 4), respectively, calculated assuming $f_{SW}\sim1/T0$.

Following T0 1703 selection, the inductor 1319 charging time T1 which corresponds to the maximum input voltage to the DC-DC converter 309 is determined according to equation (1) within the range 100-480 ns, enabling the target $Z_{DM\_BBC}$ span to be covered. The switch sizing is also optimized by balancing the switching and conduction loss, with larger switches lead to higher switching loss but lower conduction loss, and vice versa.

Figure 17C:
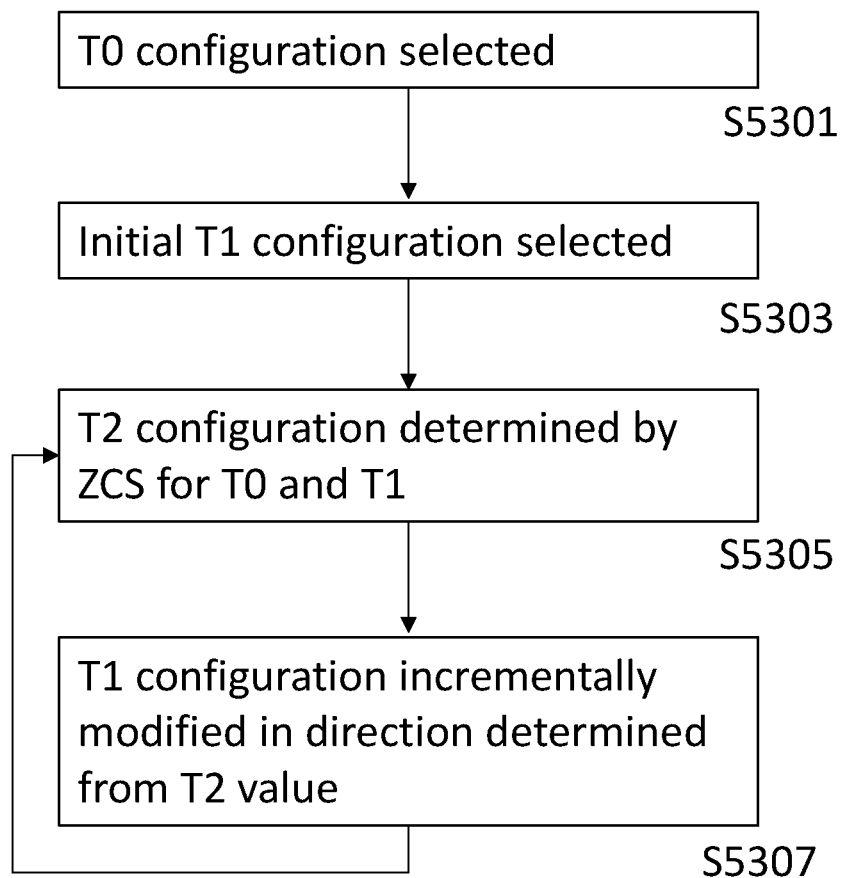
FIG. 17c shows an outline of the method of the tuning of T1 and T2 of the Dual Mode Buck-Boost Converter (DM-BCC) of FIG. 13b.

FIG. 17c shows an outline of the method of determining T1 and T2. In step S5301, the T0 1703 configuration is selected using the mode selector 1333. In step S5303, an initial T1 configuration is selected. In S5305, the ZCS configuration of T2 is determined given the selected T0 1703 configuration and the T1 configuration. In S5307, the T1 configuration is altered to an adjacent configuration. The direction of adjustment of the T1 configuration is determined by the trend of change in the value of the inductor discharging time (T2) which represents the input power trend of change, as will be described below. The method then returns to step S5305.

Figure 17D:
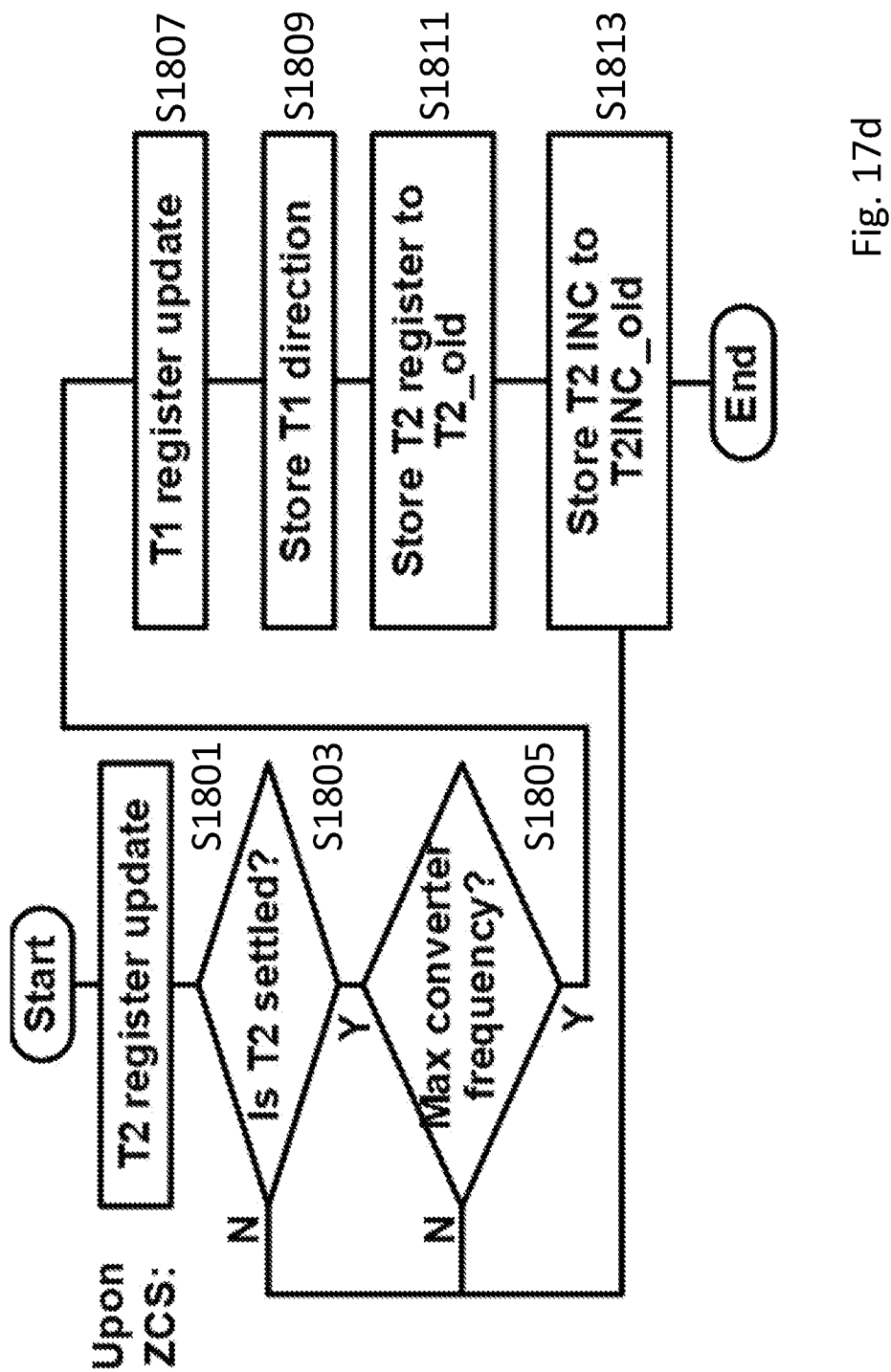

FIG. 17d illustrates the method of asynchronous MPPT performed to determine T1, i.e. the method performed in step S5307 of FIG. 17c. Upon T2 being updated by ZCS in step S5305, the T2 register is updated in S1801 and the completion status of T2 adjustment under a given T1 is determined in S1803. If the T2 is settled, in step S1805 it is determined if the converter 309 is operating at the maximum frequency $f_{SW}$. If both of these requirements are met, in step S1807 the T1 register is updated, i.e. it is shifted by one bit in the direction determined in S5307, and in step S1809, the currently settled T2 is compared with the stored value and the T1 increment/decrement direction is determined and stored. If the T2 settled value is larger than the earlier settled value, T1 is incrementally adjusted in the same direction as in the previous adjustment. Otherwise, T1 adjusted in the opposite direction. At the very start of the process, T1 is incrementally increased, introducing perturbation for T2 change, which then affects the T1 direction later on. In step S1811 the current T2 value is stored, and in step S1813, the ZCS decision is stored, i.e. the incremental change in T2. After the method of FIG. 18 has been performed, a cycle check is performed and 'T2 unsettled' is assumed at the following cycle, should this be the first T2 value under the newly changed T1. At the steady state, the T1 configuration will oscillate in between two adjacent values which are upper and lower boundaries of the optimal value (yielding maximum power).

As explained above, the apparatus 100 according to the preferred embodiment has two modes of operation: 1) a power transfer receiving mode, as shown schematically in FIGS. 2a, and 2) a power harvesting mode, as shown schematically in FIG. 2b.

By default, the apparatus 100 operates in the power transmission operation mode. In this mode, the transmitter 201 is switched on and power is generated at the DCO and driver 207, with dynamic impedance matching, equivalently impedance adjustment, performed by the dynamic impedance matcher 209 prior to transmission via the body 105 via electrode 200. In the receiver 301, switch 811 is set to the closed position (see FIG. 8), so that the DIB 3015 is connected and impedance boosting, equivalently impedance adjustment is performed at the receiver 301 front-end in order to help maximise the power of the electromagnetic signal received from the transmitter 201 via electrode 300. The converter 309 operates in its power transmission operation mode and the mode selector 1333 sends a control signal to the T0 delay module 1321 to switch its configuration to configuration 1 or 2. The receiver 301 recovers the DC power of the impedance boosted signal via rectification using the BAR 307 and voltage conversion using Dual-Mode Buck-Boost Converter 309 as described above and supplies it to wearable applications or accumulates it at a storage capacitor.

The accumulated voltage on a storage capacitor at the converter 309 input is monitored periodically and, if no transmitted power (as indicated by the voltage) is detected, then mode switching is determined and the apparatus 100 switches to power harvesting mode, i.e. mode switching occurs in dependence on a power level of the received electrical signal.

In this mode, in the receiver 301, switch 811 is set to the open position (see FIG. 8), so that the DIB 3015 is disconnected as impedance boosting is not required in this mode. The converter 309 operates in its power harvesting operation mode and the T0 delay module 1321 is set to configuration 3 or 4 as controlled by mode selector 1333, the only electromagnetic (EM) field present in the body is due to the coupling of the ambient electromagnetic waves present in the environment due to ambient sources 101. The receiver 301 picks up the EM field via electrodes 300 at its input and recovers the DC power via the BAR 307 and Dual-Mode Buck-Boost Converter 309 as described above and supply it to wearable applications in which the receiver 301 is integrated or in connection with or, alternatively, the DC power is accumulated.

It follows that apparatus 100 according to the preferred embodiment may utilize human body-coupling to deliver power efficiently to the entire body 105, while at the same time be capable of efficient harvesting energy from ambient EM waves without the need of a bulky antenna or being susceptible to the body shadowing effect. As experimental results discussed below show, the performance of apparatus 100 according to the preferred embodiment may ensure energy transfer independent of the network scale (i.e. the number of receivers 301) and enable flexible electrode 300 sizing and electrode 300 location without compromising on energy transfer efficiency.

Thus, the preferred embodiment may efficiently address the issue of the powering up of wearables. Using the preferred embodiment, one may be able to power up all the wearables around the body 105 through 1) a single battery source (such as smart phone) transmitting energy through the body 105 (body-coupled active energy transfer), or 2) ambient energy harvested through the body 105 (passive energy harvesting). The ambient energy generated from many ambient sources 101 such as electric devices and their power lines may be coupled with the human body 105. This coupled energy may deliver to multiple power receivers 301, and each power receiver 301 may save the energy. In the case of insufficient ambient energy, an active power transmitter 201 may transmit body-coupled energy to the power receiver 301.

The apparatus 100, may enable powering of multiple wearable or implantable devices by charging only a single device, such as a smartphone, and delivering power to the wearables using that single device; individual charging of all of the wearables is not required. Further, by switching to harvesting mode the battery lifetime of the devices may be extended even when the batteries of the power transmitting device have been depleted.

Apparatus 100 according to the preferred embodiment may therefore enable the battery lifetime or help to sustain the fully autonomous operation of wearable sensing technology or other devices. A number of features of the preferred embodiment may contribute to the usefulness of apparatus 100 according to this embodiment. These will now be discussed in detail.

Firstly, dynamic impedance matching by the dynamic impedance matcher 209 at the TX 201 output using dynamic impedance boosting may enable the apparatus 100 to maintain optimal power transmission amidst varying environmental impedance variations at the TX 201 output interface and therefore help to ensure robustness of the power transmission in light of environmental changes. TX 201 output interface consists of two nodes-ground node 2051 (forming the return path with a parasitic capacitance against the Earth ground), and the signal output node (electrode 201) forming the forward conduction path with skin-electrode parasitic capacitance and body channel capacitive coupling. The impedance matching according to the preferred embodiment is introduced at the signal node with ground node 2051 floating. Therefore, it may account for the overall effect of all parasitic coupling at both the ground node 2051 and the signal node (electrode 201), and may therefore improve the reflection coefficient and thus power transfer efficiency.

Figure 18:
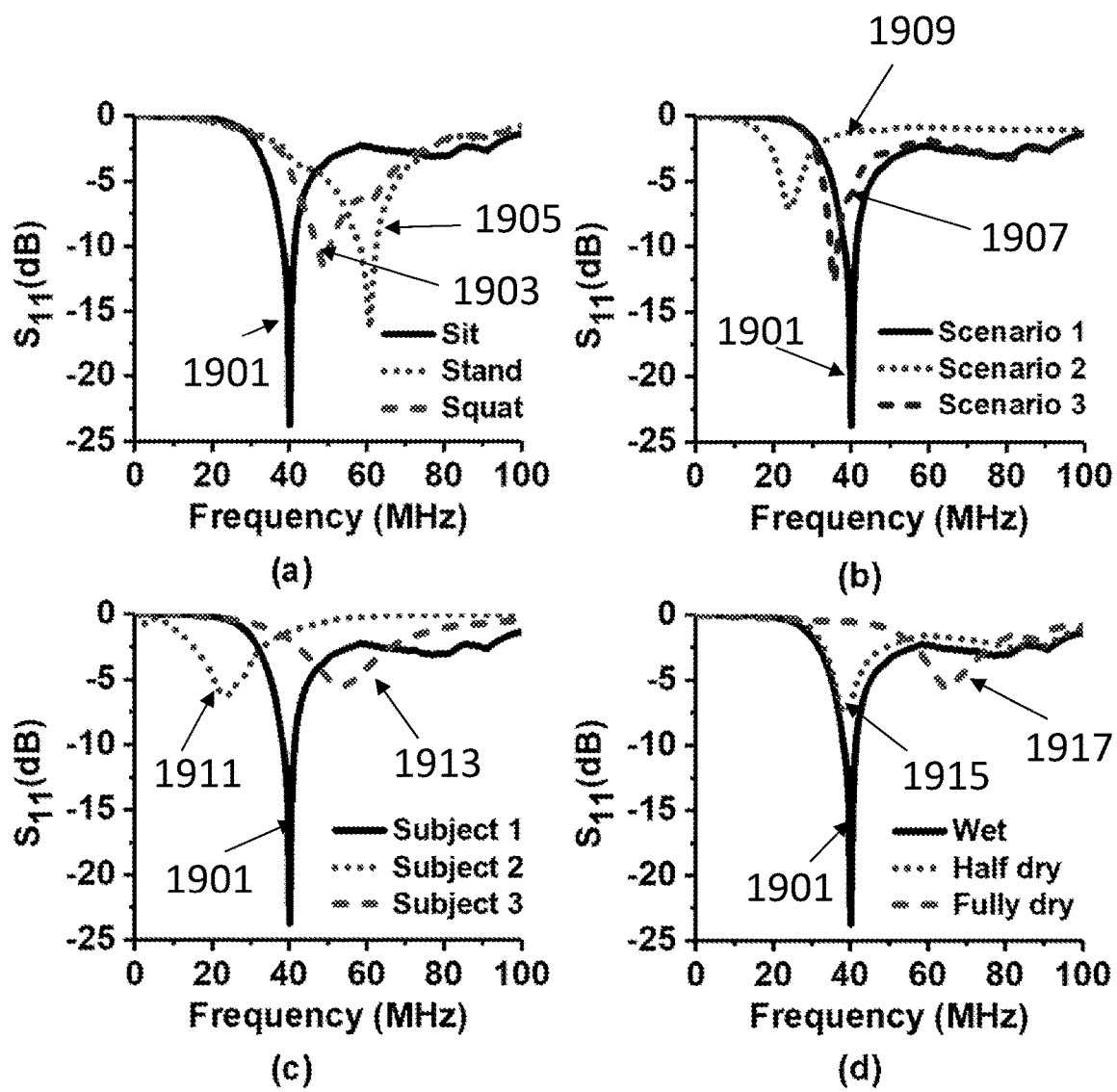
FIG. 18 shows a change of S11 of a body coupled transmitter with fixed impedance matching according to environment.

As discussed above, the TX 201 output interface is unconventional, with the load impedance contributed by the skin-electrode 300 contact and the human body 301 path impedance in its forward transmission direction, as well as the ground plane-Earth ground parasitic capacitance 203, 303 in its return path. Thus, the S11 parameter of the transmitter 201 will vary due to the impedance variations induced by posture, environment, individual and electrode 300 contact changes. This is illustrated in FIG. 18 which illustrates the impedance variation according to environmental conditions. Line 1901 is the S11 parameter of −23 dB achieved by L-C impedance matching at the transmission frequency of 40 MHZ, on subject in a sitting position wearing a wet electrode. In contrast, line 1903 shows S11 for the same subject in a squatting position and line 1905 in a standing position, lines 1907,1909 show S11 for two different environmental scenarios, lines 1911,1913 for two different subjects, and lines 1915,1917 for half dry and fully dry electrodes, respectively (without rematching of the impedance). As can be seen from FIG. 18, due to the impedance variations induced by posture, environment, individual and electrode 300 contact changes, the S11 behaviour is changed and is observed to degrade by up to 20 dB at 40 MHz. Considering the TX 201-body 105/environment as a two-port network, with the output interface (incorporating both the forward transmission path and the return path impedance) measured as a whole, the resistive component is expected to range from 2 kΩ to 30 kΩ, and the capacitive component from 0.1 pF to 7 pF, as shown by area 503 in FIG. 5.

By employing dynamic impedance matching according to the preferred embodiment, apparatus 100 according to the preferred embodiment may enable S11 and therefore power to be enhanced for all environmental conditions. As can be seen in FIG. 5, the impedance range achievable by apparatus 100 according to the preferred embodiment, indicated by area 501, encompasses all of the expected impedance variation due to environmental conditions, indicated by area 503.

Measurements of power recovery using apparatus 100 according to the preferred embodiment were performed on the human body, with wet electrodes 200, 300 (Red dot, 3M Ag/AgCl, 2237) used as the interface to couple the electric field onto and from the skin surface. The TX IC 2015 and the RX IC 305 were fabricated using 40 nm CMOS technology, with the TX IC 2015 occupying 0.21 mm$^2$ and the RX IC 305 0.29 mm$^2$. Off-chip components required for the design include the inductor 3050 used for TX 201 impedance matching, the L-C tank (1.2 pH, 6.8 pF) for DIB 3015 at the RX 301 front-end, and the converter inductor 1319 (47 pH). The TX 201 was battery powered, and a USB-powered picoscope was employed to avoid additional return path coupling induced by equipment. Both the TX 201 and RX 301 PCB were 4×4×1 cm3.

Figure 19:
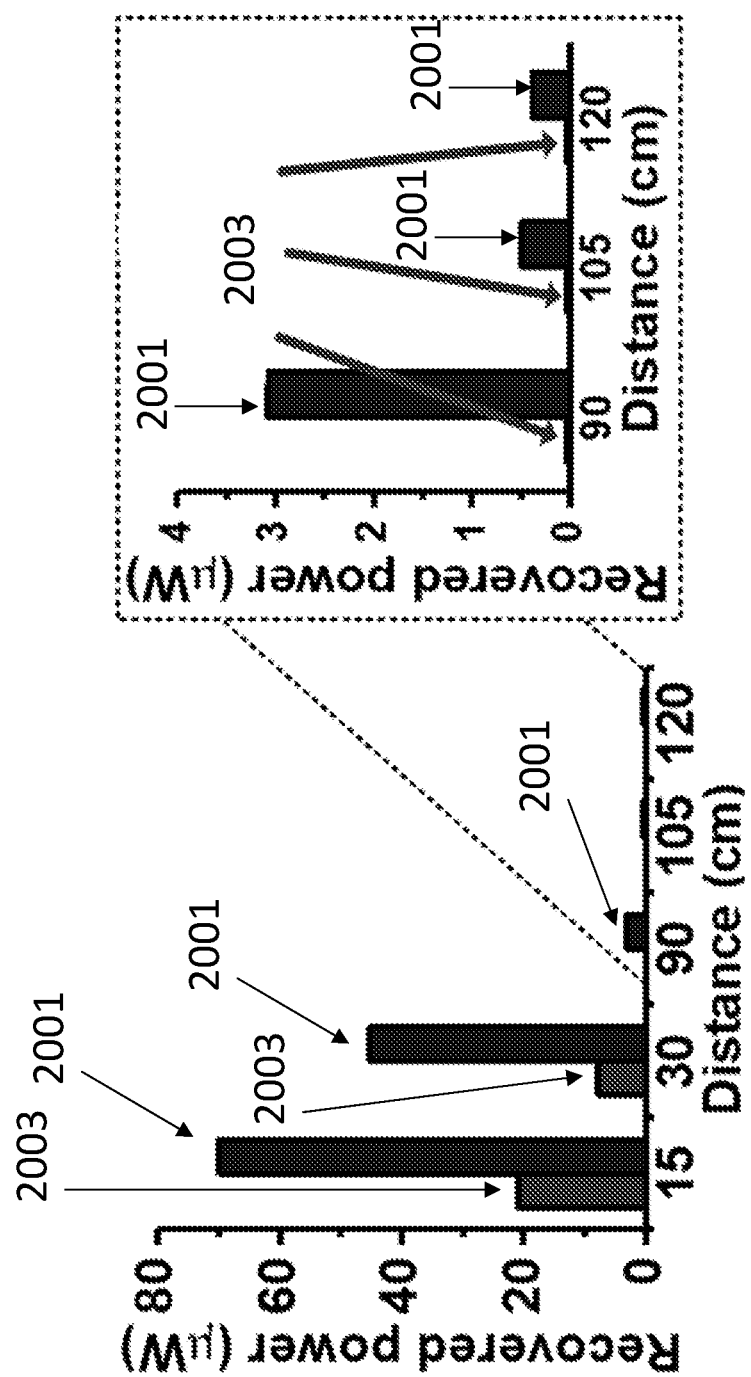
FIG. 19 shows power recovery as a function of distance with and without dynamic impedance matching as performed by the transmitter of FIG. 4.

FIG. 19 shows the recovered powered with dynamic impedance matching at the transmitter 201 (shown by 2001) and without dynamic impedance matching at the transmitter 201 (shown by 2003) over a range of distances. The inset shows an expanded view for the measurements at larger distances. As can be seen from FIG. 19 at distances over 30 cm, no power is recovered without dynamic impedance matching at the transmitter 201 and dynamic impedance matching at the transmitter 201 enables an improvement in power recovery of more than 3 times at smaller distances. Overall, the power coverage achieved four times the range with the dynamic impedance matching at the transmitter 201 than without any impedance matching.

Additionally, the capacitor bank 2011, 2013 design of the dynamic impedance matcher 209 avoids the usage of an inductor bank, thereby facilitating on-chip integration.

By employing the Bulk Adaptation Rectifier (BAR) 307 which may enable bulk biasing of the rectifier 307 at low voltages in the receiver of the proposed embodiment, power recovery at low voltage may be improved, which in turn may further enhance power recovery over transmission at longer distances by increasing the sensitivity of the device. FIG. 20 shows results for the recovered power with input amplitude using a receiver 301 according to the preferred embodiment with the BAR 307 turned off 2005, turned on 2007 and the ratio 2009 between the two results. The ratio 2009 shows that an almost 4 times improvement was obtained at an input amplitude of 0.2V. This may enable power to be transmitted at longer distances over the body 105.

The high sensitivity potentially conferred by the BAR 307 may also enable harvesting of the low frequency ambient EM waves (<hundreds of kHz, for example the 50/60 Hz EM wave from power lines) coupled to the body which may not be possible to harvest using antenna-based approaches due to impractical antenna sizing.

The detuned impedance booster 3015 may also contribute to improved performance at longer distances by increasing the voltage received at the receiver 301 and therefore improving the rectifier 307 performance. The parasitic capacitance CRIN 303 formed by the ground plane to the Earth ground coupling completes the circuit loop and contributes positively to power recovery. Generally, below 1 pF, the CRIN 303 is the largest environmental impedance drawing away voltage and power from the RX 301 input, whereas others such as skin-electrode interface exhibits ~100 nF parallel capacitance (using a wet electrode 3M 2237) and an overall impedance of ~130Ω at 40 MHz. As shown in FIG. 9, the RX 301 input impedance 901 was measured to be ~600Ω at 40 MHz (~10 times lower than the fF-level CRIN 303), which may result in low input voltage and power observed at the RX 301 front-end. On top of possible degraded power transmission efficiency, the low input voltage may also lead to low rectification efficiency due to the threshold drop. The detuned parallel L-C booster (parallel) circuit is thus introduced for capacitive power transfer circuit, with one node floating. The RX input impedance may therefore be boosted such that higher input voltage/power may be seen at the RX 301, due to the voltage division against a small return path parasitic capacitance (which translates to large impedance).

Boosting the input impedance according to the preferred embodiment may therefore not only increase the voltage received at the RX 301, but also may enhance the impedance matching for more efficient power transmission. In addition, detuning of the L-C tank of the Impedance Booster 3015 as described above may enable impedance matching across a wider range. This may improve the robustness of the receiver 301 against capacitance variations due to environmental, individual, or setup changes.

Thus, the use of impedance matching and boosting may confer three main benefits. First, with the impedance boosted, higher voltage may be observed at the receiver 301 input due to voltage division, which enhances the power available to the receiver 301. Second, as the voltage across the rectifier 307 increases, the rectification efficiency may increase correspondingly, leading to an overall boost in the end-to-end efficiency Third, the detuned matching may allow for wider impedance tolerance, mitigating the influence of the varying interface/environmental impedance.

Figure 21A:
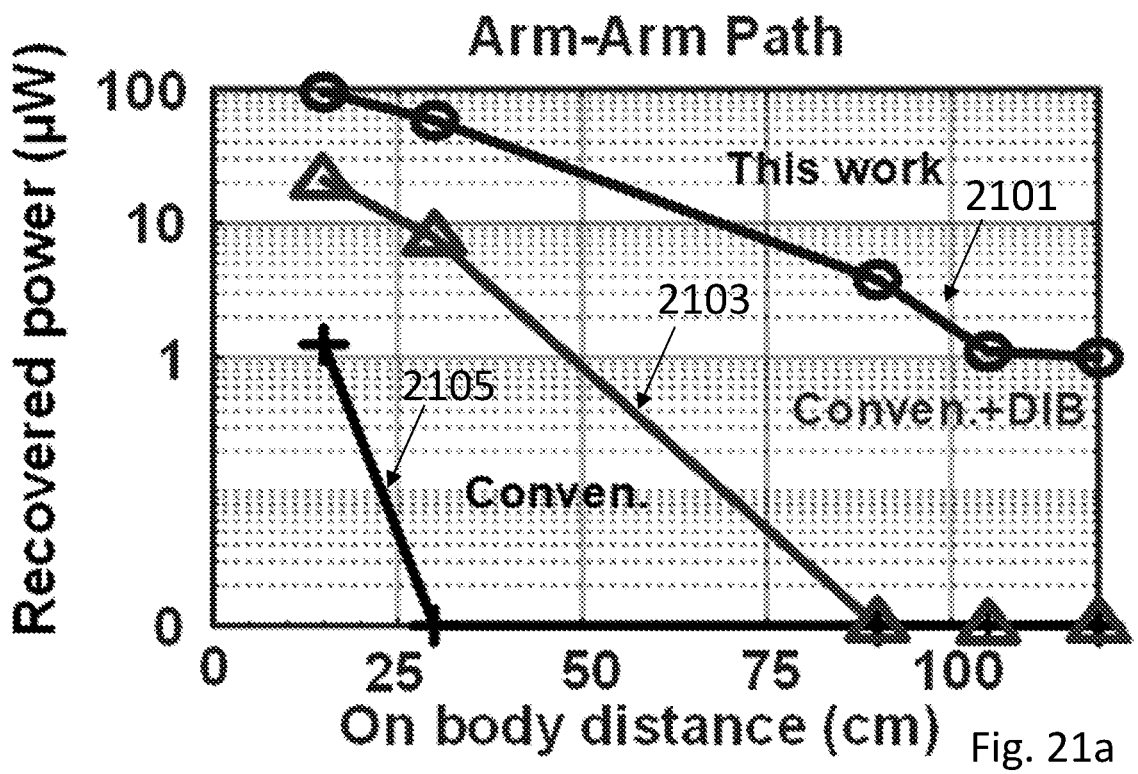
FIGS. 21a, 21b and 21c show recovered power as a function of distance for three different receivers, including the receiver according to the preferred embodiment.
Figure 21B:
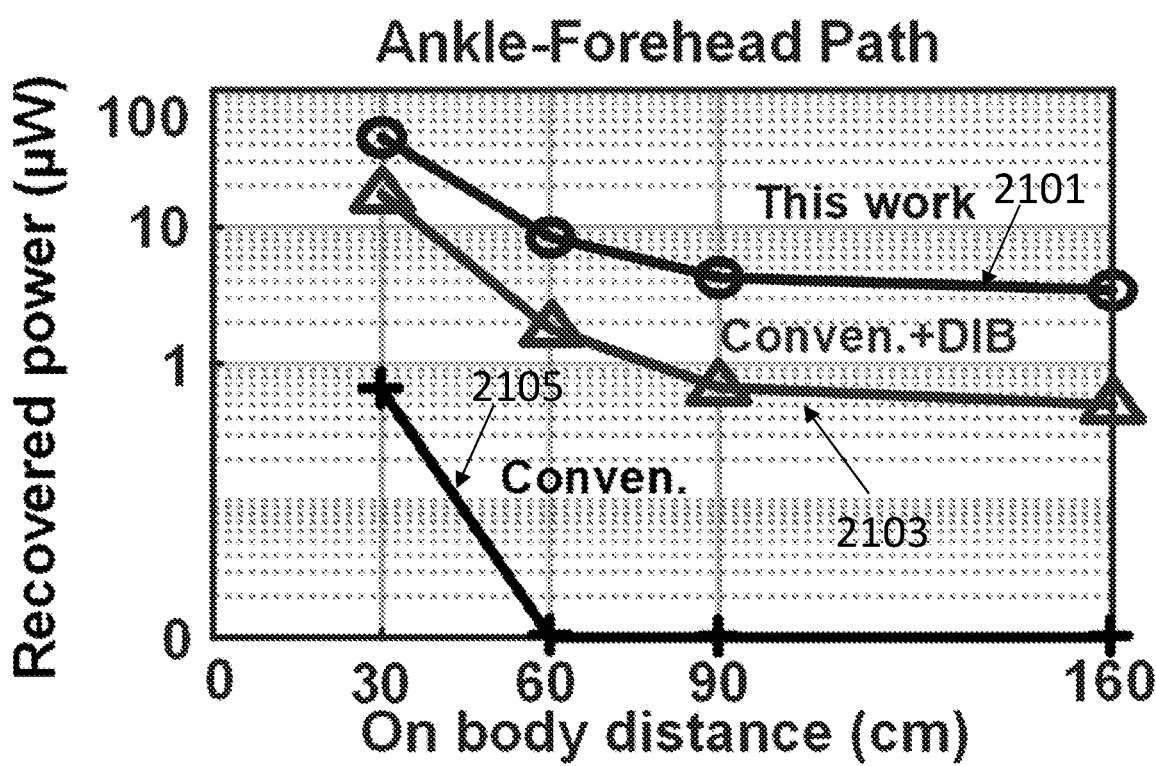
Figure 21C:
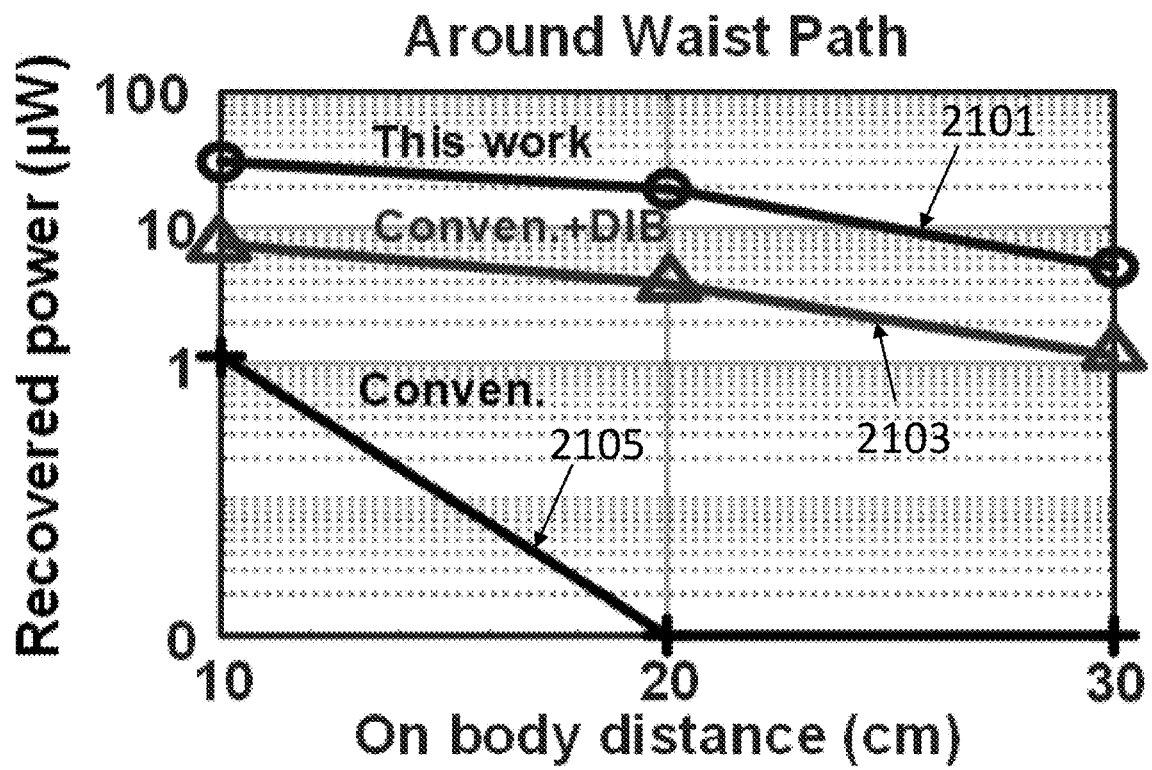

FIGS. 21*a*-21*c* show the performance of apparatus 100 according to the preferred embodiment with transmission distance to illustrate the effect of both the BAR 307 and DIB 309. FIG. 21*a* shows an arm-arm path, FIG. 21*b* shows results for an ankle-forehead path and FIG. 21*c* shows results for a path around the waist. 2101 indicates the recovered power using a receiver 301 and transmitter 201 according to the preferred embodiment (i.e. with both BAR 307 and DIB 3015). 2103 indicates the recovered power using a transmitter 301 according to the preferred embodiment with a receiver having the DIB 3015 but a conventional differential drive rectifier. 2105 indicates the recovered power using a transmitter 201 according to the preferred embodiment with a receiver having only a conventional differential drive rectifier.

In these results, both the BAR 307 and DIB 3015 were seen to extend the range of power transmission for all of the paths shown. Specifically, with the TX 201 placed on the subject's wrist outputting ~3 mW, the RX 301 power recovery at 15 cm apart along the arm was improved from 1.3 μW to 100 μW using apparatus 100 according to the preferred embodiment, as compared to the power transmission using the TX 201 and a conventional differential drive rectifier of the same size, as can be seen in FIG. 21*a*.

Meanwhile, at ~120 cm apart where the RX 201 node was placed on the other wrist, 1 pW could still be recovered, extending the coverage by 8 times. The power recovered at 30 cm was improved from 650 nW to 45.2 μW, and the coverage from 30 cm to 160 cm. The end-to-end efficiency from the TX 201 output to the RX 301 recovered power was calculated to be 3.3% at 15 cm apart and 0.03% at 160 cm apart. Along the non-line-of-sight path (non-LoS) of around the waist (FIG. 21*c*), the body-coupled approach delivered 5 μW from the front to the back of the body 105.

The variable T0 1703 (discontinuous conduction mode time) of the converter 309 may enable efficient power recovery in both power transmission receiving and power harvesting modes of the preferred embodiment without an excessive inductor 1319 charging time as will now be explained.

Figure 22:
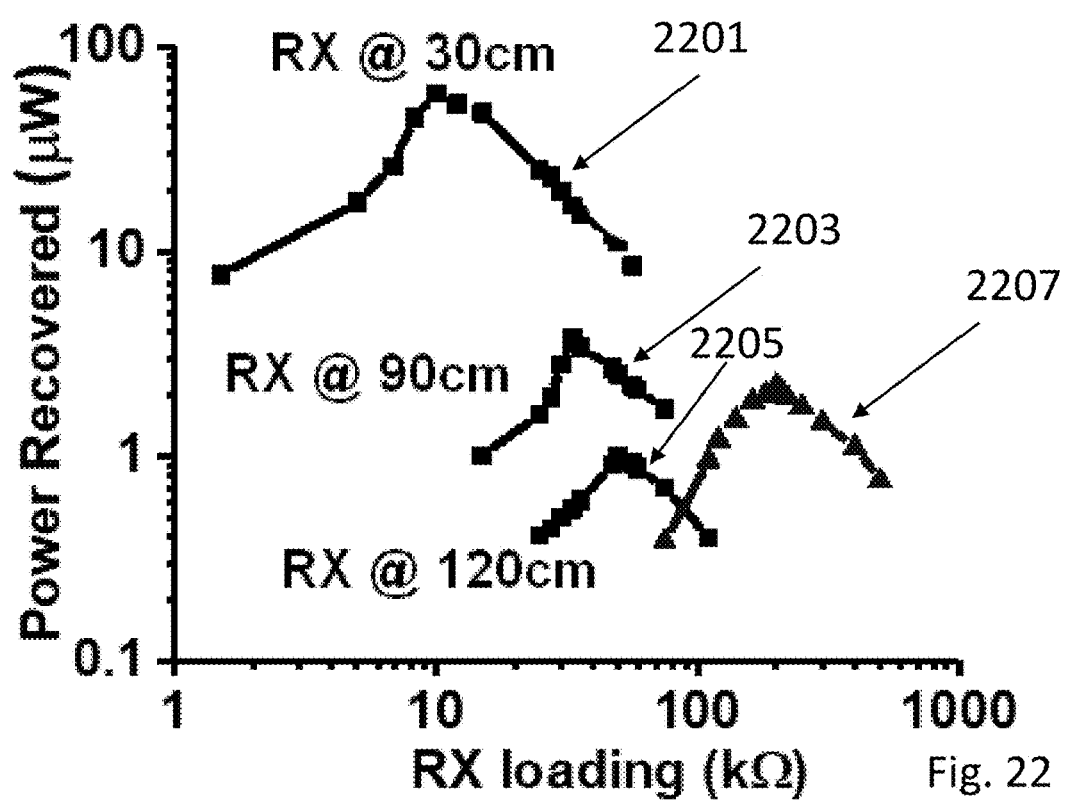
FIG. 22 shows an effect of impedance load at the receiver on power recovered in both power transmission and harvesting.

FIG. 22 illustrates the optimal RX 301 loading variations under different power transmission conditions (e.g., different on-body transmission distances) or environmental variations, measured with the rectification front-end according to the preferred embodiment, specifically transmission over 30 cm 2201, transmission over 90 cm 2203, transmission over 120 cm 2205 and harvesting 2207. For the body-coupled power transmission (2201, 2203 and 2205), the optimal load resistance was measured to range from 10 kΩ to 50 kΩ, depending on distance. For the body-coupled ambient energy harvesting (2207), the optimal resistance was observed to fall in a distinct range of around 150 kΩ to 300 kΩ.

By employing different discontinuous mode time (DCM) T0 1703 values according to how the apparatus 100 is being employed therefore, it may enable the impedance loading of the receiver 301 to accommodate and be fined-tuned for optimal power transmission over the full range of 10 kΩ to 300 kΩ required for efficient power recovery in both power transmission configurations and power harvesting configurations without an excessive increase in T1 (the inductor 1319 charging time) which may degrade the resolution and the settling time during the mode switching.

Figure 23:
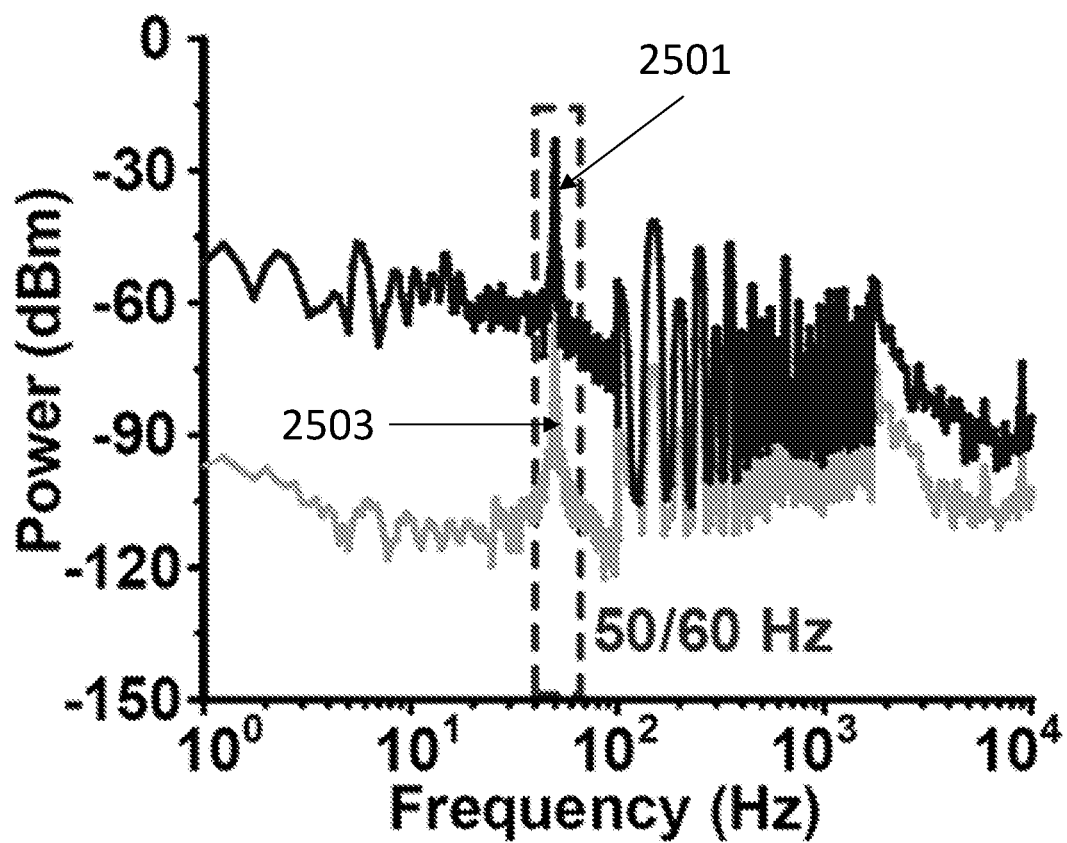
FIG. 23 shows a power spectrum of the ambient EM waves coupled on the human body and in the air.
Figure 25:
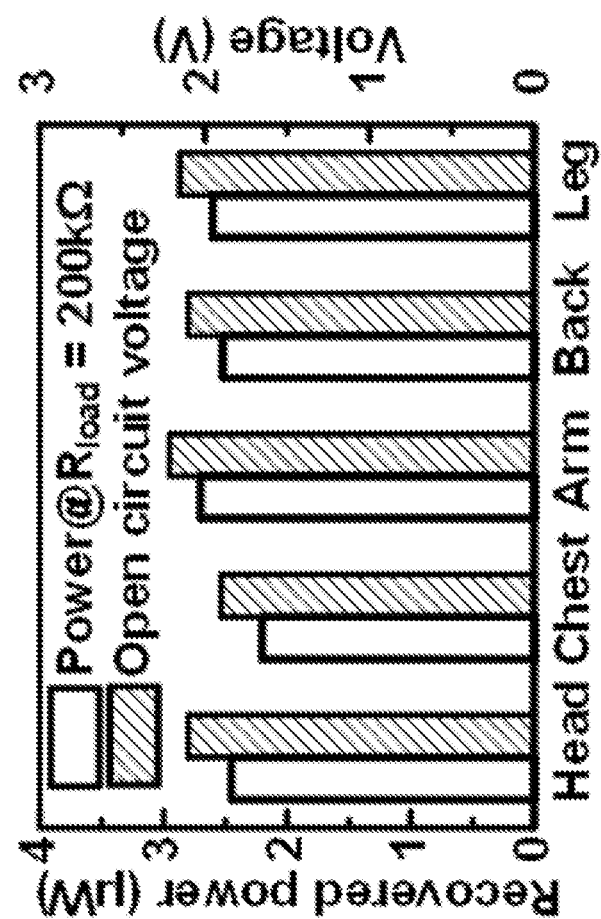
FIG. 25 shows recovered ambient power at different locations on the body using a receiver according to the preferred embodiment.
Figure 24:
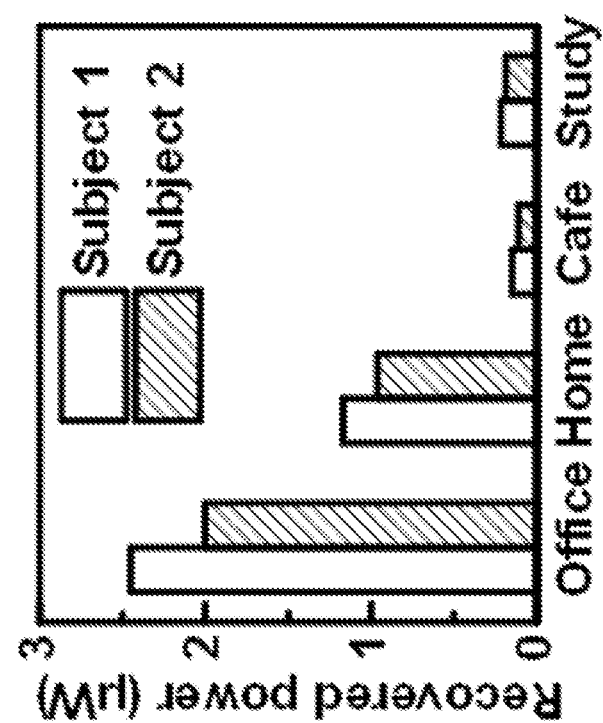
FIG. 24 shows recovered ambient power in different environments using a receiver according to the preferred embodiment.

Thus, apparatus 100 according to the preferred embodiment may further enable efficient harvesting of ambient energy by enabling the harvesting of energy via body coupling in addition to power receiving as illustrated above. As shown in FIG. 23, the low-frequency ambient EM wave (2503) is observed to couple onto the human body (2501). Indeed, up to 30 dB higher EM strength may be achieved with the body-coupling (2501), as compared to that measured in the air (2503), with the 50/60 Hz wave dominating. Using the body-coupling mechanism to harvest these body-coupled ambient EM waves in different daily environments, up to 2.5 µW was scavenged experimentally using the apparatus 100 of the preferred embodiment, as illustrated in FIG. 24 for a range of environments. FIG. 25 illustrates that the amount of power harvested is indifferent to where the RX 301 electrode 300 was placed on the human body 105 despite slight fluctuations. Thus, apparatus 100 according to the preferred embodiment may enable placement-independent energy scavenging. Thus, simultaneous energy scavenging may be performed by all wearable nodes, thereby increasing total power recovery and the number of wearable devices that may be charged simultaneously. Further the energy harvesting is performed without the use of a bulky antenna. Moreover, unlike conventional harvesters with specific placement requirements to meet, energy harvesting using apparatus 100 according to the preferred embodiment is applicable across the human body 105 regardless of clothing coverage or body blockage.

Figures 26, 27:
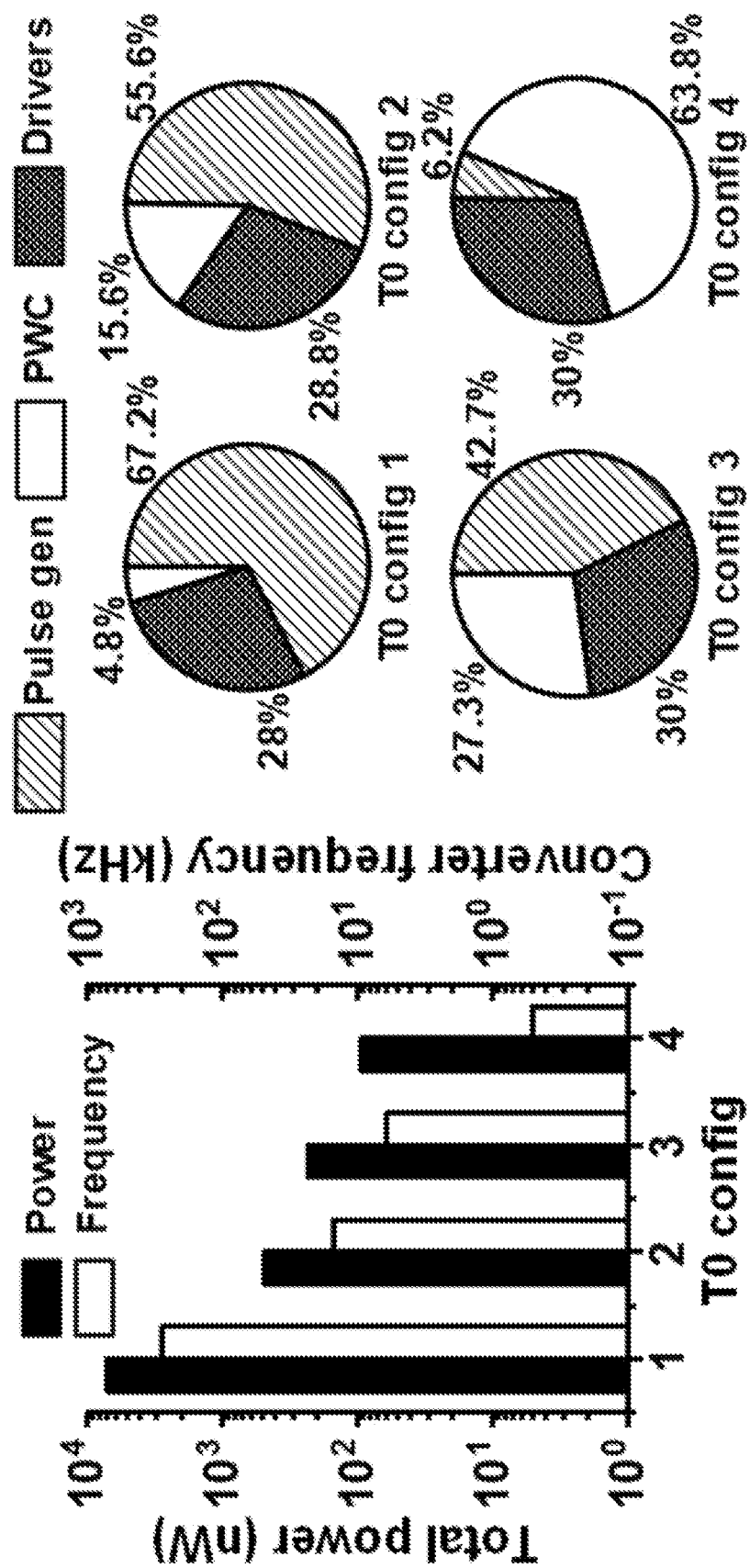
FIG. 26 shows a power consumption of an example converter as shown in FIG. 13a at different T0 configurations.
FIG. 27 shows a power consumption breakdown of an example converter as shown in FIG. 13a at different T0 configurations.

The power consumption of the converter 309 is shown in FIG. 26 with the breakdown of the converter 309 power consumption illustrated in FIG. 27. As T0 1703 increases at lower input power, the total power consumption is measured to be 7.14 pW, 486 nW, 234 nW, and 94 nW under the 4 T0 1703 configurations of the preferred embodiment, respectively. The reduction is contributed by both decreased switching activities, and the lower bias current for continuous-time comparators due to higher delay tolerance at larger T0 1703. The percentage of pulse width controller (PWC) power takes the dominance as its active power gradually approaches its quiescent power of ~60 nW, whereas the driver 2072 and pulse generation power still see a decrease (with a quiescent power of 17 nW). As compared to the recovered power range of >30 µW and 800 nW-30 µW for power transmission, and >1 µW and 130 nW-1 µW for the harvesting, the converter 309 may therefore also enable conversion with affordable power consumption.

Thus, apparatus 100 according to the preferred embodiment may offer power sustainability at all body locations and enable an interconnected body area powering platform which could support reliable and self-sustained wireless body area electronics.

The preferred embodiment should not be construed as limitative. For example, the signal generator (DCO) 2071 may generate a differently shaped wave or a wave of different frequency, instead of a 40 MHz square wave, in particular a wave in the range 30 MHz to 80 MHz, which is outside of the quasi-static field and may exhibit the low path loss and thereby enable delivery and recovery of power across the entire human body. The driver 2072 may have an output impedance other than 50Ω. The dual mode buck-boost converter 309 may regulate the output voltage to a voltage other than 1.1V. The inductance of the inductor 803 may be different than 1.2 pH and the capacitance of the capacitor 805 may be different than 6.8 pF. The inductance of the inductor 803 and the capacitance of the capacitor 805 may be such that the RX 301 input impedance is boosted at a value other than 8 kΩ. The reference voltage for determining the operating mode of the BAR 307 may be higher or lower than 0.4V.

While it is preferred for the BAR 307 to have two modes of operation (i.e. bulk biasing mode and non-bulk biasing mode) and operable to selectively switch between the two modes depending on the amplitude of the rectified signal, it is envisaged that it is possible that the BAR 307 may be adapted to operate only in the bulk biasing mode during reception.

The bandwidth 905 of the impedance boosting may be greater or less than 2.8 MHz. In particular, the bandwidth 905 of the impedance boosting may be 20% greater or smaller than the L-C central resonant frequency. The bandwidth may be varied in accordance with the transmission frequency or the general environment return path. For example, if the general environment return path impedance is too high, the L-C peak impedance may be boosted to receive more power from environment, at the cost of narrowing down the L-C bandwidth, i.e. decreasing the "detuning" of the input impedance L-C circuit.

The capacitive component of the input impedance L-C circuit may comprise one or more actual capacitors, such as capacitor 805 of the receiver 301 of the preferred embodiment, or the capacitance may be generated using other means, for example by the parasitic input capacitance of the subsequent module in the receiver, for example the rectifier, i.e. without the explicit use of a capacitor as a component of the input impedance L-C circuit. Alternatively, the capacitive component of the input impedance L-C circuit may be defined by a combination of the two, i.e. the capacitive component of the input impedance L-C circuit may have contributions from both a capacitor such as capacitor 805, as a component of the circuit, and, for example, a parasitic input capacitance of another circuit or component in the receiver, such as rectifier input capacitance 809, as in the receiver 301 according to the preferred embodiment.

Instead of switching from the power transmission operation mode to the harvesting mode on the basis of transmitted power received, the apparatus may instead, or in addition, be configured to switch from the harvesting mode to the power transmission operation mode according to the power of the electrical signal received in the harvesting mode.

The T0, T1 and T2 delay modules (1321, 1323 and 1325, respectively) may have a fewer or greater number of configurations. For example, the T0 delay module 1321 may have only two configurations: one for the power harvesting mode and one for the power transfer receiving mode, and the mode selector 1333 may only allow selection between these two modes.

In the receiver 301, the dual-mode buck boost converter 309 may be employed with a rectifier which is not a bulk adaptation rectifier 307, for example a full-bridge rectifier with a store capacitor. Alternatively, the bulk adaptation rectifier 307 could be employed with a DC-DC converter which is not a dual-mode buck-boost converter 309, for example a buck-boost converter or a low drop-out regulator. The detuned impedance booster 3015 may be omitted entirely, or the level of tuning (i.e. the bandwidth) of the impedance booster 3015 may be varied. The receiver 301 may be configured to only operate in either the power receiving mode or the power harvesting mode and the load impedance, or load impedance configurations of the converter 309 may only be configured to accommodate one of these modes. Different receivers 301 may be configured to perform energy harvesting and power receiving.

A new search for the capacitor bank 2011, 2013 configurations may be triggered when the amplitude of the electrical signal is closer to or further from the half open circuit amplitude than 0.15V. The threshold amplitude for the search may be greater or less than +0.15 V of the half-open circuit amplitude. The threshold amplitude may not be defined with respect to the half-open circuit amplitude, instead being a predetermined minimum amplitude value for the electrical signal.

The transmitter 201 according to the preferred embodiment may be employed with a receiver of a different design.

Figure 28:
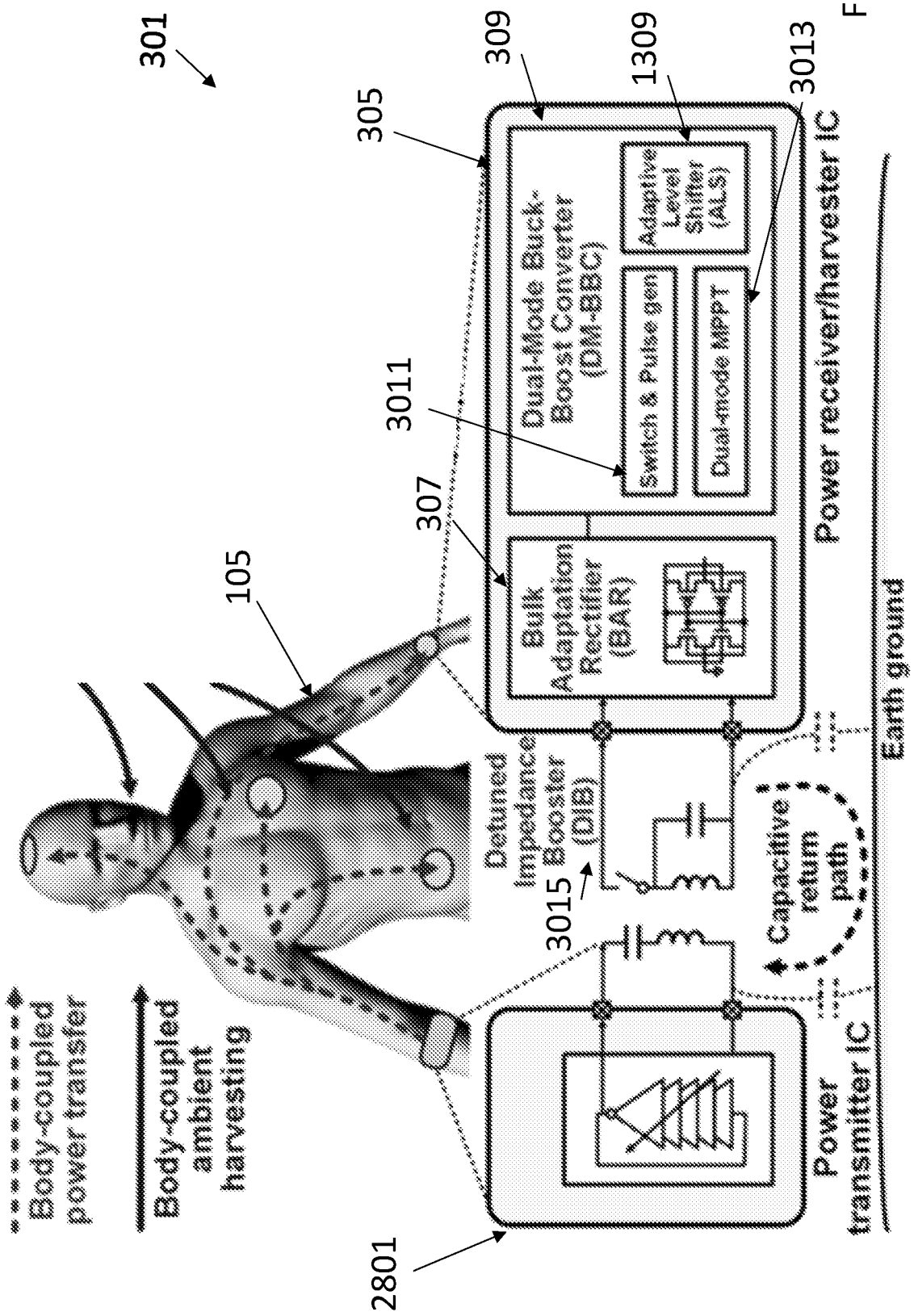
FIG. 28 shows a variation of the preferred embodiment with a transmitter with a static impedance matching output interface.

The receiver 301 according to the preferred embodiment may be employed with a transmitter of a different design, for example as shown in FIG. 28, in which a transmitter 2801 without dynamic impedance matching is employed. One or more of the transmitter 201 and the receiver 301 may not comprise an IC chip 2015, 305.

Some modules which are shown in the preferred embodiment as being components of other modules on the IC chip 2015, 305, may in fact be separate modules or realised off-chip. For example, the ALS module 1309 may form part of the switch and pulse generation module 3011 or it may be a separate module, as shown in FIG. 28.

The dual-mode buck boost converter 309 may not perform T1 fine tuning, the only impedance load variation in the converter being achieved by varying T0 1703.

The receiver 301 may comprise a data transmitter and the transmitter 201 may comprise a data receiver, for use with body area network (BAN) for data transmission between them. Different frequencies may be employed for power and data communication to prevent confusion. In this way the transmitter 201 may use the power receiver 301 information and state, such as a rectifier 307 output voltage, to transmit at improved power efficiency.

The receiver 201 may include a control module for controlling the modes of the dual-mode buck boost converter 309 (i.e. the T0 configuration) via the mode selector 1333 and/or the operating mode of the BAR 307. The receiver controller module may sense the output voltage of the BAR 307 and may send a signal to the power TX 201 to achieve maximum power efficiency, in the case that the receiver 301 may include a data transmitter. It may also generate the control signal for the dual-mode buck boost converter 309 and change the matching network 3015 configuration depending on the situation.

The matching network comprised within the DIB 3015 may be modifiable depending on the human subject, for example, by varying the capacitance of its capacitor.

The DCO 2071 may employ a high threshold MOSFET for leakage current reduction.

The transmitter controller 205 may control all sub-blocks of the Power TX 201. Based on the data from the RX 301 via BAN, the controller 205 may determine all the parameters and generate a control signal such as frequency and a maximum current of power amplification for safety.

The transmitter 201 may comprise a current limiter, which may set the maximum current consumed in the driver 2072, limiting the maximum power transfer. A binary-weighted current mirror may be used to control the current level digitally. This may help to ensure safety with the transmitter 201 is being employed.

The receiver 301 may comprise a storage capacitor for storing the received power, for example in the case that it is not being used immediately for powering a wearable device.

The multichotomic search performed by the dynamic impedance matcher 209 may divide the 2-D searching area by greater or fewer sections, for example, the search may be a dichotomy-based search.

Although the described preferred embodiment is directed to power transfer using capacitive coupling via the body, power transfer may alternatively be achieved by alternative mechanisms employing the body as a coupling medium. For example, magnetic resonance coupling between power transmitter 201 and receiver 301 may be achieved by employing a pair of coupled inductor coils as electrodes 200, 300.

Power transfer could alternatively be achieved via a galvanic current. In this approach, instead of floating ground nodes 2051, 3051, the return path for both transmitter 201 and receiver 301 would be formed by further, respective return electrodes coupled to the body, i.e. two electrodes would be employed at the transmitter 201 output interface and two electrodes and the receiver 301 input interface to form the the form the forward and return paths, both via the body 105, galvanic current between the two sets of electrodes injecting AC current into the skin or body tissue.

Although the description of the apparatus of the preferred embodiment has been directed primarily to the use of the apparatus to power wearables, which may involve power transmission primarily (although not exclusively) via the human body surface, i.e. the skin surface, the apparatus may be instead be employed to power implantable devices via capacitive coupling, magnetic resonance coupling or galvanic current, in which case the power transmission may be primarily (although not exclusively) through the body via subcutaneous or other tissue.

Further Embodiments

Figure 29:
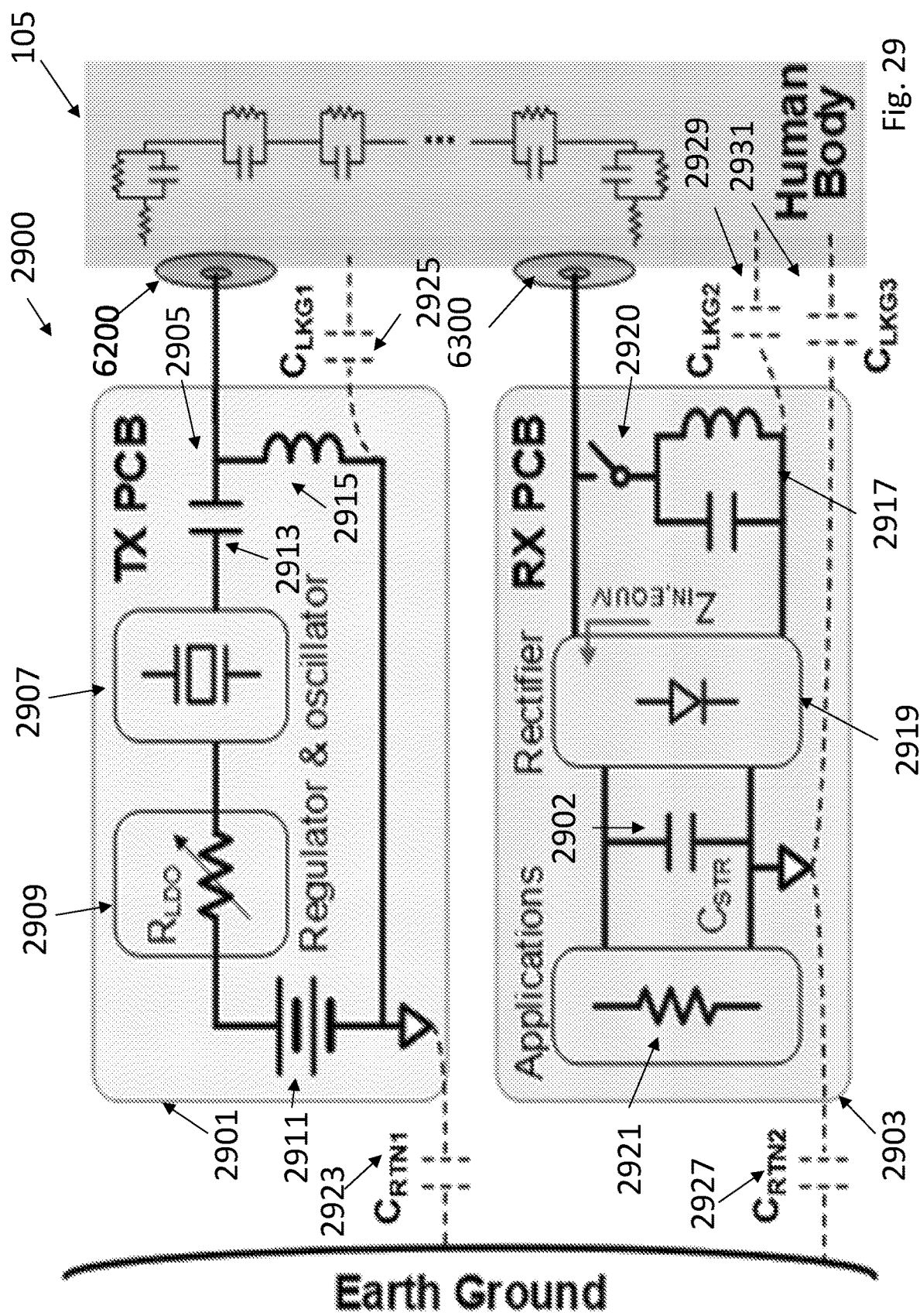
FIG. 29 shows an energy transfer apparatus according to a second embodiment.

FIG. 29 illustrates schematically an energy transfer apparatus 2900 according to a second embodiment for powering wearable devices via energy transfer via the body and energy harvesting. The device comprises a transmitter 2901 and receiver 2903 connected to the body 105 via electrode 6200 and 6300, respectively, as before in the preferred embodiment.

The transmitter 2901 comprises a power source 2911, a regulator 2909, an oscillator 2907 and an L-structured matching circuitry 2905 comprising a capacitor 2913 and 2915 to match the impedance between the oscillator 2907 output and the transmitter 2901-body 105/environment interface.

The receiver 2903 comprises an L-C impedance booster 2917 shunt across the receiver front end, a diode rectifier 2919, a storage capacitor 2902, and a resistive load (e.g. that generated by the application of the wearable device) 2921.

The value of the resistive load 2921 is different according to whether the receiver 2903 is to be employed as a power transfer receiver or a power harvester. The L-C impedance booster 2917 is disconnected from the circuitry via switch 2920 (or may be omitted entirely) when the receiver 2903 is to be employed for energy harvesting.

In operation, an EM field in the megahertz range is generated by the oscillator 2907 powered by the regulated supply voltage 2911 and coupled onto the human body 105 surface via electrode 6200 which is wet in the described embodiment. The ground node of the transmitter 2901 is floating, which forms a parasitic capacitance $C_{RTN1}$ 2923 with the Earth ground for the return path completion. Meanwhile, the parasitic capacitance between the transmitter 2901 ground and the human body $C_{LKG1}$ 2925 results in leakage. Therefore, as with the preferred embodiment, any direct contact between the transmitter 2901 ground plane with the body 105 surface is avoided. The receiver 2903 picks up the EM field via electrode 6300 at the input and recovers the DC power via a rectification circuitry 2919. The DC power is then accumulated at the storage capacitor CSTR 2902 to offer power supply to wearable applications 2921. The return path is closed by the parasitic capacitance 2927 in between the receiver 2903 ground node and the Earth ground. Any capacitance (e.g., $C_{LKG2}$ 2929, $C_{LKG3}$ 2931) coupling circuit nodes to the human body 105 contributes to power leakage.

To improve the amount of the power recovered, impedance matching is performed at the transmitter 2901-body 105 interface, via the L-structured matching circuitry 2917 to match the impedance between the oscillator 2907 output and the transmitter 2901-body 105/environment interface.

Apparatus 2900 according to the second embodiment may enable power receiving through the body 105 to be achieved at wearable devices using only commercially available components, thus presenting immediate potentials in reproduction and integration in wearable devices.

Apparatus 2900 according to the second embodiment, shown in FIG. 29 provided the experimental set up necessary to characterise the usefulness of the preferred embodiment.

For characterising the power transfer mode, a transmitter 2901 according to the second embodiment (FIG. 29) was fabricated on CB (0.4 mm thickness, Au electroplating pad) consisting of a battery pack (3/6 V), a regulator (Microchip, MCP1700T-3302E/TT), crystal oscillators (ALE), and matching circuitry (SMD type) at its output. It coupled power via a wet electrode 6200 (Red dot, 3M Ag/AgCl, 2237) onto the human body 105. A receiver 2903 according to the second embodiment received the signal via the wet electrode 6300 and passed it on to rectification circuitry 2919 (1.5 mm thickness, Au electroplating pad). The receiver 2903 rectifier 2919 was shunted by an L-C tank 2917 (SMD type) at the input and was itself built by the bridge configuration of 4 RF Schottky diodes (Skyworks, SMS7621-060) with one input node floating. Commercial SMD-type capacitor 2902 and resistor 2921 were used for storage and loading. The transmitter 2901 PCB was used to couple the electric field (30 MHz ~ 90 MHz) onto the human body 105. The transmitter 2901 output~1.2 mW with 3 $V_{PP}$. The L-C tank 2917 shunted across the rectifier input provided both power and voltage boosting. The resonance frequency was the same as energy delivery frequency, and the inductor and capacitor values were selected based on the L-C resonance equation $f=\sqrt{1/4\pi2LC}$, as well as the Q factor considerations. A load capacitor 2902 of 10 nF was shunt across the rectifier 2919 output for energy storage. Oscilloscope (Keysight, EXA Signal Analyser, N9010A) was then used for output voltage measurement, from which DC power rectified was calculated by $P=V^2/R_{load}$. Two oscilloscope probes (Keysight, N2843A, 10:1) for channel 1 and channel 2 inputs were used to probe at the two nodes of the rectifier 2919 output, respectively, with both group leads connected together and left floating. The voltage difference between these two channels was taken as the output voltage in order to counteract potential fluctuations due to ambient noises.

The open circuit voltage was measured with an oscilloscope (Keysight, EXA Signal Analyser, N9010A) by removing all resistive components from the rectifier 2919 load at the receiver 2903 side, and shunting the oscilloscope probe (Keysight, N2843A, 10:1) across the load capacitor 2902. The impedance of the oscilloscope probe was 10 MΩ.

Figure 30:
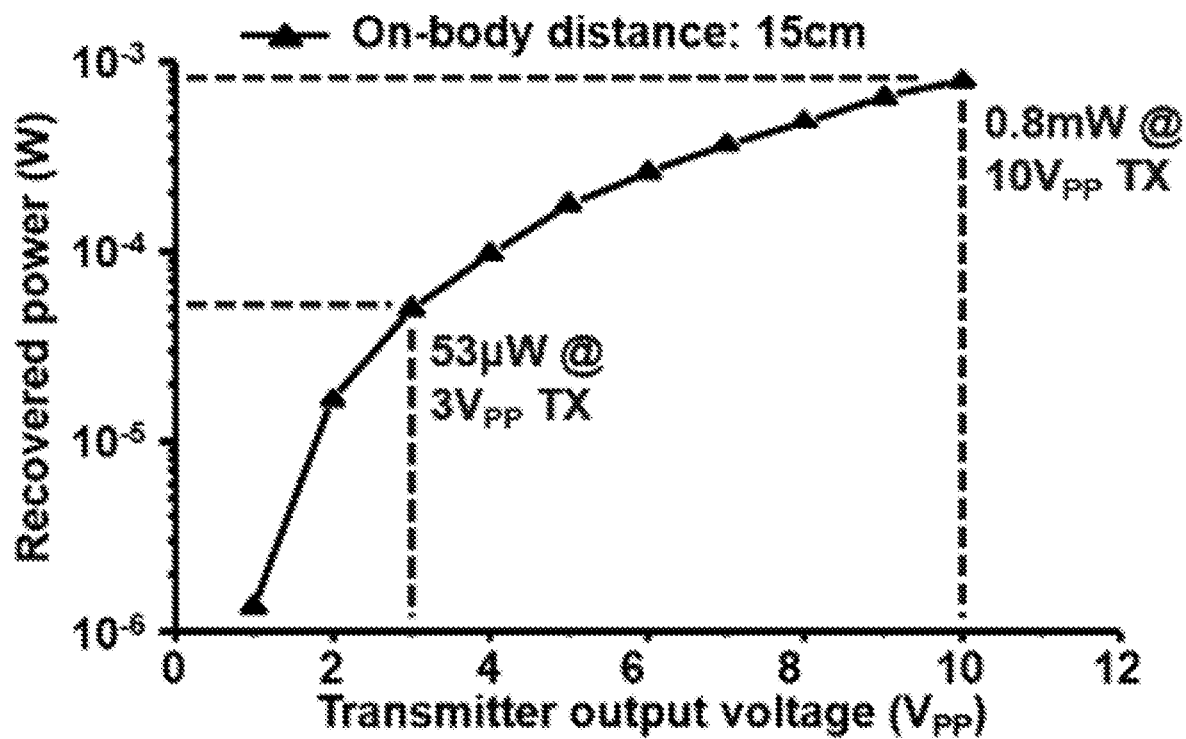
FIG. 30 shows experimental results for the recovered power as a function of transmitter output voltage obtained for apparatus according to the second embodiment of FIG. 29.
Figure 31:
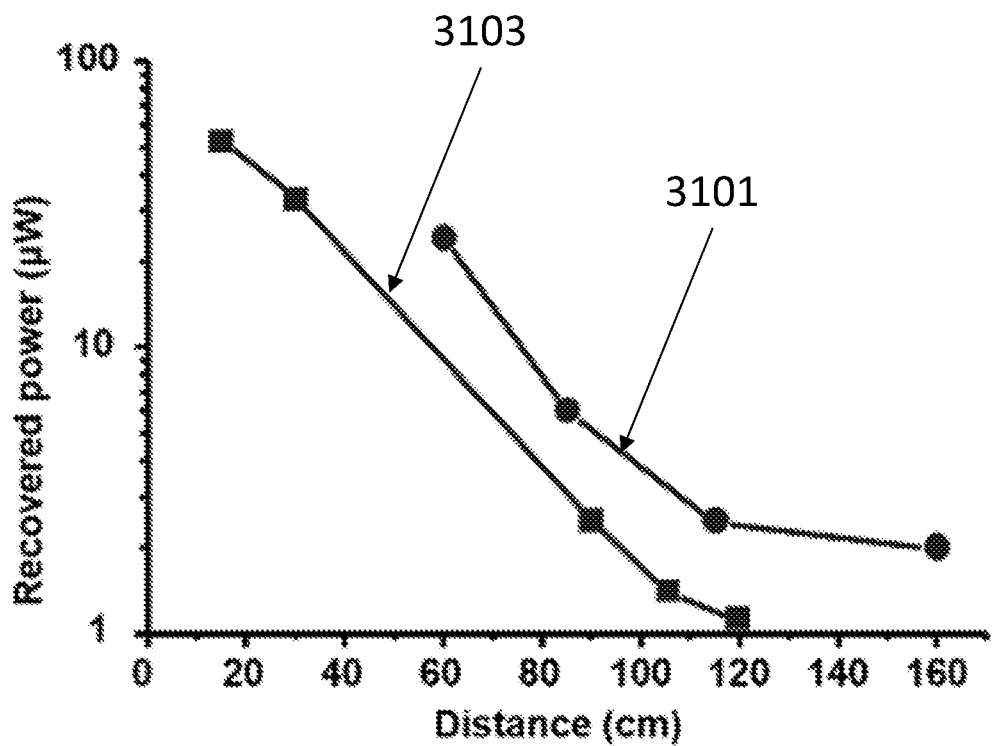
FIG. 31 shows experimental results for the recovered power as a function of transmitter-receiver distance obtained for apparatus according to the second embodiment of FIG. 29.

FIG. 30 shows the correlation between the power recovered and the enhancement in transmitter 2901 output voltage/power for an on-body distance of 15 cm and FIG. 31 shows the power recovered with respect to on-body distance for an arm to arm path with transmitter 2901 output voltage of $3V_{PP}$ (3103) and an ankle-forehead path also with transmitter 2910 output voltage of $3V_{PP}$ (3101). The recovered power positively correlated with the transmission power and negatively correlated with the increase in transmission distance. At 15 cm apart, 0.8 mW was recovered with the apparatus 2900, when the power transmitter output 10 $V_{PP}$. At the same distance, when the transmitter 2901 output reduced to 3 $V_{PP}$ and ~1.2 mW, 53 µW was recovered (FIG. 30). As the distance increased, with the power transmitter 2901 placed at one wrist emitting ~1.2 mW at 3 $V_{PP}$, 1.1 µW was recovered at the other wrist. This distance was estimated to be 120 cm considering an adult's arm length (male; height 170 cm). When the transmitter 2901 was placed at the ankle and the receiver 2903 at the forehead (with the equivalent on-body transmission distance of 160 cm), 2 µW was recovered (3 $V_{PP}$ transmitter 2901 output) (FIG. 31). The higher recovered power compared to the wrist case was attributable to the higher capacitive coupling with the Earth ground when one node is placed at the ankle. Thus, apparatus 100, 2900 according to embodiments may enable a large coverage range.

The body-coupled power transmission scheme employed was strictly below the specific absorption rate (SAR) limit for the whole body and local body parts. Taking the power transmitter 2901 to be introducing electric field with an output power of ~1.2 mW at 20 MHz ~ 100 MHz, the whole-body SAR was calculated to be $2\times10^{-5}$ W/kg using the following equation and considering an average body weight of 60 kg Whole body $SAR \leq 1.2mW/60kg=2\times10^{-5} W/kg$ This is far below the FCC (Federal Communications Commission) limit of 1.6 W/kg. The local SAR could be calculated with a forearm section of 5 cm for estimation, with the forearm section considered as a cylindrical of 22 cm circumference with 985 kg/m3 density (the average density of the human body):

Local SAR (forearm)

$\leq 1.2mW/((\pi(0.22m/4\pi)^2)\times0.05m\times98kg/m^3)=0.025W/kg$

Figure 32:
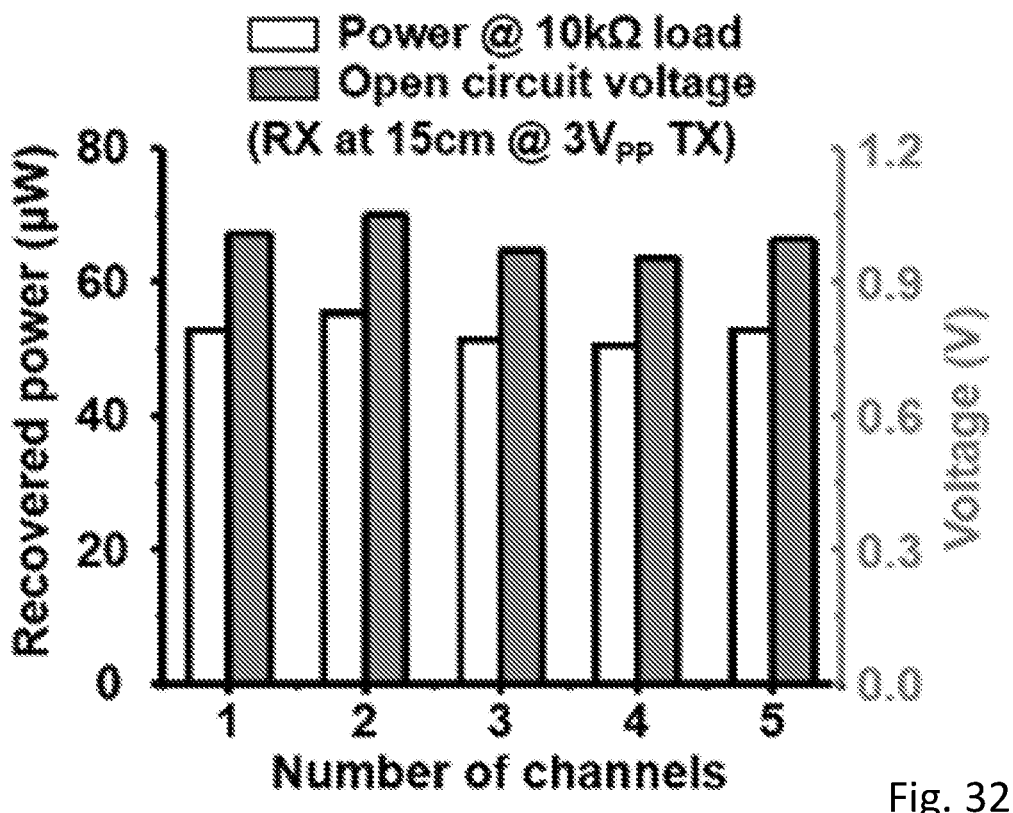
FIG. 32 shows experimental results for the recovered power as a function of the number of receivers as obtained for apparatus according to the second embodiment of FIG. 29.

This shows an estimated value of 0.025 W/kg, again much below the limit of 1.6 W/kg. With the enhancement in transmitter 2901 voltage to 10 $V_{PP}$ (~15 mW output power) (FIG. 30), the whole-body SAR and local SAR (forearm) were calculated to be $2.5\times10^{-4}$ W/kg and 0.31 W/kg, respectively, which are below the FCC standard of 1.1 W/kg. Moreover, apart from the AC signals coupled on the body, there was no DC current flow through the human body 105 in both cases, as the return path 2927 was formed by the capacitive coupling between one node of the rectifier 2919 input and the Earth ground. FIG. 32 shows the recovered power and open-circuit voltage at a receiver 2903 placed 15 cm apart from the transmitter 2701 versus the number of simultaneous receivers 2903 in the network. The transmitter 2901 output was 3 $V_{PP}$ and ~1.2 mW. Despite measurements induced fluctuations, the recovered power and open-circuit voltage were not affected by the number of other receiver 2903 nodes concurrently extracting power introduced by the body coupling, with the transmitter 2901 power of ~1.2 mW.

Thus, initiating simultaneous one-to-many power transmission may be possible using apparatus 100, 2900 according to embodiments.

Figure 33:
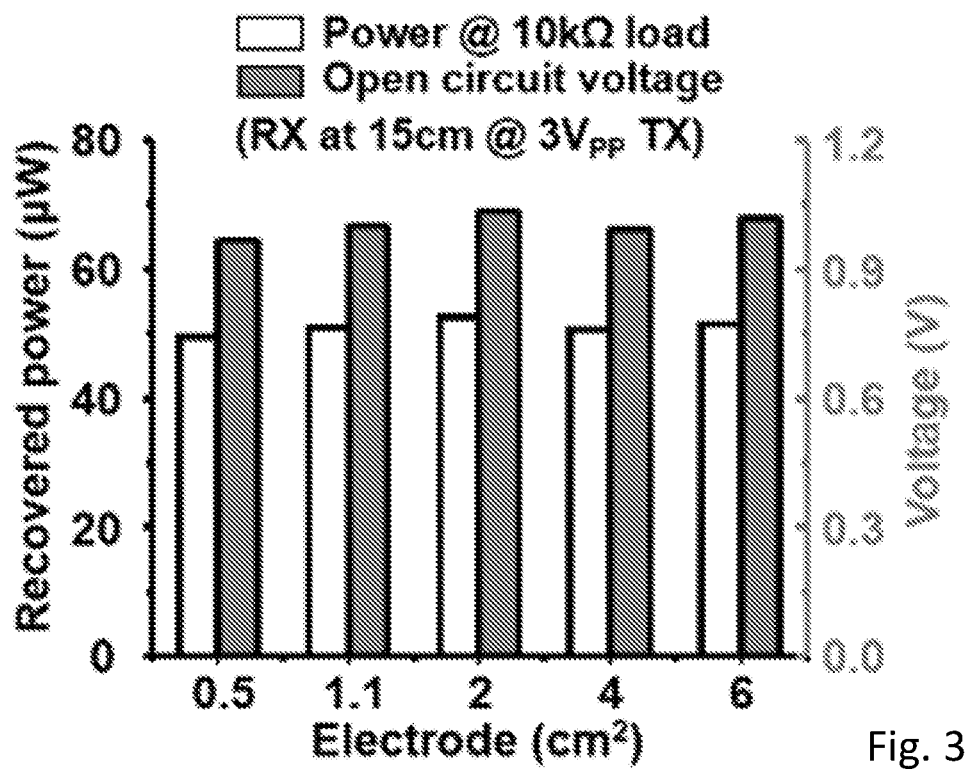
FIG. 33 shows experimental results for the recovered power as a function of electrode size as obtained for apparatus according to the second embodiment of FIG. 29.

FIG. 33 shows the measured recovered power and open-circuit voltage versus electrode 6200, 6300 size of the transmitter 2901 and receiver 2903, which were placed 15 cm apart. A similar amount of power and open circuit voltage was recovered irrespective of electrode 6300 size. Unlike the far-field RF power transmission and near-field inductive coupling where the antenna/coil size is determined by its operating frequency, therefore apparatus 100, 2900 according to embodiments may enable down-scaling of the sensor node and the network as a whole.

Figure 34:
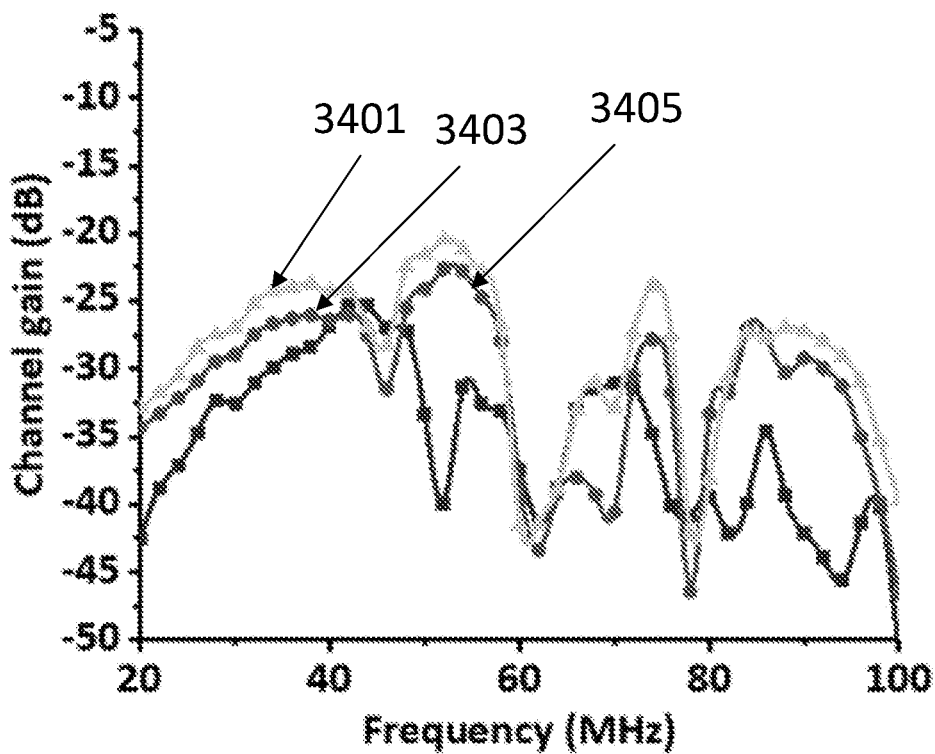
FIG. 34 shows wrist-to-wrist channel gain measured on three different subjects as obtained for apparatus according to the second embodiment of FIG. 29.
Figure 35:
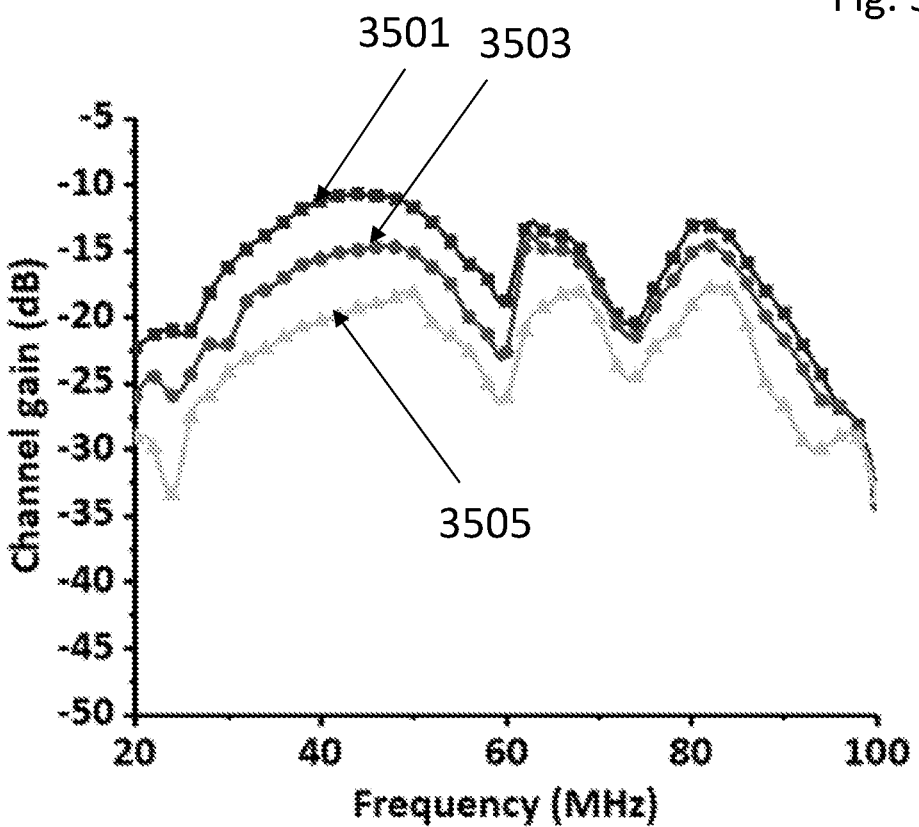
FIG. 35 shows channel gain along the human arm as obtained for apparatus according to the second embodiment of FIG. 29.
Figure 36:
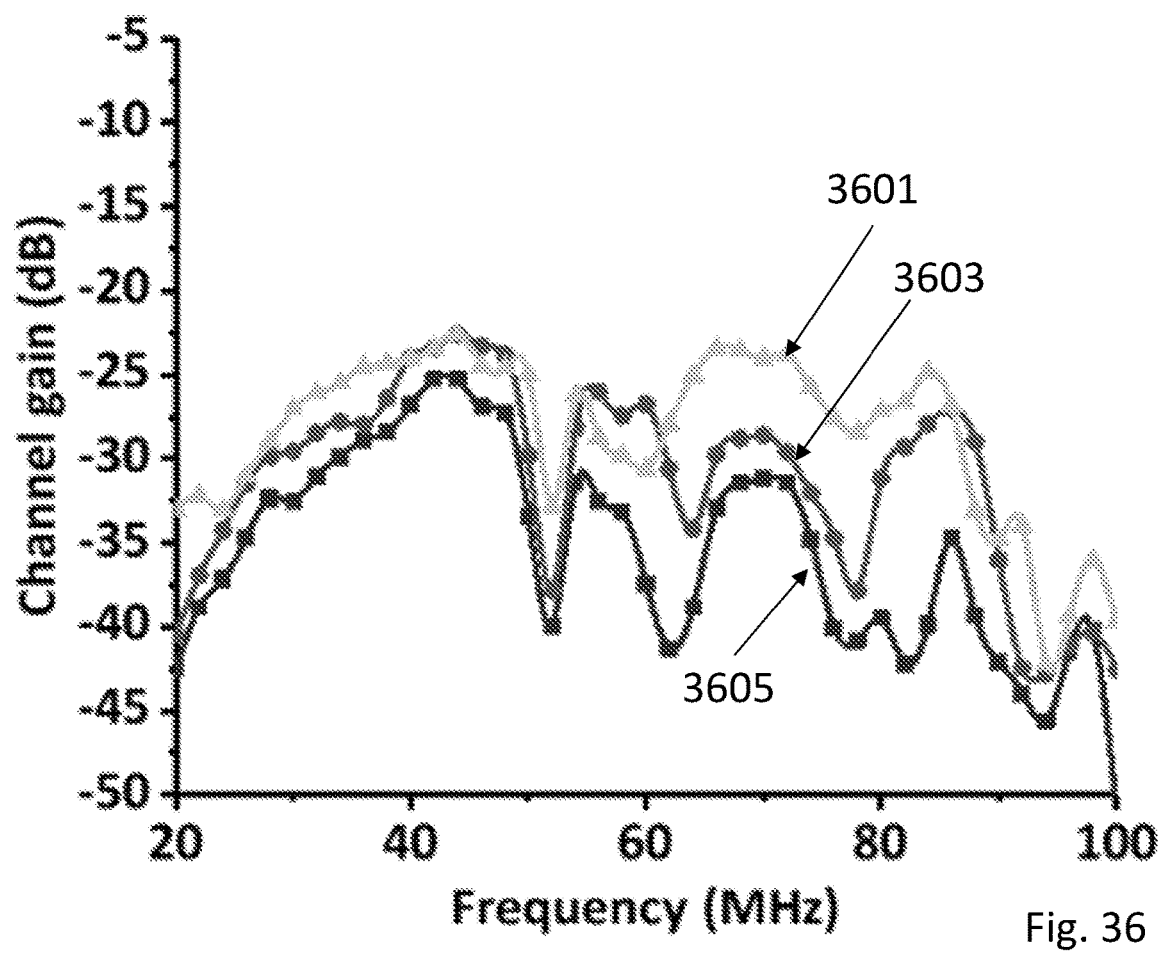
FIG. 36 shows channel gain measured along heterogeneous body path as obtained for apparatus according to the second embodiment of FIG. 29.

FIGS. 34, 35 and 36 show body channel gain characteristics as a power transmission medium. Probing across the receiver input, channel gain from the power transmitter 2901 to the receiver 2903 at frequencies ranging from 20 MHz to 100 MHz is illustrated;

FIG. 34 shows 120 cm wrist-to-wrist channel gain measured on three different subjects 3401, 3403 and 3405; FIG. 35 shows channel gain along human arm measured at three different lengths: 5 cm (3501), 10 cm (3503), and 30 cm (3505); FIG. 36 shows channel gain measured along heterogeneous body paths: wrist-to-wrist (3605), wrist-to-leg (3603), and wrist-to-chest (3601). Power transmission via body coupling was found to manifest in the frequency of the megahertz range. Though the absolute amount of the pathloss was dependent on the individual, distance, delivery path, and environmental factors, 30 MHz to 90 MHz exhibited the lowest path loss, and thus optimal frequency range for body-coupled power transmission for the apparatus 2900.

Figure 37:
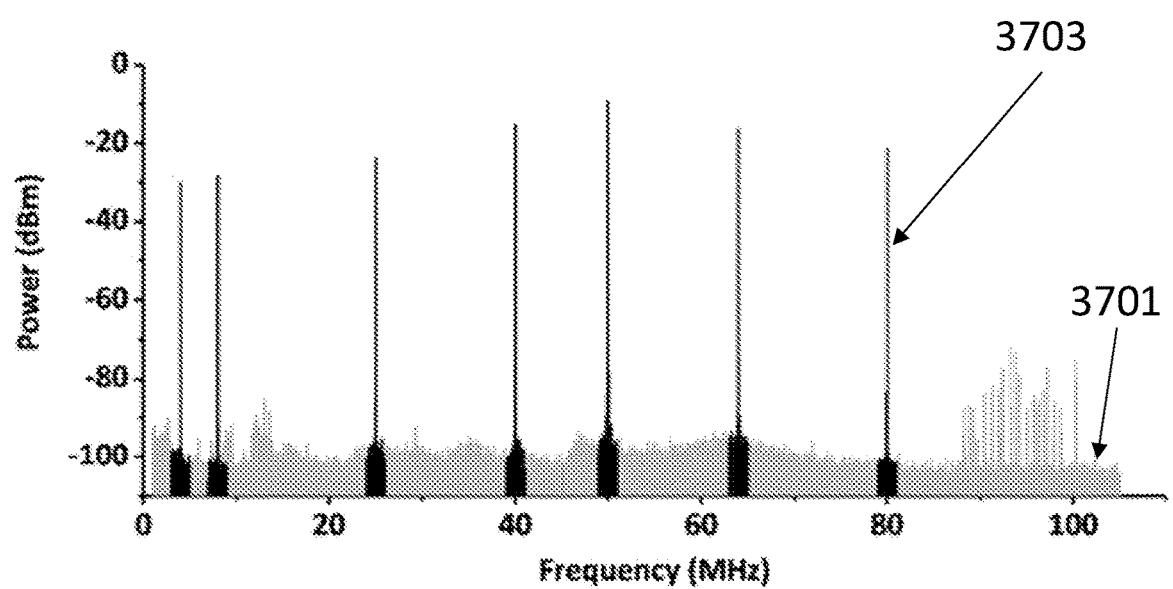
FIG. 37 shows the body coupled power received for an RF generator.
Figure 38:
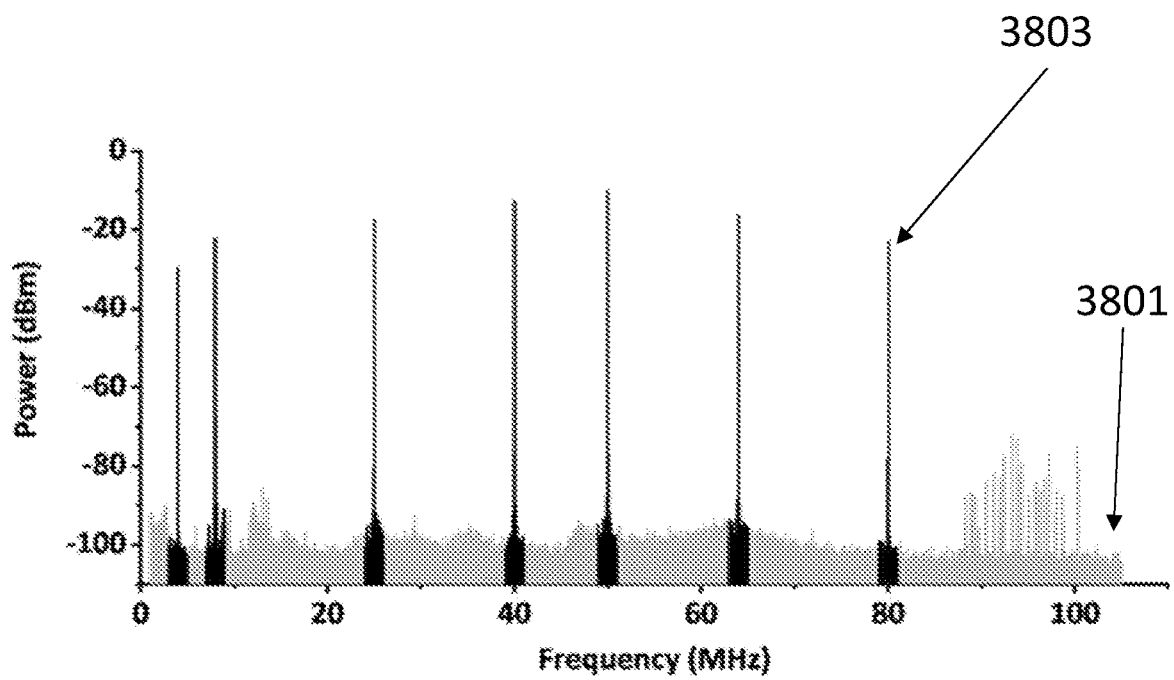
FIG. 38 shows the body coupled power received for apparatus according to the second embodiment of FIG. 29.

FIG. 37 shows the Body-coupled power received when an RF generator served as the transmitter with the power for no external source shown by 3701 and the signal 3703 indicating the power received from a source with RF generation at 4, 8, 25, 40, 50, 64, and 80 MHz. FIG. 38 shows the corresponding results when the battery-operated PCB as described above served as the transmitter 2901, with the power for no external source shown as signal 3801 and the signal 3803 indicating the power received the PCB source at 4, 8, 25, 40, 50, 64, and 80 MHz. This illustrates the effectiveness of the introduction of an electric field by a power transmitter 2901 where the received power across the rectifier 2919 inputs at a receiver 2903, was at least 60 dBm higher than that without any external sources.

Figure 39:
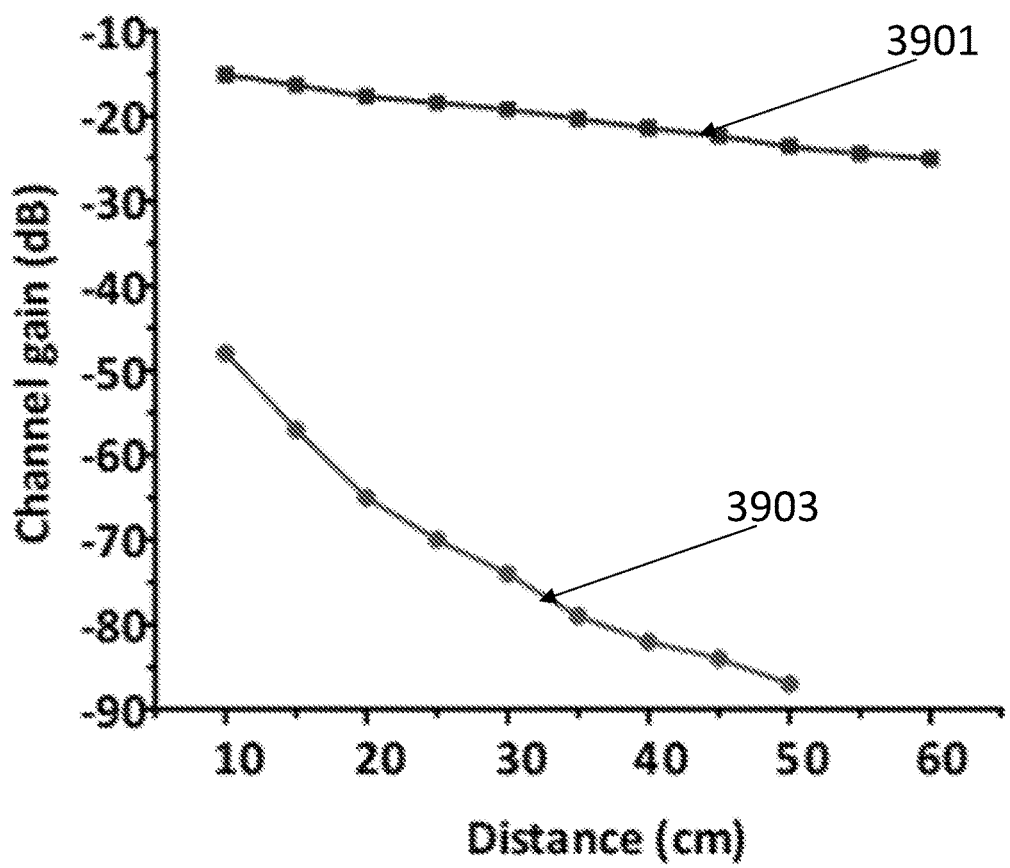
FIG. 39 shows the human body channel gain in comparison with RF approach for apparatus according to the second embodiment of FIG. 29.

FIG. 39 shows the human body channel gain in comparison with RF approach (air-coupled; via antenna). 3901 represents the channel behaviour against increasing transmission distance when using the human body 105 as the medium and electrodes 6200, 6300 as the interface. 3903 represents the channel behaviour against increasing transmission distance when using the antenna for power transmission at 2.4 GHz on the body surface (results taken from Fort, A. et al. Ultra-wideband channel model for communication around the human body. *IEEE J. Sel. Areas Commun.* 24, 927-933 (2006)). Thus, unlike conventional far-field RF power transmission approach which may be limited by line of sight (LoS) requirements due to body-shadowing effects, the body-coupled power recovery may be insusceptible to body shadowing effect and may achieve around 30~70 dB higher received power as compared to RF transmission at 2.4 GHz on/around the body and up to 50 dB higher compared to RF transmission at 900 MHz.

Figure 40:
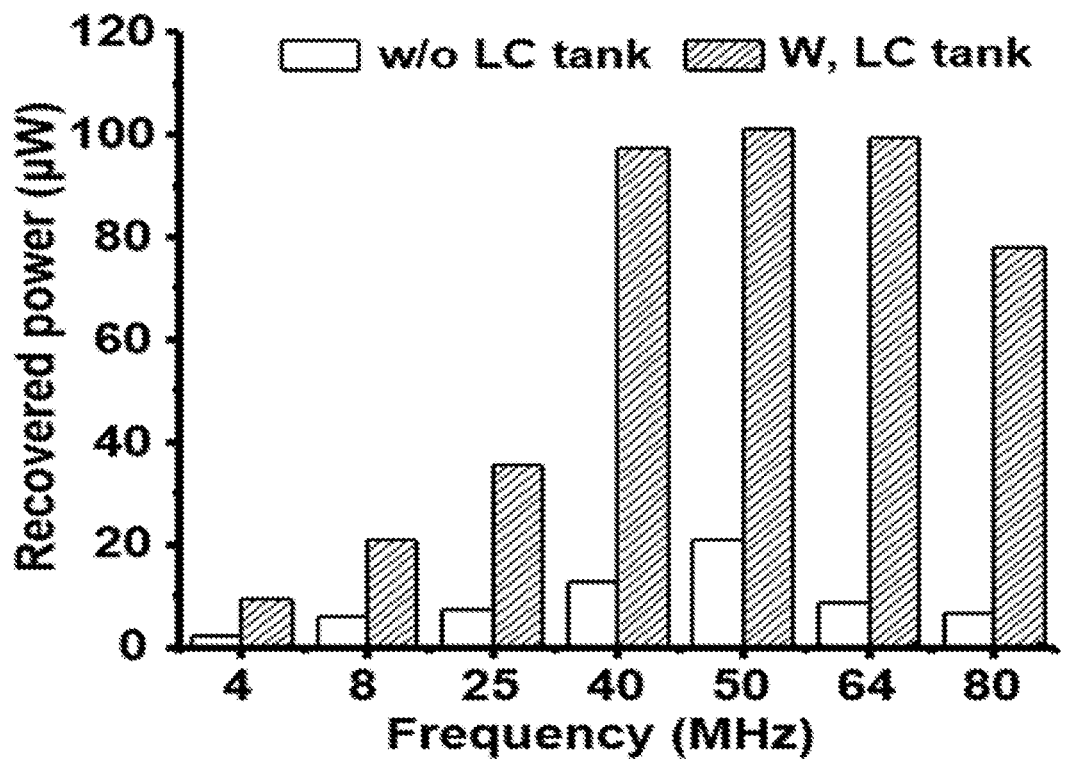
FIG. 40 shows the recovered power with and without the impedance/voltage boosting techniques using the L-C tank of the second embodiment of FIG. 29.
Figure 41:
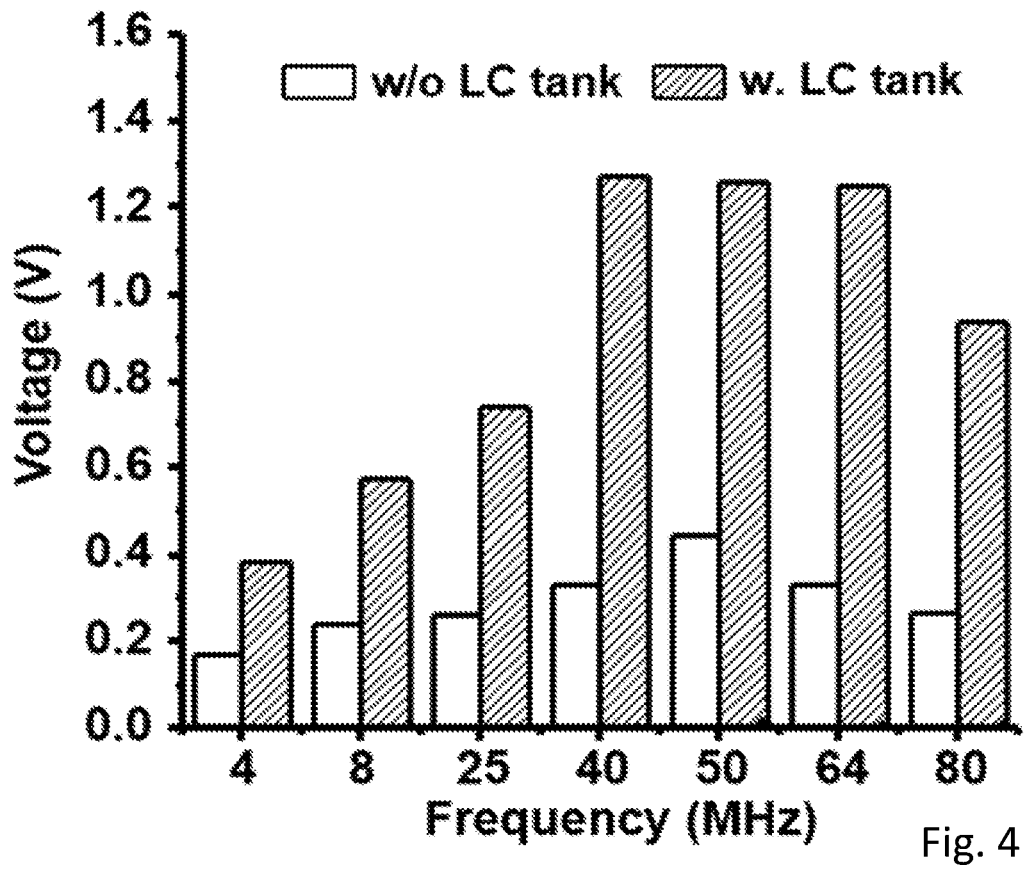
FIG. 41 shows the open circuit voltage with and without the impedance/voltage boosting techniques using the L-C tank of the second embodiment of FIG. 29.
Figure 42:
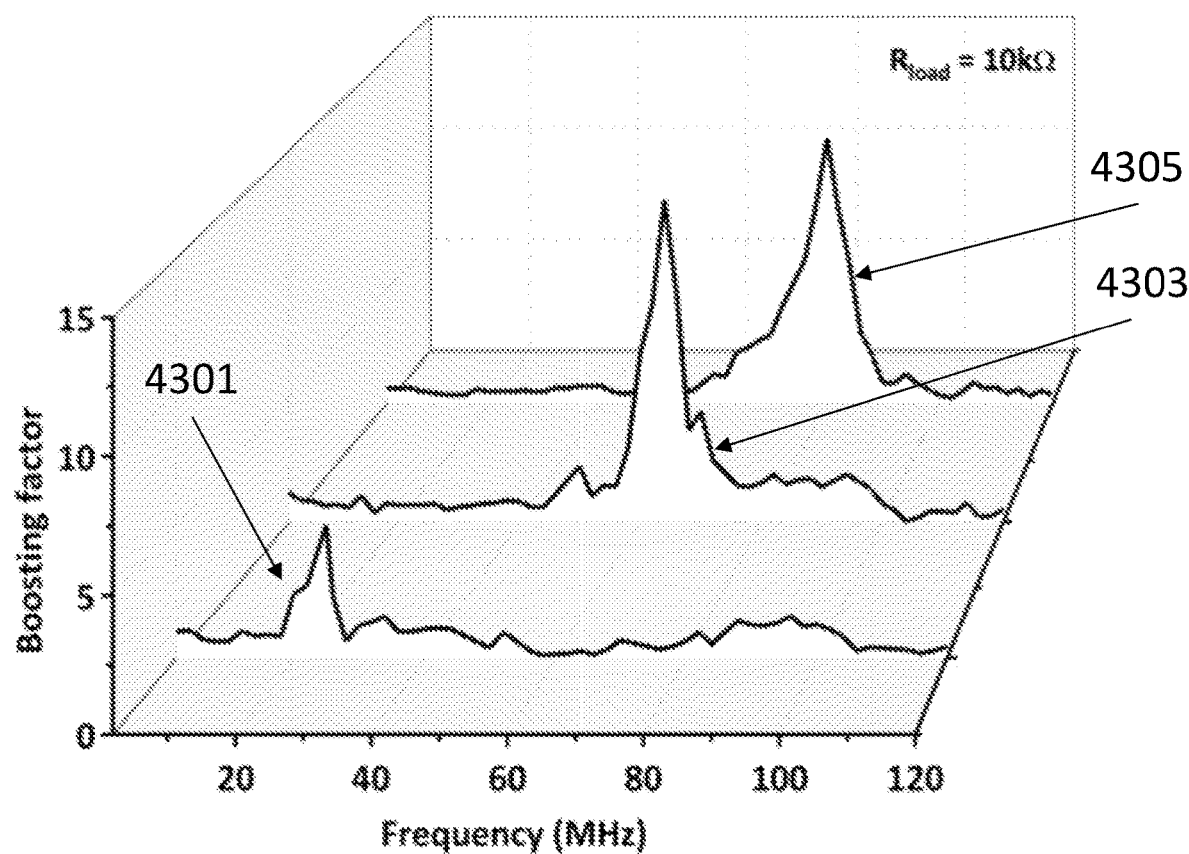
FIG. 42 shows the improvement in power recovery at a range of power transmission frequencies using the L-C tank of the second embodiment of FIG. 29.
Figure 43:
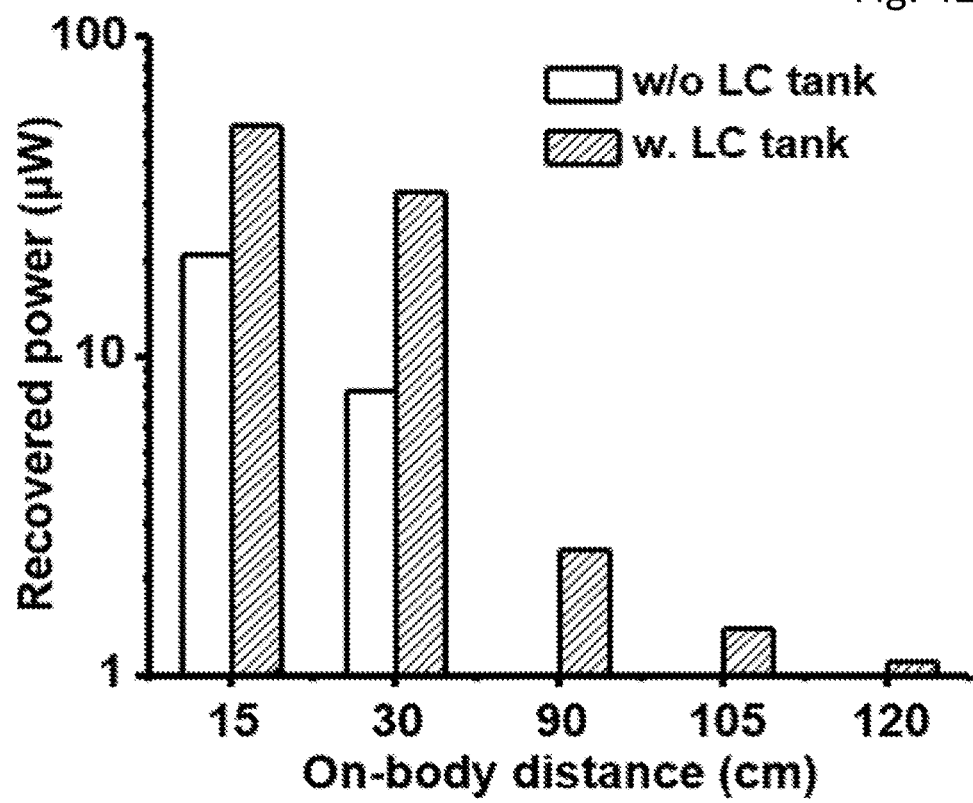
FIG. 43 shows power recovery along an on-body path from one wrist to the other wrist using the L-C tank of the second embodiment of FIG. 29.

FIGS. 40-43 show Improvements in power recovery with the use of detuned L-C boosting at the power receiver 2903. Specifically, FIG. 40 shows the recovered power with and without the impedance/voltage boosting techniques using the L-C tank 2917 (at 5 cm apart at 4 MHZ, 8 MHZ, 25 MHz, 40 MHZ, 50 MHz, 64 MHZ, and 80 MHz). FIG. 41 shows the open circuit voltage with and without the impedance/voltage boosting techniques using the L-C tank 2917 (likewise, the receiving node is placed 5 cm apart). FIG. 42 shows the improvement in power recovery (illustrated as boosting factor, i.e. the recovered power with the L-C tank 2917 and that without the L-C tank 2917) at the power transmission frequency of 25 MHz (4301), 64 MHz (4303), and 80 MHz (4305). The resistive load 2921 across the receiver 2903 output was 10kΩ. FIG. 43 shows the power recovery along an on-body path from one wrist to the other wrist with the L-C boosting technique, in comparison to no L-C boosting being employed. The distance of 120 cm corresponds to the subject's arm length, i.e. from one wrist to the other wrist. When attempting for power recovery without L-C boosting, the successful power recovery occurred only at 15 cm or below, which roughly corresponds to from wrist to elbow.

Thus, with the impedance boosting techniques according embodiments, up to 13 times more power was recovered at the receiver 2903, and the body area coverage was enhanced to the entire arm length (120 cm).

Figure 44:
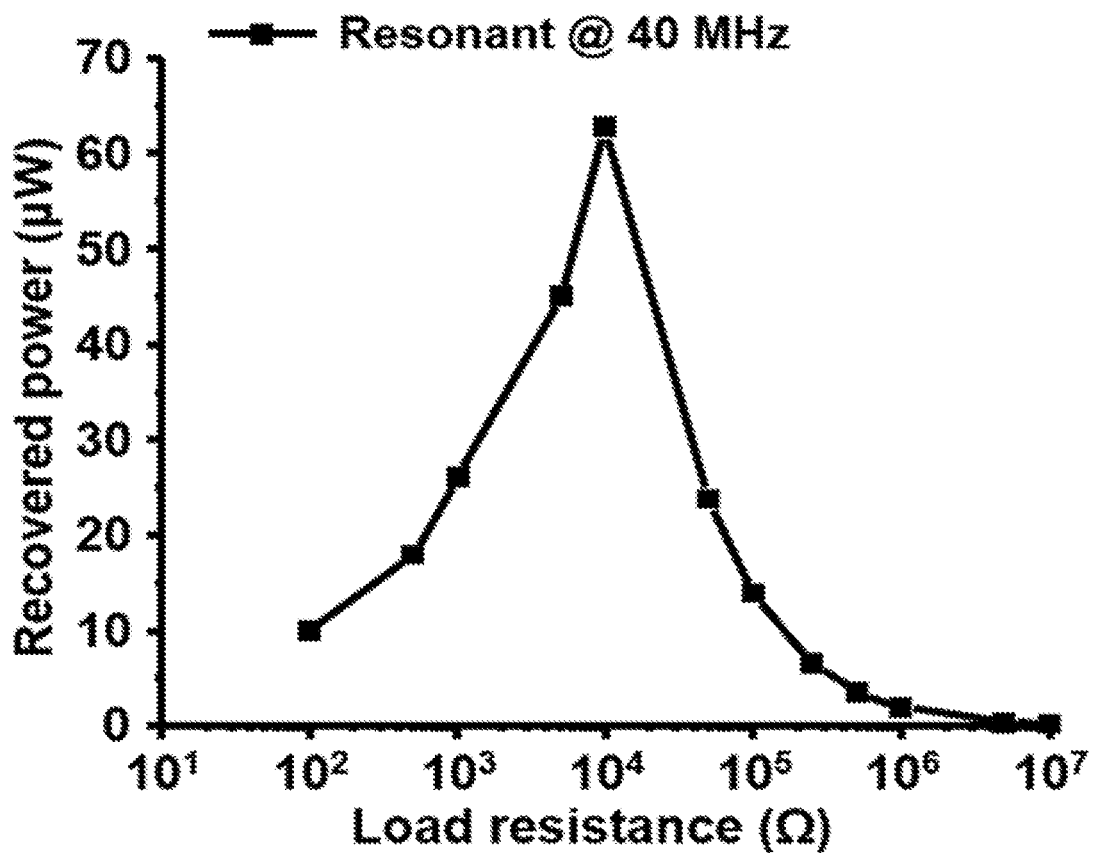
FIGS. 44 to 46 show the load impedance for maximum power extraction obtained using receivers according to the second embodiment of FIG. 29.
Figure 45:
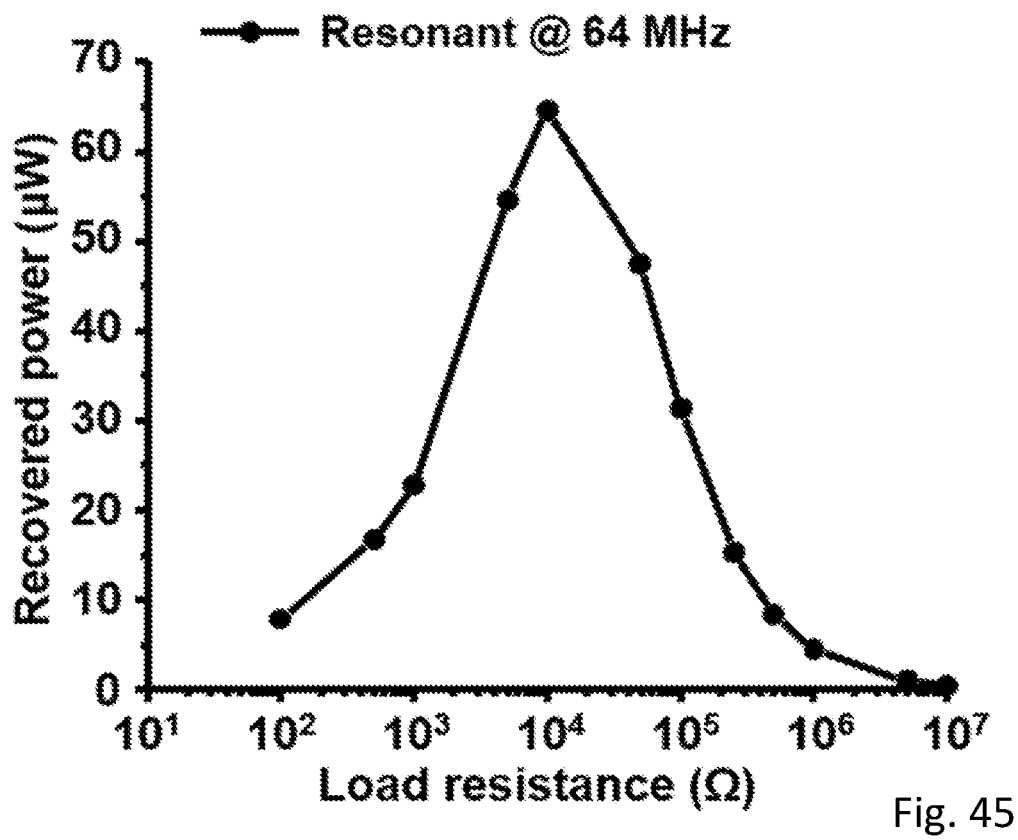
Figure 46:
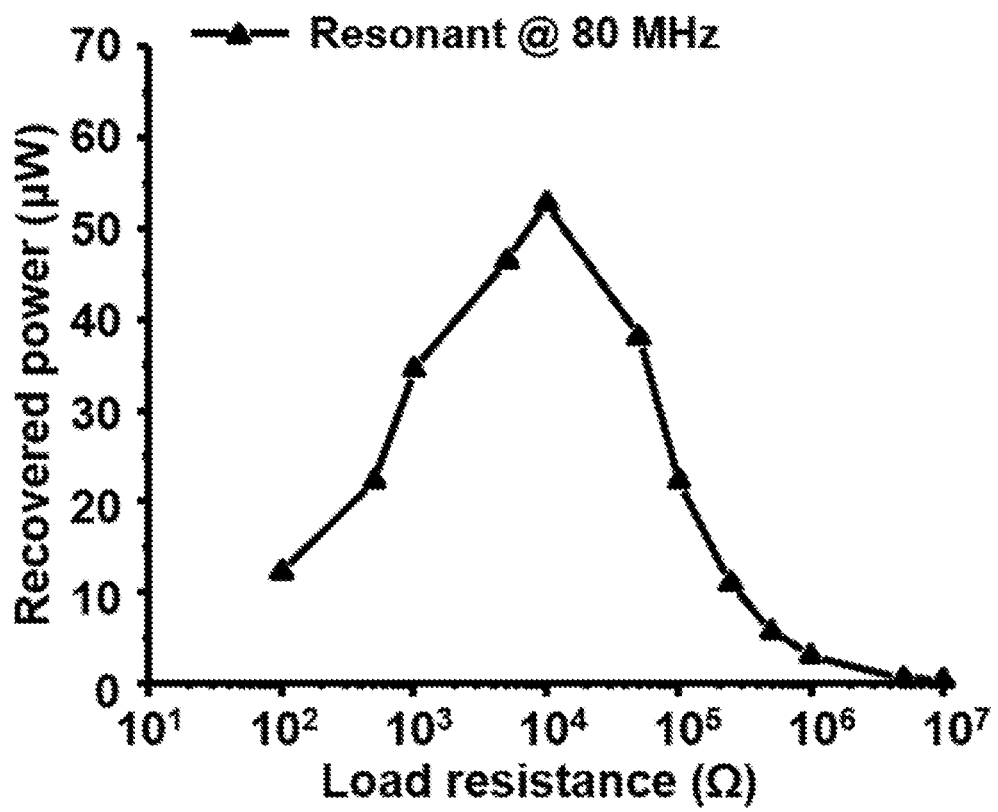

FIGS. 44 to 46 show the impedance for maximum power extraction with the receiver 2903 produced as described above, specifically with the recovered power with respect to load resistance at the power transmission frequency of: 40 MHz (FIG. 44); 64 MHz (FIG. 45); and 80 MHz (FIG. 46). The power transmitter outputted ~1.2 mW with 3 $V_{PP}$, and was placed 5 cm apart from the receiver. The maximum power extraction was observed to occur at the load impedance of 10 kΩ.

In order to characterise the usefulness of the preferred embodiment in the power harvesting mode, a receiver 2903 according to the second embodiment received the signal via a wet electrode 6300 and passed it on to rectification circuitry 2919 (1.5 mm thickness, Au electroplating pad). The receiver (harvester) rectifier 2919 was built by the bridge configuration of 4 RF $P_{IN}$ diodes (Infineon, BAR6303WE6327HTSA1). Commercial SMD-type capacitor 2902 and resistor 2921 were used for storage and loading. A wet electrode 300 (Red dot, 3M Ag/AgCl, 2237) was attached to the skin to transfer the charges coupled on the body onto one input node of the receiver 2903. Portable picoscope (Pico Technology, 4424) were used for output voltage measurement, from which DC power rectified was calculated by $P=V_{store}^2/R_{load}$. A picoscope probe (Pico Technology, 10:1) was used to probe at the rectifier 2919 output to determine $V_{store}$. An analogue buffer (Analog Devices, AD8065) with a common mode impedance of 1000 GΩ at 2.1 pF was inserted in between the resistive load and the picoscope probes, in order to eliminate the loading effect caused by the 10 MΩ probes.

Figure 47:
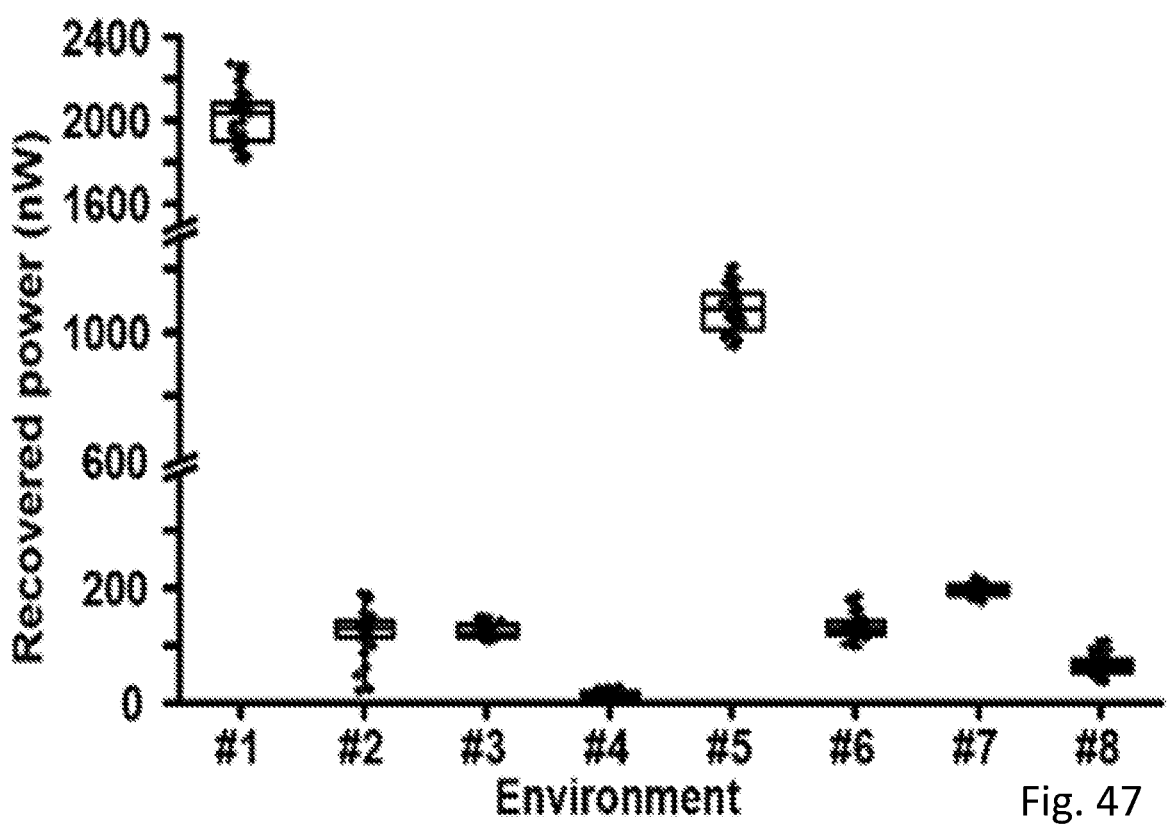
FIG. 47 shows power harvested with a 30 MΩ load resistance under seven environmental settings extraction obtained using a receiver according to the second embodiment of FIG. 29.

FIG. 47 shows the power harvested with a 30 MΩ load resistance under 7 environmental settings. #1 and #2 were measured under different office settings; #3 was measured inside a café; #4 and #5 were measured inside an apartment; #6, #7, and #8 were measured inside different libraries/studies. In order to help ensure a fair representation of power recoverability at all potential locations for the particular environment, 30 measurements were performed at various locations and with different body positioning under each environmental setting. The measurements show that around 20 nW ~ 2.2 µW may be recovered, meaning that receivers 301, 2903 according to embodiments may be able to continuously scavenge the body-coupled ambient EM waves in all environments, which may be helpful in the absence of an active power transmitting source.

Figure 48:
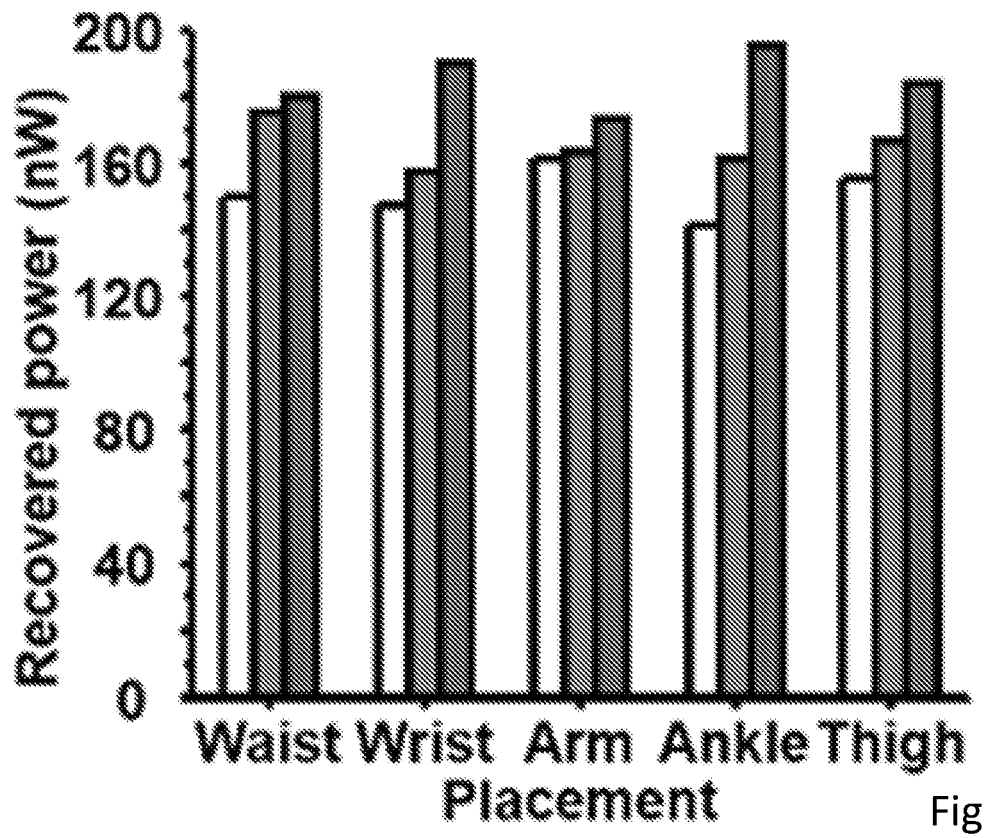
FIG. 48 shows power harvested with a 30 MΩ load resistor by 5 receivers according to the second embodiment of FIG. 29 placed on different parts of the body simultaneously.

FIG. 48 shows the power harvested with a 30 MΩ load resistor by 5 receivers 2903 placed on different parts of the body simultaneously, under environment #2. Power harvested from 3 individuals is illustrated. Due to individual-based differences in tissue electrical characteristics, ambient energy recoverable varies from person to person even with the same posture and positioning under the same environment. However, as can be seen from FIG. 48, for one individual, the amount of power harvested may remain similar regardless of where the electrodes 6300 were placed, despite slight fluctuations. Among the locations are those with little movement/pressure-induced electrostatics and little daylight coverage due to clothing. Such homogeneity in terms of power harvested at various placements indicates the potential of a wide body area coverage with the devices according to embodiments, which may allow devices placed on chest such as electrocardiogram (ECG) sensors 301e to operate on the sustainable power supply. Moreover, with multiple receivers 301a, 301b, 301c, 301d, 301e, 301f operating simultaneously, the amount of power recovered may remain similar to the amount harvested by one single receiver 301,2903, which may indicate the potential for multi-channel energy harvesting without power degradation in devices according to embodiments.

Figure 49:
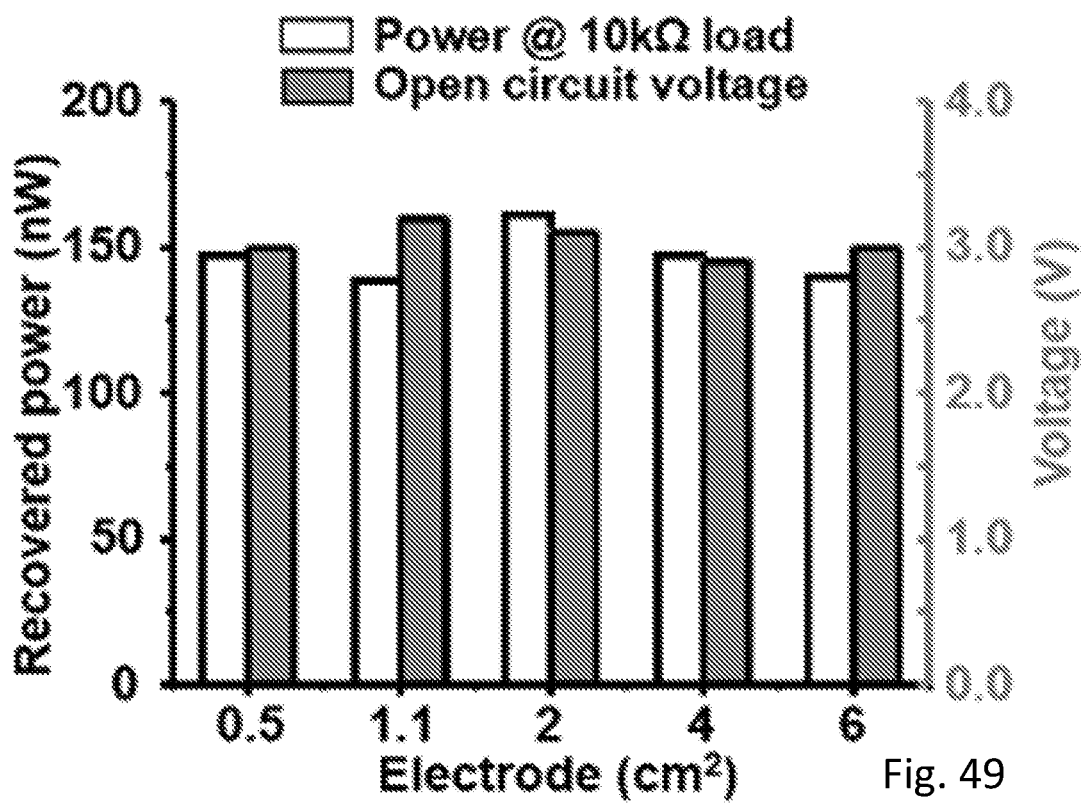
FIG. 49 shows power harvested using a receiver according to the second embodiment of FIG. 29 with a 30 MΩ resistor and the open-circuit voltage achieved with various electrode sizes.

FIG. 49 shows the power harvested with a 30 MΩ resistor and the open-circuit voltage achieved with various electrode sizes. The resistor 2903 was placed on a subject's right wrist and measured under environment #2. With the reduction of electrode 6300 size, the amount of power remained similar with fluctuations, suggesting that electrode 300, 6300 size may be of little relevance in power recoverability using receiver 301, 2903 according to embodiments and that they may have the potential for device downscaling.

Figure 50:
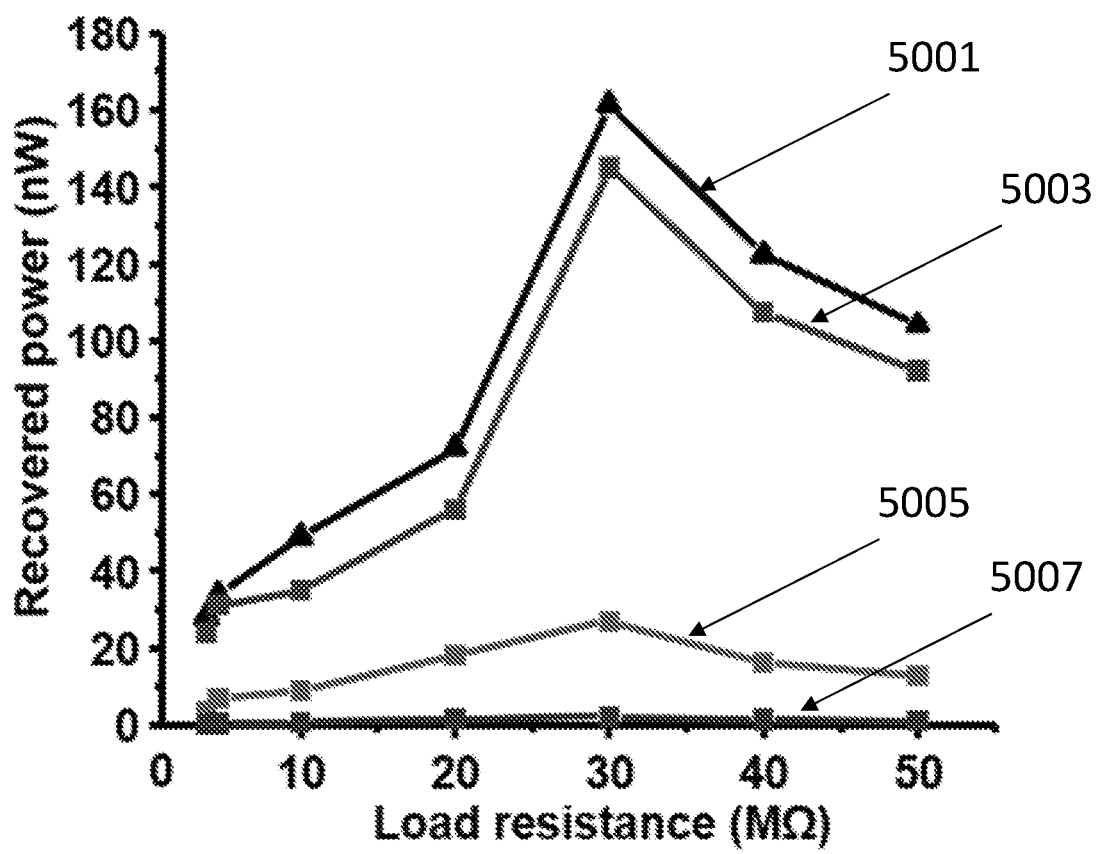
FIG. 50 shows power harvested using a receiver according to the second embodiment of FIG. 29 from 4 different environmental scenarios as a function of load resistance.

FIG. 50 shows the power harvested from 4 different environmental scenarios (an office 5001, a café 5003, a first home 5005 and a second home 5007) against the load resistance of 1 MΩ to 50 MΩ, where the resistance of around 30 MΩ was observed to be the optimal power extraction point for ambient energy harvesting. Note that this was significantly different from the 10 kΩ observed to be the optimal power extraction point for the receiver 2903 operating with a power transmitter 2901 (FIGS. 44 to 46). Thus, apparatus 100 according to the preferred embodiment which may achieve a very wide range of load resistance by varying T0 1703 in the dual-mode buck-boost converter 309 may be effectively implemented in both harvesting and power transfer modes.

Figure 51:
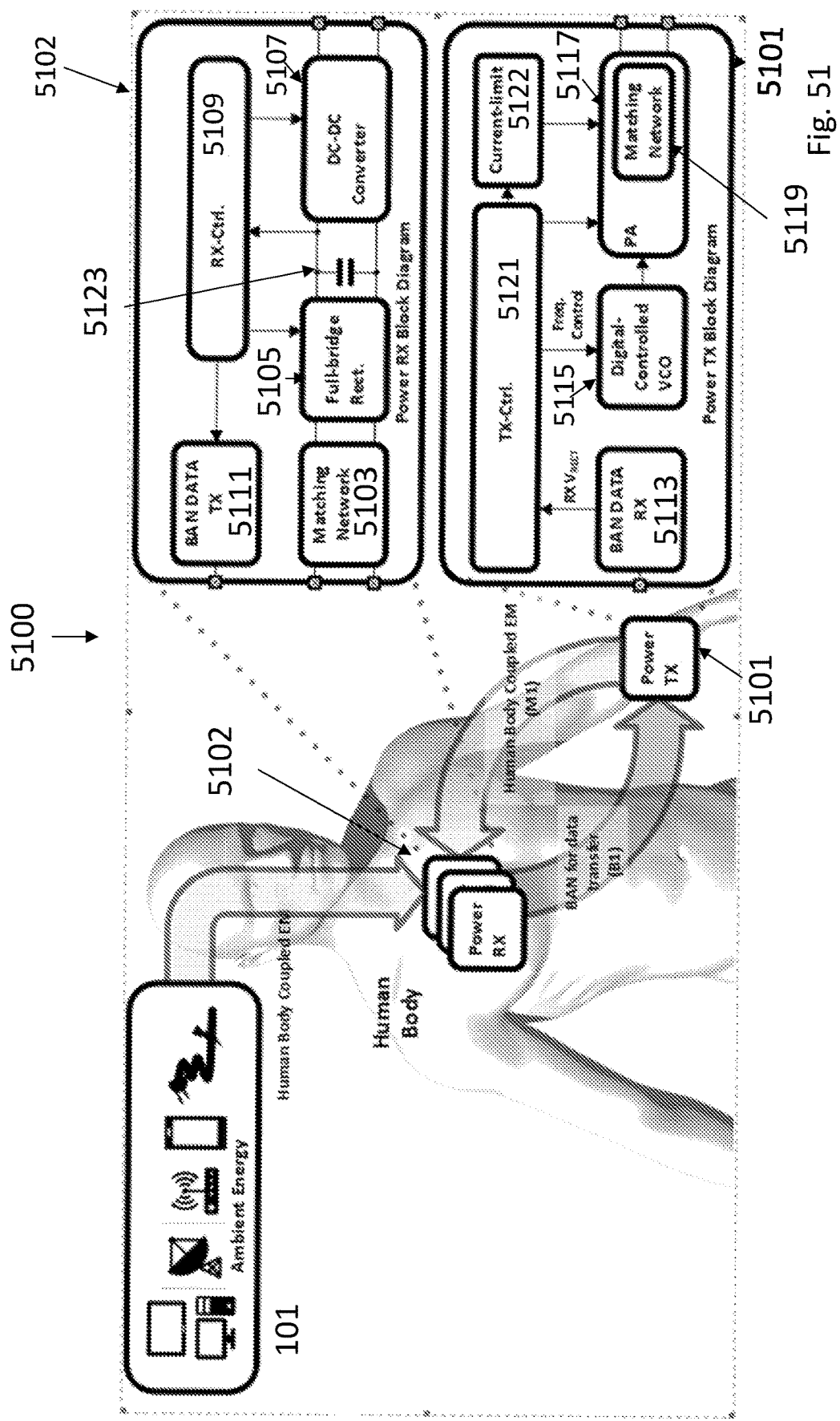
FIG. 51 shows a third embodiment.

FIG. 51 illustrates schematically an energy transfer apparatus 5100 according to a third embodiment for powering wearable devices via energy transfer via the body and energy harvesting. In line with the above described embodiments, the apparatus comprises receivers 5102 and a transmitter 5101 coupled to the human body.

Each receiver 5102 includes a matching network 5103 which, in the active mode, is used to maximize the power transfer efficiency from transmitter 5101 to receiver 5102. The matching may be modified depending on the human subject by changing variable C. Each receiver 5102 further includes a full-bridge rectifier 5105 with a store capacitor 5123 in which body-coupled ambient energy 101 and the active transferred energy from power TX 5101 are changed into DC voltage. Considering the energy central frequency and energy efficiency, a diode in the full-bridge rectifier 5105 may be an active switch based on the ZVS or ZCS technique. The receiver 5102 further comprises a DC-DC converter 5017 which scales voltage into supply voltage for use rectified voltage in a wearable device. The DC-DC converter 5107 is suitable for use due to its high-power efficiency and up/down voltage conversion, and further includes a low drop out regulator (LDO; not shown) which supports low-power capability and only down conversion. A power amplifier 5109, equivalently receiver controller, senses the output voltage of the full-bridge rectifier 5105 and sends the information to the Power TX 5101 to achieve maximum power efficiency. It also generates the control signal for the DC-DC converter 5107 and changes the matching network 5103 parameters depending on the situation. A data transmitter 5111 uses a body area network (BAN) for data transmission for its availability using a transmitter 5111 on the millimetre-scale. Different frequencies are employed for power and data communication to prevent confusion.

The transmitter 5101 includes a BAN data receiver 5113 which can use the information and mode received from the power receiver 5102, such as rectifier 5105 output voltage to transmit better power efficiency. For the data acquisition from the receiver 5102, the BAN receiver 5113 receives data using a body area network (BAN). A digitally controlled, voltage-controlled oscillator (VCO) 5115 determines active energy central frequency. For low-power consumption, the VCO 5115 uses high threshold MOSFET for leakage current reduction. A power amplifier 5117 (PA) generates active body-coupled energy pulses with a high power-efficient Class D or E amplifier using the output pulse of the VCO 5115. A matching network 5119 is employed to boost power efficiency. A transmitter controller 5121 controls all sub-blocks of the Power TX 5101. Based on the data from the RX 5102 via BAN, the Controller 5121 determines all of the parameters and generates a control signal such as frequency and a maximum current of the PA 5117 for safety. A current limiter 5122 sets the maximum current consumed in the PA 5117, which limits the maximum power transfer. A binary-weighted current mirror is used to control the current level digitally.

Having now fully described the invention, it should be apparent to one of ordinary skill in the art that many modifications can be made hereto without departing from the scope as claimed, including the combining of individual functional components or modules of the different embodiments described.

The invention claimed is:

1. A power receiver, comprising:
   (i) a first electrode arranged to be electrically coupled to a body of a living being, the first electrode operable to receive an electrical signal via the body, wherein the electrical signal has a power level;
   (ii) a rectifier for converting the received electrical signal into a rectified electrical signal, the rectifier having a plurality of rectifier switches and operable in a bulk biasing mode in which selected rectifier switches of the plurality of rectifier switches are forward bulk biased;
   (iii) a DC-DC converter for converting the rectified electrical signal to an output electrical signal, the DC-DC converter having a number of selectable discontinuous mode (DCM) times and operable between a power transmission operation mode in which the electrical signal is transmitted by a power transmitter and a power harvesting operation mode in which the electrical signal is harvested ambient energy, in dependence on the power level of the electrical signal; and
   (iv) a controller arranged to select a discontinuous mode (DCM) time from the number of selectable discontinuous mode (DCM) times for the DC-DC converter in response to a present operation mode of the DC-DC converter.

2. The power receiver according to claim 1, wherein the rectifier is operable selectively between the bulk biasing mode and a non-bulk biasing mode in which the selected rectifier switches are not forward bulk biased, in dependence on an amplitude of the rectified electrical signal.

3. The power receiver according to claim 2, wherein second selected rectifier switches of the plurality of rectifier switches are reverse bulk biased in the bulk biasing mode, and wherein the second selected rectifier switches are not reversed bulk biased in the non-bulk biased mode.

4. The power receiver according to claim 3, wherein the selected rectifier switches and the second selected rectifier switches are alternately forward and reversed bulk biased in the bulk biasing mode, in dependence on a phase of the electrical signal.

5. The power receiver according to claim 2, wherein the rectifier is operable in the bulk biasing mode at amplitudes of the rectified electrical signal less than or equal to 0.4V and in the non-bulk biased mode otherwise.

6. The power receiver according to claim 1, wherein the power receiver has an input load impedance, and the power receiver further comprising an L-C circuit, the input load impedance being dependent on a resonance response of the L-C circuit.

7. The power receiver according to claim 1, wherein the controller is arranged to select between a plurality of power transmission discontinuous mode (DCM) times in response to the power transmission operation mode, and between a plurality of power harvesting discontinuous mode (DCM) times in response to the power harvesting operation mode, in dependence of a voltage of the rectified electrical signal.

8. The power receiver according to claim 1, wherein a switching frequency of the DC-DC converter in the power transmission operation mode is in the range of 10 kHz to 500 kHz and a switching frequency of the DC-DC converter in the power harvesting operation mode is in the range of 500 Hz to 6 kHz.

9. The power receiver according to claim 1, wherein the controller is further arranged to adjust an inductor charging time of the DC-DC converter within a predetermined range until an input power of the DC-DC converter reaches a maximum value for the predetermined range.

10. The power receiver according to claim 9, wherein the controller is arranged to determine a direction of adjustment of the inductor charging time based on a corresponding inductor discharging time of the DC-DC converter.

11. The power receiver according to claim 9, wherein the inductor charging time of the DC-DC converter is between 100 ns and 500 ns.

12. The power receiver according to claim 1, further comprising a floating ground node operable as a parasitic capacitive return path via an external ground for the electrical signal.

13. The power receiver according to claim 1, wherein the first electrode comprises a receiving coil, the receiving coil being operable to receive the electrical signal via the body through magnetic resonance coupling with a transmitting coil.

14. The power receiver according to claim 1, further comprising a second electrode arranged to be electrically coupled to the body of the living being, wherein the electrical signal is galvanic current.

15. A power transmitter, comprising:
(i) a signal generator having a variable output impedance comprising a resistive component and a capacitive component, the signal generator operable to generate an electrical signal;
(ii) a first electrode arranged to be electrically coupled to a living being body for transmission of the electrical signal via the living being body;
(iii) an amplitude detector configured to measure an amplitude of the electrical signal; and
(iv) a controller operable to adjust an impedance of the variable output impedance based on the amplitude of the electrical signal to enable the amplitude of the electrical signal to at least reach a threshold amplitude for transmission by the first electrode,
wherein the signal generator comprises a first capacitor bank having a first, variable configuration, the capacitive component of the variable output impedance being dependent on the first, variable configuration of the first capacitor bank; and a second capacitor bank having a second, variable configuration, the resistive component of the variable output impedance being dependent on the second, variable configuration of the second capacitor bank, the controller being operable to change at least one of the first, variable configuration and the second, variable configuration to adjust the impedance of the variable output impedance.

16. The power transmitter according to claim 15, wherein the controller is operable to adjust the impedance of the variable output impedance based on a multichotomic search of the amplitude of the electrical signal within a two-dimensional space described by the capacitive component and the resistive component of the variable output impedance to enable the amplitude of the electrical signal to at least reach the threshold amplitude for transmission by the first electrode.

17. Energy transfer apparatus, comprising:
(i) the power transmitter according to claim 15; and
(ii) the power receiver according to claim 1.

18. A method of receiving electrical power via an electrode coupled to a body of a living being, the method comprising:
receiving an electrical signal from the body via the electrode;
measuring a power level of the electrical signal;
rectifying the received electrical signal into a rectified electrical signal using a rectifier;
converting the rectified electrical signal to an output electrical signal using a DC-DC converter, the DC-DC converter having a number of selectable discontinuous mode (DCM) times and operable between a power transmission operation mode in which the electrical signal is transmitted by a power transmitter and a power harvesting operation mode in which the electrical signal is harvested ambient energy, in dependence on the power level of the electrical signal; and
selecting a discontinuous mode (DCM) time from the number of selectable discontinuous mode (DCM) times for the DC-DC converter in response to a present operation mode of the DC-DC converter.

* * * * *